(12) United States Patent
Takashima

(10) Patent No.: US 7,379,319 B2
(45) Date of Patent: May 27, 2008

(54) SEMICONDUCTOR INTEGRATED CIRCUIT DEVICE

(75) Inventor: Daisaburo Takashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/775,680

(22) Filed: Jul. 10, 2007

(65) Prior Publication Data

US 2008/0007987 A1    Jan. 10, 2008

Related U.S. Application Data

(60) Division of application No. 10/988,673, filed on Nov. 16, 2004, now Pat. No. 7,269,048, which is a continuation-in-part of application No. 10/780,590, filed on Feb. 19, 2004, now abandoned.

(30) Foreign Application Priority Data

| Sep. 22, 2003 | (JP) | ............................ 2003-329851 |
| Dec. 25, 2003 | (JP) | ............................ 2003-429163 |
| Sep. 10, 2004 | (JP) | ............................ 2004-263383 |

(51) Int. Cl.
*G11C 7/00*    (2006.01)

(52) U.S. Cl. ...................... 365/143; 365/145; 257/202

(58) Field of Classification Search ................ 365/143, 365/145; 257/202

See application file for complete search history.

(56) References Cited

U.S. PATENT DOCUMENTS 6,262,910 B1    7/2001    Takata et al.
6,574,133 B2    6/2003    Takashima
6,930,907 B2    8/2005    Sberno et al.
6,980,460 B2    12/2005    Shiratake et al.

(Continued)

FOREIGN PATENT DOCUMENTS

JP        7-262768        10/1995

(Continued)

OTHER PUBLICATIONS

Daisaburo Takashima, et al., "High-Density Chain Ferroelectric Random Access Memory (Chain FRAM)", IEEE Journal of Solid-State Circuits, vol. 33, No. 5, May 1998, pp. 787-792.

(Continued)

*Primary Examiner*—Michael T Tran
(74) *Attorney, Agent, or Firm*—Oblon, Spivak, McClelland, Maier & Neustadt, P.C.

(57) ABSTRACT

A semiconductor integrated circuit device includes a semiconductor substrate and a plurality of cell transistors provided on a surface of the semiconductor substrate. A local bit line is provided above the cell transistors and electrically connected to one of a source diffusion layer and a drain diffusion layer of each of the cell transistors. Ferroelectric capacitors corresponding in number to the cell transistors, are provided above the local bit line, where each of the ferroelectric capacitors has an upper electrode and a lower electrode electrically connected to the other one of the source diffusion layer and drain diffusion layer of the corresponding one of the cell transistors. A plate line is provided above the upper electrodes and electrically connected to the upper electrodes. A reset transistor and a block selection transistor are provided on the surface of the semiconductor substrate.

8 Claims, 63 Drawing Sheets

U.S. PATENT DOCUMENTS

| | | | |
|---|---|---|---|
| 6,982,447 B2 | 1/2006 | Kim | |
| 2003/0099125 A1* | 5/2003 | Kang | 365/145 |
| 2003/0169616 A1* | 9/2003 | Noro | 365/145 |
| 2003/0172340 A1* | 9/2003 | Nozawa et al. | 714/768 |
| 2004/0252542 A1 | 12/2004 | Hoya et al. | |

FOREIGN PATENT DOCUMENTS

| | | |
|---|---|---|
| JP | 10-255483 | 9/1998 |
| JP | 11-177036 | 7/1999 |
| JP | 2000-22010 | 1/2000 |
| JP | 2000-123578 | 4/2000 |
| JP | 2000-187990 | 7/2000 |
| JP | 2001-283585 | 10/2001 |
| JP | 2003-30977 | 1/2003 |

OTHER PUBLICATIONS

Daisaburo Takashima, "Overview and Trend of Chain FeRam Architecture", IEICE Trans. Electron, vol. E84-C, No. 6, Jun. 2001, pp. 747-756.

Shigeo Onishi, et al., "A Half-Micron Ferroelectric Memory Cell Technology with Stacked Capacitor Structure", IEDM, Dec. 1994, pp. 843-846.

* cited by examiner

SEMICONDUCTOR INTEGRATED CIRCUIT DEVICE

CROSS-REFERENCE TO RELATED APPLICATIONS

This is a Divisional application of U.S. Ser. No. 10/988,673, filed Nov. 16, 2004, now U.S. Pat. No. 7,269,048, which is a Continuation-in-Part application of U.S. patent application Ser. No. 10/780,590, filed Feb. 19, 2004, now abandoned, the entire contents of which are incorporated herein by reference.

This application is based upon and claims the benefit of priority from prior Japanese Patent Applications No. 2003-329851, filed Sep. 22, 2003, No. 2003-429163, filed Dec. 25, 2003; and No. 2004-263383, filed Sep. 10, 2004, the entire contents of all of which are incorporated herein by reference.

BACKGROUND OF THE INVENTION

1. Field of the Invention

This invention relates to a semiconductor integrated circuit device and more particularly to a nonvolatile ferroelectric memory, for example.

2. Description of the Related Art

At present, semiconductor memories are used in various fields ranging from main memories of large scale computers to personal computers, home electrical appliances, mobile telephones and the like. Various types of semiconductor memories such as volatile DRAMs (Dynamic Random Access Memories), SRAMs (Static RAMs), nonvolatile MROMs (Mask Read Only Memories) and flash EEPROMs (Electrically Erasable Programmable ROMs) are put on the market. Particularly, the DRAM is excellent in the high operation speed and dominantly controls the market because of the low cost thereof (the cell area is ¼ times that of the SRAM) although it is a volatile memory. The rewritable nonvolatile flash EEPROM can store information even after the power supply is turned OFF. However, since the flash memory has disadvantages that the number of rewriting operations (the number of W/E operations) is approximately $10^6$, the write time is approximately several micro seconds and application of high voltage (12V to 22V) is required for writing, it is not put on the market as wisely as the DRAM.

On the other hand, a nonvolatile ferroelectric memory using a ferroelectric capacitor is nonvolatile and has advantages that the number of rewriting operations is approximately $10^{12}$, the read/write time is approximately equal to that of the DRAM and low operation voltage of 3V to 5V is used. Therefore, the nonvolatile ferroelectric memories have a possibility of occupying the whole memory market and various makers have studied and developed the nonvolatile ferroelectric memories since they were proposed in 1980.

FIG. 44 shows memory cells with the one-transistor/one-capacitor configuration of the conventional ferroelectric memory and the cell array configuration. The memory cell configuration of the conventional ferroelectric memory is a configuration in which a transistor and a capacitor are connected in series. The cell array includes bit lines BL via which data is read out, word lines WL by which a memory cell transistor is selected and plate lines PL connected to drive one-side ends of corresponding ferroelectric capacitors. As shown in FIGS. 45, 46, in the ferroelectric memory, the memory cell configuration is a folded bit line configuration in which each memory cell is arranged in every two intersections of the word line WL and bit lines BL. Therefore, when the wiring width and the distance between the wirings are set to F, there occurs a problem that the minimum cell size is limited to $2F \times 4F = 8F^2$.

Further, in order to prevent destruction of polarization information of the ferroelectric capacitor of the non-selected cell, it is necessary to divide the plate line for each word line and individually drive the plate line portions. In addition, since the individual plate lines are each connected to a plurality of ferroelectric capacitors arranged in a word line direction, the load capacitance becomes larger. Further, since the pitch of plate line drive circuits is set equal to that of the word lines and is extremely small, the size of the plate line drive circuit cannot be made large. For this reason, as shown in FIG. 47, the delay time at the time of rise/fall of the plate line potential becomes larger and, as a result, there occurs a problem that the operation speed becomes low.

FIG. 48 shows a configuration in which the plate line is commonly used. FIG. 49 shows a phenomenon of disturb generated by using the configuration of FIG. 48 and occurring in the ferroelectric capacitor of a non-selected cell. As shown in FIG. 48, the operation speed can be enhanced and the number of plate line drive circuits can be reduced by permitting cells connected to different word lines to commonly use the plate line and plate line drive circuit.

However, for example, when a word line WL0 is selected, the potential of a connection node of the plate line PL and the ferroelectric capacitor of a cell connected to a non-selected word line WL1 is raised from potential Vss to internal power supply potential Vaa at the active time by commonly using the plate line PL. At this time, the potential of a node SN1 of the non-selected cell is also raised to the potential Vaa by coupling of the ferroelectric capacitor. In this case, the potential of the node SN1 is set to a potential level which is slightly lower than the potential Vaa by the coupling ratio of a parasitic capacitance of the node SN1. However, there occurs no problem since the parasitic capacitance is smaller than the capacitance of the ferroelectric capacitor.

In this case, as shown in FIG. 49, if a long period of active time, a short period of standby time, a long period of active time, a short period of standby time, - - - are repeated, the potential of the node SN1 is gradually lowered due to a junction leak. As a result, when the standby time next occurs, the potential of the plate line PL is lowered to the potential Vss and the potential of the node SN1 becomes negative. When the standby time is long, the negative potential tends to be returned to 0V due to the junction leak or the like. However, in general, the active time is approximately 10 μs, the standby time is approximately 20 ns at minimum and the time ratio is 500. Therefore, the potential of the node SN1 is hardly returned to the original value and static disturb voltage is applied to the non-selected ferroelectric capacitor to destroy cell information.

Thus, the potential of the node SN1 is continuously lowered if the long-time active operation is repeatedly performed. However, when it becomes higher to some extent, the junction leak at the standby time occurs in a forward direction and the potential stops changing. Since buried-region potential is approximately 0.6V, the disturb voltage is set to approximately 0.3V. If a leak current from the ferroelectric capacitor is larger than the junction leak current, a lowering in the potential of the node SN1 is suppressed. However, even in this case, the two leak current amounts have their own distributions. That is, like the pause characteristic of the DRAM, a cell having a larger junction leak exists on the distribution due to the defect or the like. Further, in the ferroelectric capacitor, a cell having a small leak from the crystal boundary exists on the distribution. Therefore, a cell having two bad conditions imposed thereon exists and, as a result, polarization information is destroyed in some cells.

Judging from the above fact, it is difficult to attain the configuration of FIG. 48. As a result, the conventional ferroelectric memory has a problem that the plate line driving speed is low and the operation speed of the memory is low.

In order to solve the above problem, the inventor of this application proposed nonvolatile ferroelectric memories as described in "Jpn. Pat. Appln. KOKAI Publication No. H10-255483", "Jpn. Pat. Appln. KOKAI Publication No. H11-177036" and "Jpn. Pat. Appln. KOKAI Publication No. 2000-22010". According to the above ferroelectric memories (which are hereinafter referred to as memories of the prior applications), three points related to (1) memory cells of small $4F^2$ size, (2) plane transistors which can be easily formed and (3) high-speed random access function which is flexible can be simultaneously attained.

FIG. 50 shows the configuration of the memory of the prior application. As shown in FIG. 50, each memory cell is configured by one cell transistor and one ferroelectric capacitor which are connected in parallel and each memory cell block is configured by serially connecting a plurality of memory cells. One end of the memory cell block is connected to a bit line via a block selection transistor and the other end thereof is connected to a plate. With the above configuration, as shown in FIGS. 51, 52, memory cells of the minimum $4F^2$ size can be realized.

The operation of the memory with the above configuration is explained below. At the standby time, the potentials of all of word lines WL0 to WL3 are set at the high level to set cell transistors Q0 to Q3 in the ON state. Further, a block selection signal BS is set to a low level to set the block selection transistor into the OFF state. Thus, both ends of the ferroelectric capacitor are short-circuited via the cell transistor which is set in the ON state. As a result, no potential difference occurs between the two ends and polarization information of the memory cell can be stably held.

At the active time, only the cell transistor that is connected in parallel with the ferroelectric capacitor from which it is desired to read out information is set in the OFF state and the block selection transistor is set in the ON state. After this, the potential of the plate line PL is set to the high level so as to permit the potential difference between the plate line PL and the bit line BL to be applied only between the two ends of the ferroelectric capacitor which is connected in parallel with the cell transistor set in the OFF state. As a result, polarization information of the ferroelectric capacitor is read out onto the bit line.

Thus, even when the memory cells are connected in series, information which a desired ferroelectric capacitor holds can be read out by selecting a desired word line. That is, a complete random access operation can be performed.

Since the cell transistor of the non-selected cell is set in the ON state, the two ends of the ferroelectric capacitor of the non-selected cell are short-circuited via the cell transistor set in the ON state. Therefore, even if the plate line PL is commonly used by all of the cell transistors of the memory cell block, a problem of disturb voltage in the conventional ferroelectric memory can be solved. Thus, since the area of the plate line driving circuit can be increased while the chip size is reduced by commonly using the plate line PL, the high-speed operation can be realized. For example, if the plate line is commonly used by 16 cells, the product of the area of the plate line driving circuit and the delay time on the plate line can be reduced to $1/16$ times.

In the memory of the prior application, the following problem occurs. The plate line PL can be used to realize an extremely high-speed operation. However, since read charges and write charges move between the cell transistor and the bit line BL via a plurality of cell transistors which are connected in series, delay components of the cell transistors occur. Therefore, the high-speed operation of the memory is limited. The delay time can be reduced by reducing the number of memory cells, but a merit of a reduction in the chip area is reduced to some extent.

As described above, in the conventional ferroelectric memory, there occurs a problem that the plate line cannot be commonly used, the high-speed operation cannot be attained and the cell size becomes larger. Further, in the memory of the prior application, there occurs a problem that the maximum speed is limited by the number of series-connected cells although the cell size can be reduced, the plate line can be commonly used and the high-speed operation can be performed.

BRIEF SUMMARY OF THE INVENTION

According to a first aspect of the present invention, there is provided a semiconductor integrated circuit device comprising: a first memory cell block which includes: a plurality of first memory cells each of which includes a cell transistor having a gate terminal connected to a word line and ferroelectric capacitor connected at one end to a source terminal of the cell transistor, a first reset transistor having a source terminal connected to a first plate line and a drain terminal connected to a first local bit line with drain terminals of the cell transistors of the first memory cells used as the first local bit line and each of the other end of the ferroelectric capacitors used as the first plate line, and a first block selection transistor having a source terminal connected to the first local bit line and a drain terminal connected to a first bit line.

According to a second aspect of the present invention, there is provided a semiconductor integrated circuit device comprising: a first memory cell block which includes: a plurality of first memory cells each of which includes a cell transistor having a gate terminal connected to a word line and a ferroelectric capacitor connected at one end to a source terminal of the cell transistor, a first reset transistor having a source terminal connected to a first power supply and a drain terminal connected to a first local bit line with drain terminals of the cell transistors used as the first local bit line and the other end of each of the ferroelectric capacitors used as a first plate line, and a first block selection transistor having a source terminal connected to the first local bit line and a drain terminal connected to a first bit line.

According to a third aspect of the present invention, there is provided a semiconductor integrated circuit device comprising: a memory cell array having a first memory block and a second memory cell block each of which includes: a plurality of memory cells each of which includes a cell transistor having a gate terminal connected to a word line and a ferroelectric capacitor connected at one end to a source terminal of the cell transistor, and a block selection transistor having a source terminal connected to a local bit line with drain terminals of the cell transistors used as the local bit line and the other end of each of the ferroelectric capacitors used as a plate line, wherein drain terminals of the block selection transistors of the first memory cell block and the second memory cell block are connected to a bit line, the cell transistors and block selection transistors of the first memory cell block and the second memory cell block are ON in a standby time, and the block selection transistor of the first memory cell block is OFF and the cell transistor of the memory cell other than one selected one of the memory cells in the first memory cell block is OFF in an active time.

According to a fourth aspect of the present invention, there is provided a semiconductor integrated circuit device comprising: a memory cell block which includes: a plurality of memory cells each of which includes a cell transistor having a gate terminal connected to a word line and a ferroelectric capacitor connected at one end to a source terminal of the cell transistor, a reset transistor having a source terminal connected to a plate line and a drain terminal connected to a local bit line with drain terminals of the cell transistors used as the plate line and the other end of each of the ferroelectric capacitors used as the local bit line, and a block selection transistor having a source terminal connected to the local bit line and a drain terminal connected to a bit line.

According to a fifth aspect of the present invention, there is provided a semiconductor integrated circuit device comprising: a memory cell group including a plurality of memory cell units each of which includes: a plurality of memory cells each of which includes a cell transistor having a gate terminal connected to a word line and a ferroelectric capacitor connected at one end to a source terminal of the cell transistor with the other end of the ferroelectric capacitor used as a first terminal and a drain of the cell transistor as a second terminal; and a reset transistor having a source terminal connected to a third terminal and a drain terminal connected to a fourth terminal, one of the first terminal and the second terminal of the memory cells being connected to the third terminal and the other end being connected to the fourth terminal; wherein the memory cell units are series-connected with the third terminal and the fourth terminal used as its two terminals.

According to a sixth aspect of the present invention, there is provided a semiconductor integrated circuit device comprising: a semiconductor substrate, a plurality of cell transistors provided on a surface of the semiconductor substrate, a local bit line provided above the cell transistors and electrically connected to one of a source diffusion layer and a drain diffusion layer of each of the cell transistors, ferroelectric capacitors corresponding in number to the cell transistors, provided above the local bit line, each of the ferroelectric capacitors has an upper electrode and a lower electrode electrically connected to the other one of the source diffusion layer and drain diffusion layer of corresponding one of the cell transistors, a plate line provided above the upper electrodes and electrically connected to the upper electrodes, a reset transistor provided on the surface of the semiconductor substrate with one of a source diffusion layer and a drain diffusion layer electrically connected to the plate line and the other one electrically connected to the local bit line, and a block selection transistor provided on the surface of the semiconductor substrate with one of a source diffusion layer and a drain diffusion layer electrically connected to a bit line provided above the plate line and the other one electrically connected to the local bit line.

According to a seventh aspect of the present invention, there is provided a semiconductor integrated circuit device comprising: a semiconductor substrate, a plurality of cell transistors provided on a surface of the semiconductor substrate, ferroelectric capacitors corresponding in number to the cell transistors, provided above the semiconductor substrate, each of the ferroelectric capacitors has an upper electrode and a lower electrode electrically connected to one of a source diffusion layer and a drain diffusion layer of corresponding one of the cell transistors, a plate line provided above the upper electrodes and electrically connected to the upper electrodes, a reset transistor provided on the surface of the semiconductor substrate with one of a source diffusion layer and a drain diffusion layer electrically connected to the plate line, a selection transistor provided on the surface of the semiconductor substrate with one of a source diffusion layer and a drain diffusion layer electrically connected to a bit line provided above the plate line, a first active area formed on the surface of the semiconductor substrate to cross gate electrodes of the cell transistors in a plane and electrically connecting the other one of the source diffusion layer and the drain diffusion layer of the reset transistor to the other one of the source diffusion layer and the drain diffusion layer of the selection transistor, and a plurality of second active areas formed on the surface of the semiconductor substrate to extend in a direction different from a first area extending direction, connected to the first active area in the plane, and electrically connecting the other one of the source diffusion layer and the drain diffusion layer of each one of the cell transistors to the other one of the source diffusion layer and the drain diffusion layer of the reset transistor.

According to an eighth aspect of the present invention, there is provided a semiconductor integrated circuit device comprising: a semiconductor substrate; a plurality of cell transistors provided on the surface of the semiconductor substrate; a first wiring layer provided above the cell transistors and electrically connected to one of a source diffusion layer and a drain diffusion layer of each of the plurality of cell transistors; a plurality of ferroelectric capacitors provided above the first wiring layer, each of the ferroelectric capacitors having an upper electrode and a lower electrode electrically connected to the other of the source diffusion layer and the drain diffusion layer of each of the cell transistors; a second wiring layer provided above the upper electrode and electrically connected to the upper electrode; and a reset transistor provided on the surface of the semiconductor substrate with one of a source diffusion layer and a drain diffusion layer electrically connected to the second wiring layer and the other electrically connected to the first wiring layer.

According to a ninth aspect of the present invention, there is provided a semiconductor integrated circuit device comprising: a semiconductor substrate; a plurality of cell transistors provided on the surface of the semiconductor substrate; a plurality of ferroelectric capacitors provided above the cell transistors, each of the ferroelectric capacitors having an upper electrode and a lower electrode electrically connected to one of a source diffusion layer and a drain diffusion layer of each of the cell transistors; a plate line provided above the upper electrode and electrically connected to the upper electrodes of two adjacent ferroelectric capacitors; a local bit line provided above the plate line and electrically connected to the other of the source diffusion layer and the drain diffusion layer of each of the cell transistors; a reset transistor provided on the surface of the semiconductor substrate with one of a source diffusion layer and a drain diffusion layer electrically connected to the plate line and the other electrically connected to the local bit line; and a selection transistor provided on the surface of the semiconductor substrate with one of a source diffusion layer and a drain diffusion layer electrically connected to a bit line provided above the local bit line and the other electrically connected to the local bit line.

BRIEF DESCRIPTION OF THE SEVERAL VIEWS OF THE DRAWING

FIG. 13 is a diagram showing the operation of the semiconductor integrated circuit device of FIG. 12, for illustrating a twelfth embodiment of the present invention;

FIG. 14 is a diagram showing the operation of the semiconductor integrated circuit device of FIG. 12, for illustrating a thirteenth embodiment of the present invention;

DETAILED DESCRIPTION OF THE INVENTION

There will now be described embodiments of the present invention with reference to the accompanying drawings. In the following explanation, the same reference symbols are attached to constituents having substantially the same functions and configurations and the repeated explanation thereof is made only when required.

First Embodiment

Figure 1:
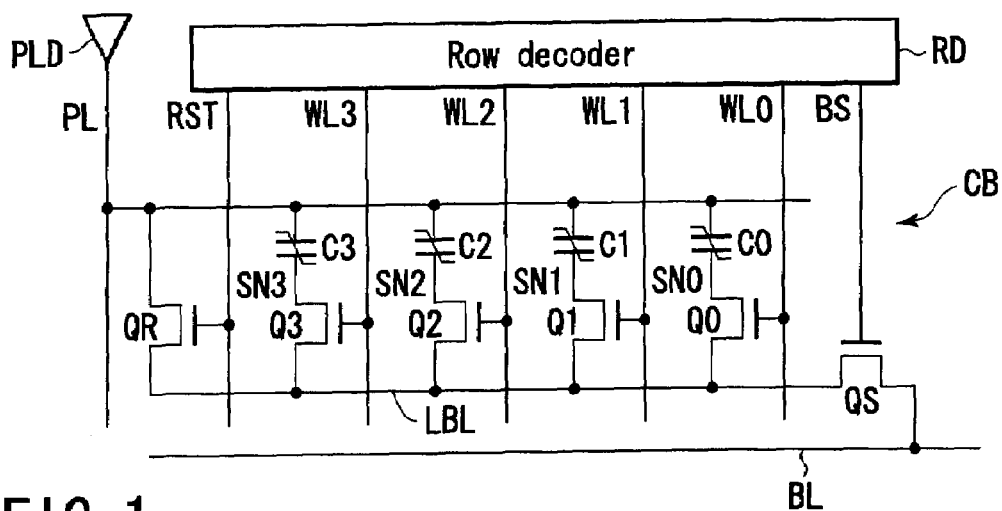
FIG. 1 is a diagram showing the circuit configuration of a semiconductor integrated circuit device according to a first embodiment of the present invention.

FIG. 1 shows the circuit configuration of a semiconductor integrated circuit device (FeRAM) according to a first embodiment of the present invention. As shown in FIG. 1, each memory cell includes one cell transistor and one ferroelectric capacitor which are connected in series. That is, the memory cells respectively include cell transistors Q0 to Q3 and ferroelectric capacitors C0 to C3. The gates of the cell transistors Q0 to Q3 are respectively connected to word lines WL0 to WL3. The memory cells are connected in parallel and one end of each memory cell is connected to a plate line PL and the other end thereof is connected to a local bit line LBL.

A reset transistor QR is connected between the plate line PL and the local bit line LBL. The reset transistor QR is controlled by a reset signal RST. Further, a block selection transistor QS is connected between the local bit line LBL and a bit line BL. The block selection transistor QS is controlled by a block selection signal BS.

As described above, one cell block CB is configured by a plurality of cell transistors Q0 to Q3, a plurality of ferroelectric capacitors C0 to C3, reset transistor QR, block selection transistor QS and local bit line LBL. A row decoder RD controls potentials of wirings (word lines WL0 to WL3 and the like) connected thereto. A plate line driver PLD drives the plate line.

Next, the operation of the semiconductor integrated circuit device of FIG. 1 is explained. At the standby time, the cell transistors C0 to C3 in the cell block CB are set in the ON state. Therefore, the potential of the plate line PL is transmitted to cell nodes SN0 to SN3. Further, at this time, the reset transistor QR is set in the ON state. Therefore, the potential of the local bit line LBL in the cell block CB is set equal to the potential of the plate line PL. Thus, the potentials of the two ends of the ferroelectric capacitors C0 to C3 of all of the memory cells in the cell block CB are set equal to the potential of the plate line PL. As a result, no voltage is applied across the ferroelectric capacitors C0 to C3 at the standby time.

At the active time, the reset transistor QR in the cell block CB is set in the OFF state and the cell transistors (for example, the cell transistors Q0, Q2, Q3) of non-selected cells are set in the OFF state. Further, the block selection transistor QS is set into the ON state and the plate line PL is driven. In this case, since only the cell transistor (for example, the cell transistor Q1) of a selected cell is set in the ON state, the potential of the plate line PL is applied to one end of the ferroelectric capacitor (for example, the ferroelectric capacitor C1) of the selected cell and the potential of the bit line BL is applied to the other end thereof. Thus, voltage is applied across the ferroelectric capacitor C1. The polarization of the ferroelectric capacitor C1 is inverted by the voltage and, as a result, cell information is read out from the ferroelectric capacitor C1. The cell information is read out and supplied to the bit line BL via the local bit line LBL. The readout signal is amplified by a sense amplifier (not shown).

After readout of the cell information, data is rewritten into the ferroelectric capacitor C1 with the potential of the plate line PL kept at the high level when the readout information is "0" data. When the readout information is "1" data, data is rewritten after the potential of the plate line PL is set to the low level. After this, the block selection transistor QS is turned OFF and the reset transistor QR and cell transistors Q0 to Q3 are turned ON to set the standby state.

At the active time, nodes (for example, cell nodes SN0, SN2, SN3) of the respective non-selected cells are set into an electrically floating state. Further, since the plate line PL is commonly used by all of the memory cells in the cell block CB, and the potential of the plate line is set to the high level. As a result, the potential of the node of the non-selected cell is lowered by a junction leak and disturb voltage is applied to the ferroelectric capacitor (for example, the ferroelectric capacitors C0, C2, C3) of the non-selected cell. However, when the standby state is set again, the potential difference applied across each of the ferroelectric capacitors C0 to C3 is reset to 0V. Therefore, the disturb voltage is limited to a potential drop of the cell nodes SN0 to SN3 caused during single period of time (10 μs at maximum) of only one active operation. The potential drop of the cell nodes SN0 to SN3 (0.1V or less) can be neglected, considering that cell charge is held at least for approximately several hundred ms in DRAM or the like.

According to the semiconductor integrated circuit device of the first embodiment, the plate line PL is commonly used by all of the memory cells in the cell block CB. Therefore, the delay time of a signal on the plate line PL can be extremely reduced, the area of the plate line PL driving circuit PLD can be reduced and the driving ability can be enhanced.

In the first embodiment, disturb voltage is applied to the ferroelectric capacitor of the non-selected cell at the active time. However, each time the standby state is set, the potential difference between the two ends of each of the ferroelectric capacitors C0 to C3 is reset to 0V. Therefore, a period of time in which the disturb voltage is applied is short and a lowering in the potential of the cell node of the non-selected cell is as small as negligible. As a result, memory cell data can be prevented from being destroyed by the disturb voltage.

Further, according to the first embodiment, only two transistors including one of the cell transistors Q0 to Q3 and the block selection transistor QS are connected between a corresponding one of the ferroelectric capacitors C0 to C3 and the bit line BL in a series of operations during the active time. Therefore, unlike the memory cell of the memory in the prior application, a problem of delay caused by serially connecting a plurality of memory cells will not occur. Thus, delay caused by the series-connected cell transistors does not occur while the plate line PL is commonly used. As a result, the higher-speed read operation and write operation can be performed in comparison with the conventional memory and the memory in the prior application.

Also, according to the first embodiment, since the memory cells in one cell block CB are connected to the bit line BL through one select transistor QS, the number of contacts of the bit line BL can be markedly reduced. Therefore, since the capacitance of the bit line BL can be made small, a large number of memory cells can be connected to one bit line BL. As a result, the area of the sense amplifier can be reduced and a signal on the bit line BL can be made large.

According to the first embodiment, since one cell can be arranged at each of the intersections of the bit line BL and the word lines WL0 to WL3, small memory cells of approximately minimum $6F^2$ size can be realized.

Second Embodiment

A second embodiment relates to one example of the driving method of the plate line PL of the semiconductor integrated circuit device of the first embodiment (FIG. 1). More specifically, the second embodiment relates a case wherein the potential of the plate line PL at the standby time is set to potential Vss and the potential thereof at the drive time is set to internal power supply potential Vaa.

Figure 2:
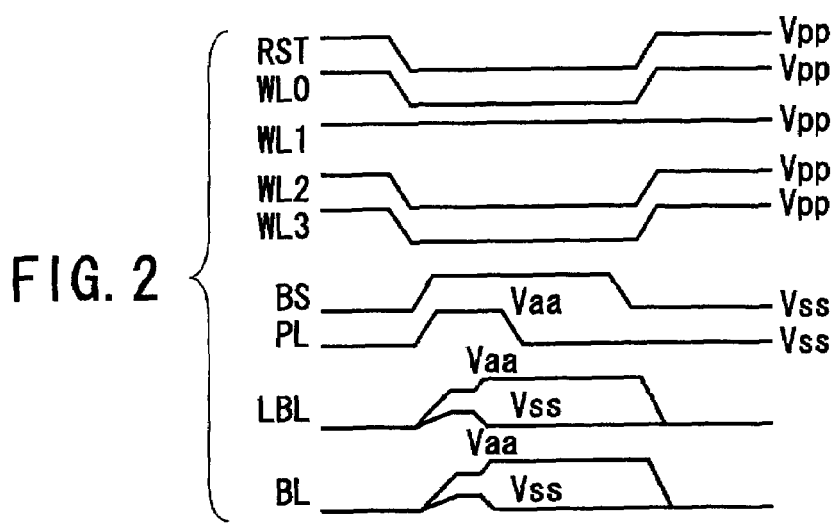
FIG. 2 is a diagram showing the operation of the semiconductor integrated circuit device of FIG. 1, for illustrating a second embodiment of the present invention.

FIG. 2 shows the operation of the semiconductor integrated circuit device of FIG. 1, for illustrating the second embodiment of the present invention. The operation is explained below by taking a case wherein information is read out from a ferroelectric capacitor C1 as an example.

As shown in FIG. 2, at the standby time, a reset signal RST and word lines WL0 to WL3 are set at potential Vpp (high level) and a block selection signal BS is set at potential Vss (low level). The plate line PL and bit line BL are set at potential Vss. Therefore, the cell transistors Q0 to Q3 and reset transistor QR are set in the ON state and the potential of the local bit line LBL in the cell block CB is set equal to the potential of the plate line PL. Thus, at the standby time, the potentials of the two ends of the ferroelectric capacitors C0 to C3 of all of the memory cells in the cell block CB are set equal to the potential of the plate line PL. As a result, no voltage is applied across the ferroelectric capacitors C0 to C3.

At the active time, the reset signal RST is set to the low level and the potentials of the word lines WL0, WL2, WL3 of non-selected cells are set to the low level. The potential of the word line WL1 of a selected cell stays at the high level. Therefore, the reset transistor QR is turned OFF and the cell transistors Q0, Q2, Q3 of the non-selected cells are turned OFF. Further, the block selection signal BS is set to the high level so as to turn ON the block selection transistor QS.

In this state, the plate line PL is driven and set to internal power supply potential Vaa. In this case, the internal power supply potential Vaa is potential generated based on power supply potential Vdd and it is also possible to use the power supply potential Vdd. As the result of driving of the plate line PL, potential corresponding to information of "0" or "1" is read out from the ferroelectric capacitor C1 to the bit line BL via the local bit line LBL by applying voltage only across the ferroelectric capacitor C1 of the selected cell. Then, the potential read out onto the bit line BL is amplified by a sense amplifier (not shown). When the readout information is "0", the potential on the bit line is amplified to the potential Vss (typically, ground potential). When the readout information is "1", the potential on the bit line is amplified to the internal power supply potential Vaa.

In the case of "0" information, since the bit line BL is set at the potential Vss, the rewriting operation is performed while the plate line PL stays at the potential Vaa. In the case of "1" information, since the bit line BL is set at the potential Vaa, the rewriting operation is performed by setting the plate line PL to the potential Vss. After this, the block selection signal BS is set to the low level and the reset signal RST and the potentials of the word lines WL0, WL2, WL3 are set to the high level. Thus, the standby state is set.

Figure 3:
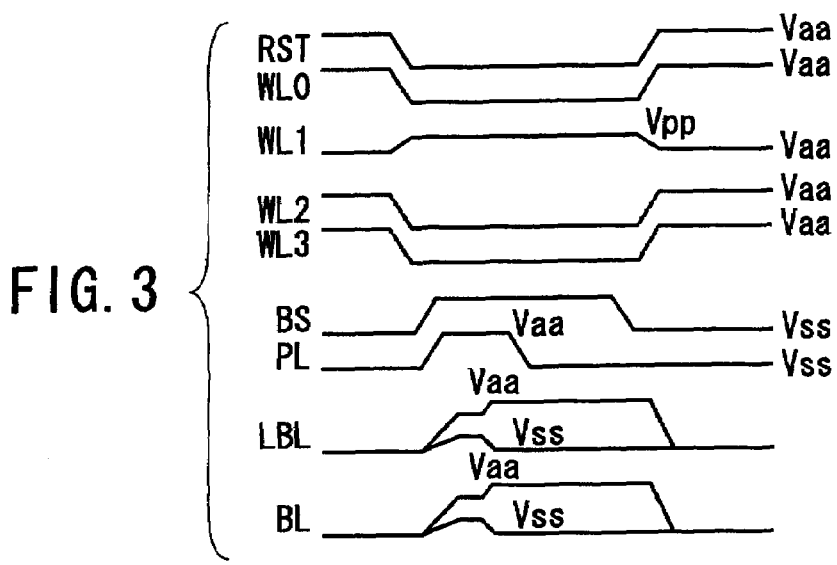
FIG. 3 is a diagram showing the operation of the semiconductor integrated circuit device of FIG. 1, for illustrating a modification of the second embodiment of the present invention.

At the standby time, since reset signal RST and the word lines WL0 to WL3 are set at relatively high potential Vpp, high electric field is applied to the gate oxide films of the reset transistor QR and the cell transistors Q0 to Q3. This may reduce the reliability of the gate oxide films. For this reason, as shown in FIG. 3, it is desirable to perform the control operation for setting the potentials of the reset signal RST and the word lines WL0 to WL3 to the potential lower than the potential Vpp (for example, potential Vaa) at the standby time and raising the potential of the reset signal RST and the word line of the selected cell transistor to Vpp at the active time. This operation can be applied to the following embodiments.

According to the semiconductor integrated circuit device of the second embodiment, the same effect as the first embodiment can be attained.

Third Embodiment

A third embodiment relates to one example of the driving method of the plate line PL of the semiconductor integrated circuit device of the first embodiment (FIG. 1). More specifically, the third embodiment relates to a case wherein the potential of the plate line PL is fixed at Vaa/2.

Figure 4:
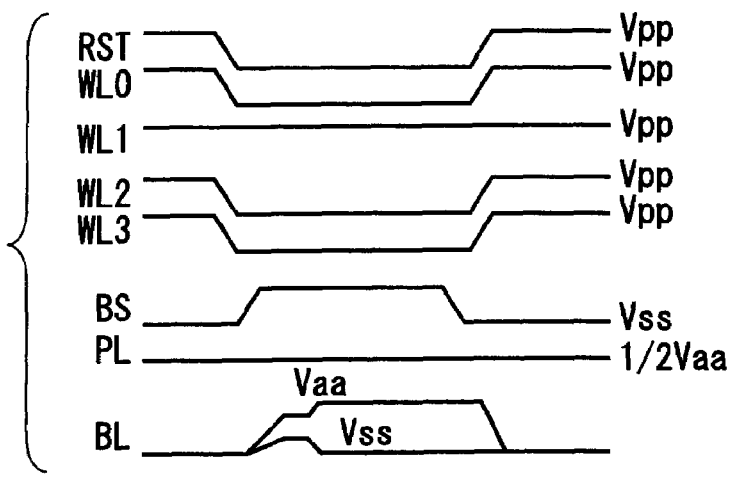
FIG. 4 is a diagram showing the operation of the semiconductor integrated circuit device of FIG. 1, for illustrating a third embodiment of the present invention.

FIG. 4 shows the operation of the semiconductor integrated circuit device of FIG. 1, for illustrating the third embodiment of the present invention. The operation is explained below by taking a case wherein information is read out from a ferroelectric capacitor C1 as an example.

As shown in FIG. 4, the state at the standby time is similar to that of the second embodiment except that the plate line PL is driven and set to Vaa/2. At the active time, a reset signal RST and potentials of the word lines WL0, WL2, WL3 are set to a low level. In this state, the potential (=Vaa/2) of the plate line PL is applied to one end of the ferroelectric capacitor C1 and the potential (=Vss) of the bit line BL is applied to the other end thereof by setting the block selection signal BS to the high level. Thus, information is read out from the ferroelectric capacitor C1 to the bit line BL and the potential of the bit line BL is amplified to the potential Vss or Vaa.

In the case of "0" information, since the bit line BL is set at the potential Vss and the potential of the plate line PL is set at Vaa/2, "0" information is rewritten into the ferroelectric capacitor C1. In the case of "1" information, since the bit line BL is set at the potential Vaa and the potential of the plate line PL is set at Vaa/2, "1" information is rewritten into the ferroelectric capacitor C1. After this, the block selection signal BS is set to the low level and the reset signal RST and the potentials of the word lines WL0, WL2, WL3 are set to the high level. Thus, the standby state is set.

According to the semiconductor integrated circuit device of the third embodiment, the same effect as the first embodiment can be attained. Further, since high potential than the potential Vss is usually applied to the plate line PL in the third embodiment, potential of the source and drain of each of the cell transistor Q0 to Q3 is as same as the plate line at standby time. Therefore, voltages applied across the cell transistor Q0 to Q3 are lowered and the electric fields applied across the gate oxide films of the cell transistor Q0 to Q3 are eased. This can prevent the reliability of the semiconductor integrated circuit device from reducing.

Fourth Embodiment

A fourth embodiment relates to one example of the driving method of the plate line PL of the semiconductor integrated circuit device of the first embodiment (FIG. 1).

As is described in the first embodiment, two ends of each of the ferroelectric capacitors C0 to C3 is set at the same potential at the standby time. Therefore, "1" information held by the ferroelectric capacitors C0 to C3 will not be destroyed even when the potentials of the cell nodes SN0 to SN3 are lowered at the standby time. Thus, the potential of the plate line PL at the standby time can be freely set. The fourth embodiment utilizes the above feature and is a modification of the second embodiment.

Figure 5:
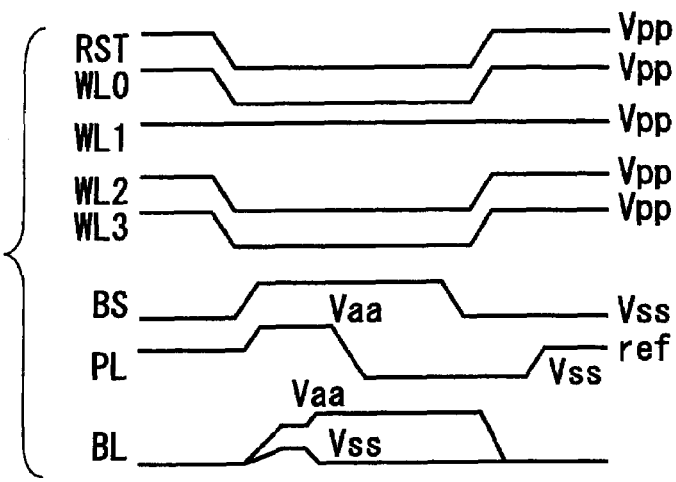
FIG. 5 is a diagram showing the operation of the semiconductor integrated circuit device of FIG. 1, for illustrating a fourth embodiment of the present invention.

FIG. 5 shows the operation of the semiconductor integrated circuit device of FIG. 1, for illustrating the fourth embodiment of the present invention. The operation is explained below by taking a case wherein information is read out from the ferroelectric capacitor C1 as an example.

As shown in FIG. 5, the state at the standby time is similar to that of the second embodiment except that the plate line PL is set at desired potential, for example, potential Vref. At the active time, a reset signal RST and potentials of word lines WL0, WL2, WL3 are set to a low level and a block selection signal BS is set to the high level. In this state, the plate line PL is driven and set to internal power supply potential Vaa so that information will be read out from the ferroelectric capacitor C1. In the case of "0" information, the rewriting operation is performed while the plate line PL is being driven. In the case of "1" information, the plate line PL is set to potential Vss to perform the rewriting operation. After this, the block selection signal BS is set to the low level and the reset signal RST and the potentials of the word lines WL0, WL2, WL3 are set to the high level. Then, the plate line PL is driven and set to the potential Vref to set the standby state.

According to the semiconductor integrated circuit device of the fourth embodiment, the same effect as the first embodiment can be attained. Further, the potential of the plate line PL in the standby state is set higher than the potential Vss in the fourth embodiment. Therefore, since voltages applied across the cell transistors Q0 to Q3 are lowered at the standby time and the electric fields applied across the gate oxide films of the cell transistor Q0 to Q3 are eased, the problem of the reliability can be solved.

Fifth Embodiment

A fifth embodiment relates to one example of the driving method of the plate line PL of the semiconductor integrated circuit device of the first embodiment (FIG. 1). The fifth embodiment utilizes the same feature as the fourth embodiment and is a modification of the second embodiment.

Figure 6:
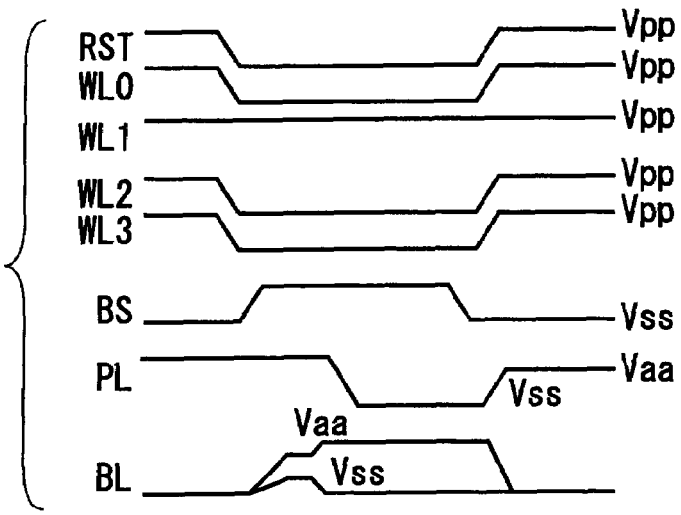
FIG. 6 is a diagram showing the operation of the semiconductor integrated circuit device of FIG. 1, for illustrating a fifth embodiment of the present invention.

FIG. 6 shows the operation of the semiconductor integrated circuit device of FIG. 1, for illustrating the fifth embodiment of the present invention. The operation is explained below by taking a case wherein information is read out from a ferroelectric capacitor C1 as an example.

As shown in FIG. 6, the state at the standby time is similar to that of the second embodiment except that the plate line PL is driven and set to internal power supply potential Vaa. At the active time, a reset signal RST and potentials of word lines WL0, WL2, WL3 are set to a low level. In this state, voltage is applied across the ferroelectric capacitor C1 by setting a block selection signal BS to the high level. As a result, information is read out from the ferroelectric capacitor C1 to the bit line BL. The readout information is amplified by a sense amplifier. In the case of "0" information, the rewriting operation is performed while the plate line PL is being driven. In the case of "1" information, the plate line PL is set to potential Vss to perform the rewriting operation. After this, the block selection signal BS is set to the low level and the reset signal RST and the potentials of the word lines WL0, WL2, WL3 are set to the high level. Then, the plate line PL is driven and set to the potential Vref to set the standby state.

According to the semiconductor integrated circuit device of the fifth embodiment, the same effect as a combination of the effects of the first and fourth embodiments can be attained.

Sixth Embodiment

Figure 7:
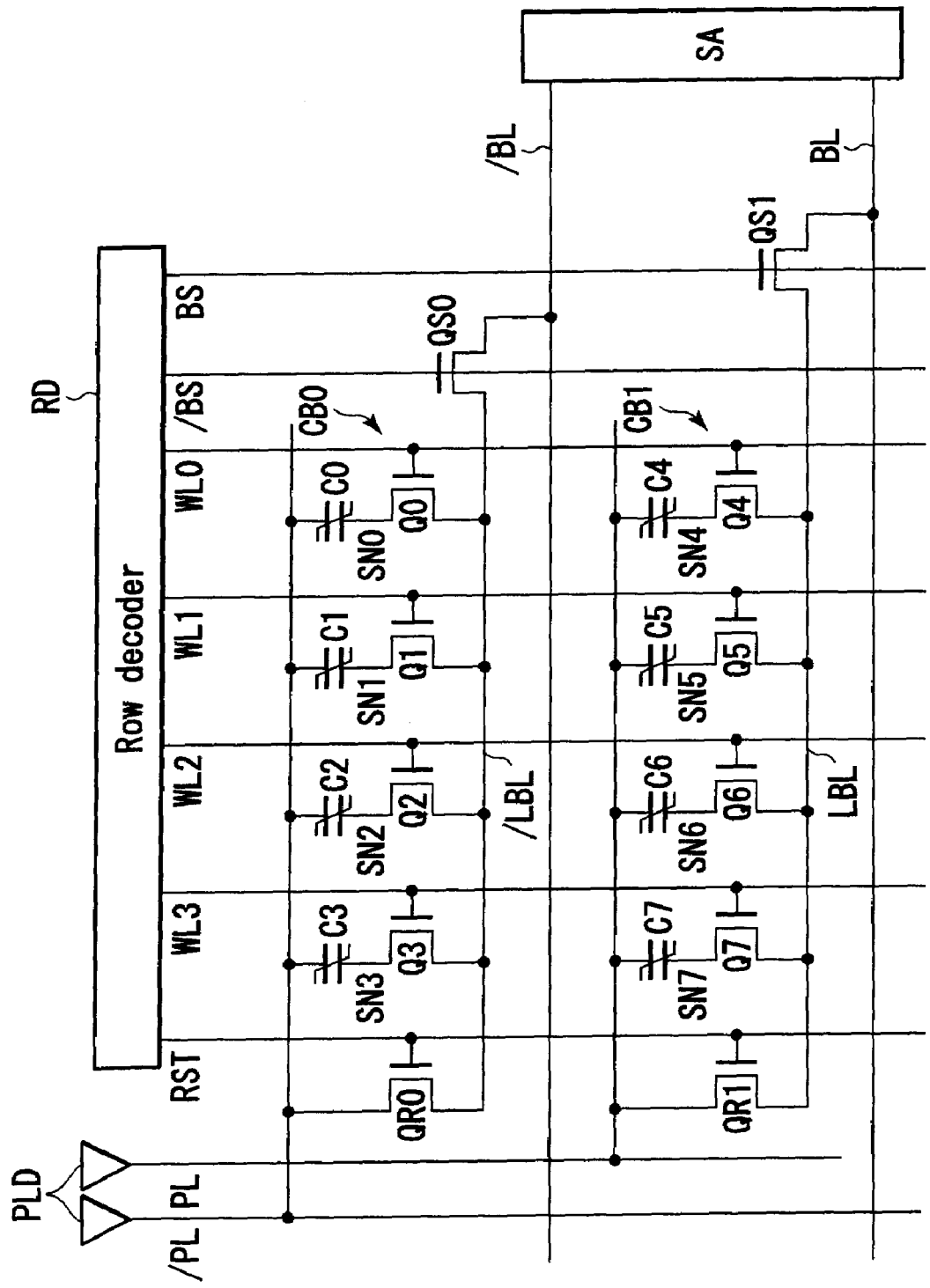
FIG. 7 is a diagram showing the circuit configuration of a semiconductor integrated circuit device according to a sixth embodiment of the present invention.

A sixth embodiment relates to a folded bit line configuration. FIG. 7 shows the circuit configuration of a semiconductor integrated circuit device according to the sixth embodiment of the present invention. As shown in FIG. 7, cell blocks CB0, CB1 having the same configuration as the cell block CB of FIG. 1 are respectively connected to bit lines /BL, BL (bit line pair). The bit lines /BL, BL are connected to a sense amplifier SA.

The cell block CB0 includes cell transistors Q0 to Q3, ferroelectric capacitors C0 to C3, reset transistor QR0, block selection transistor QS0 and local bit line /LBL. Memory cells which are respectively configured by the cell transistors Q0 to Q3 and the ferroelectric capacitors C0 to C3 are connected in parallel. Each memory cell is connected between the plate line /PL and the local bit line /LBL. The reset transistor QR0 is connected between the plate line /PL and the local bit line /LBL. Further, the block selection transistor QS0 is connected between the local bit line /LBL and the bit line /BL.

The cell block CB1 includes cell transistors Q4 to Q7, ferroelectric capacitors C4 to C7, reset transistor QR1, block selection transistor QS1 and local bit line LBL. Memory cells which are respectively configured by the cell transistors Q4 to Q7 and the ferroelectric capacitors C4 to C7 are connected in parallel. Each memory cell is connected between the plate line PL and the local bit line LBL. The reset transistor QR1 is connected between the plate line PL and the local bit line LBL. Further, the block selection transistor QS1 is connected between the local bit line LBL and the bit line BL.

The gates of the cell transistors Q0, Q4 are connected to the word line WL0. The gates of the cell transistors Q1, Q5 are connected to the word line WL1. The gates of the cell transistors Q2, Q6 are connected to the word line WL2. The gates of the cell transistors Q3, Q7 are connected to the word line WL3. The reset transistors QR0, QR1 are controlled by a reset signal RST. The block selection transistors QS0, QS1 are respectively controlled by block selection signals /BS, BS.

Next, the operation is explained. the operation of each of the cell blocks CB0, CB1 is the same as that in the first embodiment. In the case of readout of the memory cell in the cell block CB0, only the block selection transistor QS0 is turned ON and the block selection transistor QS1 stays OFF. In this state, only the plate line /PL is driven and the plate line PL is not driven. As a result, cell information is read out to the bit line /BL. The potential of the bit line BL is used as reference potential. The potential of the bit line /BL is amplified by the sense amplifier SA by use of the potential of the bit line BL. The readout operation for the memory cell in the cell block CB1 is also performed in the similar manner as described above.

According to the semiconductor integrated circuit device of the sixth embodiment, the same effect as the first embodiment can be attained while the occupying area of the sense amplifier can be reduced and noises of the memory cell array can decreased by employing the folded bit line configuration.

Seventh Embodiment

A seventh embodiment relates to one example of the driving method of the plate lines PL, /PL of the semiconductor integrated circuit device of the sixth embodiment (FIG. 7). More specifically, like the second embodiment, the seventh embodiment relates to a case wherein the potentials of the plate lines /PL, PL at the standby time are set at the potential Vss and the potentials thereof at the driving time are set at the internal power supply potential Vaa. The operation is also the same as a combination of the operations in the second and sixth embodiments.

Figure 8:
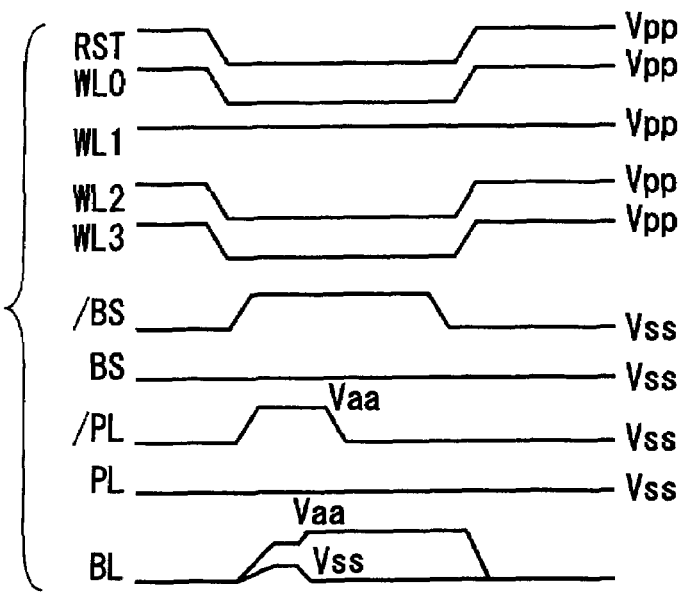
FIG. 8 is a diagram showing the operation of the semiconductor integrated circuit device of FIG. 7, for illustrating a seventh embodiment of the present invention.

FIG. 8 shows the operation of the semiconductor integrated circuit device of FIG. 7, for illustrating the seventh embodiment of the present invention. The operation is explained below by taking a case wherein information is read out from a ferroelectric capacitor C1 as an example.

As shown in FIG. 8, at the standby time, a reset signal RST and potentials of word lines WL0 to WL3 are set at the high level and block selection signals BS, /BS are set at a low level. The plate lines PL, /PL are set to potential Vss.

At the active time, the reset signal RST is set to the low level and the potentials of the word lines WL0, WL2, WL3 of non-selected cells are set to the low level. At this time, the potential of the word line WL1 of a selected cell stays at the high level. Then, the block selection transistor QS0 is turned ON by setting the block selection signal /BS to the high level. The block selection signal BS is maintained at the low level.

In this state, cell information is read out from the ferroelectric capacitor C1 to the bit line /BL by driving the plate line /PL to set the potential thereof to the internal power supply potential Vaa. The plate line PL stays at the potential Vss. The potential read out to the bit line /BL is amplified by a sense amplifier SA and then the rewriting operation is performed in the same manner as in the second embodiment. After this, the reset signal RST and the potentials of the word lines WL0, WL2, WL3 are set to the high level. Then, the block selection signal /BS is set to the low level to set the standby state.

According to the semiconductor integrated circuit device of the seventh embodiment, the same effect as a combination of the effects of the second and sixth embodiments can be attained.

Eighth Embodiment

An eighth embodiment relates to one example of the driving method of the plate lines PL, /PL of the semiconductor integrated circuit device of the sixth embodiment (FIG. 7). More specifically, like the third embodiment, the eighth embodiment relates a case wherein the potentials of the plate lines PL, /PL are fixed at Vaa/2.

Figure 9:
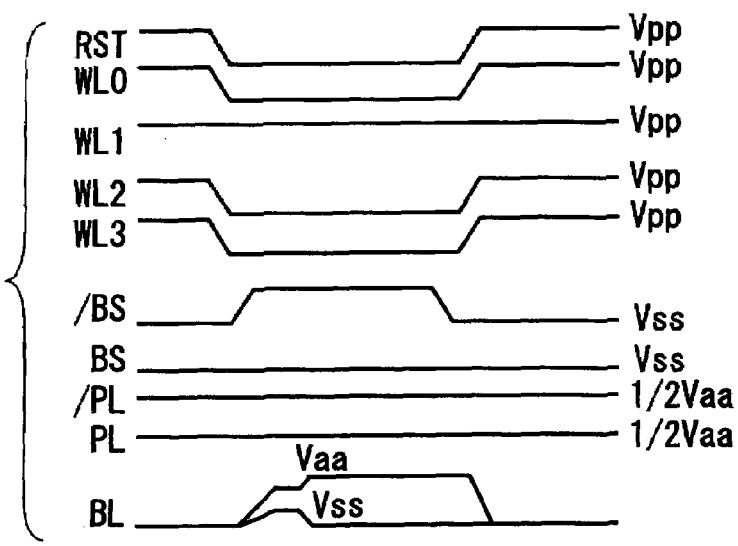
FIG. 9 is a diagram showing the operation of the semiconductor integrated circuit device of FIG. 7, for illustrating an eighth embodiment of the present invention.

FIG. 9 shows the operation of the semiconductor integrated circuit device of FIG. 7, for illustrating the eighth embodiment of the present invention. The operation is explained below by taking a case wherein information is read out from a ferroelectric capacitor C1 as an example.

As shown in FIG. 9, the state at the standby time is similar to that in the seventh embodiment except that the plate lines PL, /PL are driven and set to Vaa/2. At the active time, a reset signal RST and potentials of the word lines WL0, WL2, WL3 are set to a low level. In this state, information is read out to the bit line /BL by setting the block selection signal /BS to the high level. The block selection signal BS stays at the low level. Then, the potential of the bit line /BL is amplified and the rewriting operation is performed in the same manner as in the third embodiment. Thus, the standby state is set in the same manner as in the seventh embodiment.

According to the semiconductor integrated circuit device of the eighth embodiment, the same effect as the sixth embodiment can be attained.

Ninth Embodiment

A ninth embodiment relates to one example of the driving method of the plate lines PL, /PL of the semiconductor integrated circuit device of the sixth embodiment (FIG. 7). More specifically, the plate lines PL, /PL are driven in the same manner as in the fourth embodiment.

Figure 10:
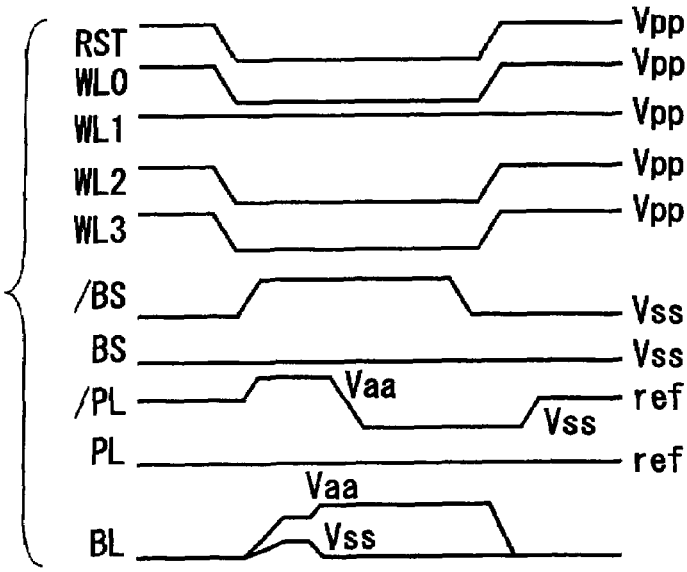
FIG. 10 is a diagram showing the operation of the semiconductor integrated circuit device of FIG. 7, for illustrating a ninth embodiment of the present invention.

FIG. 10 shows the operation of the semiconductor integrated circuit device of FIG. 7, for illustrating the ninth embodiment of the present invention. The operation is explained below by taking a case wherein information is read out from a ferroelectric capacitor C1 as an example.

As shown in FIG. 10, the state at the standby time is similar to that in the seventh embodiment except that the plate lines PL, /PL are driven and set to potential ref. At the active time, a reset signal RST and potentials of the word lines WL0, WL2, WL3 are set to a low level and a block selection signal /BS is set to the high level. The block selection signal BS stays at the low level. In this state, information is read out from the ferroelectric capacitor C1 by driving the plate line /PL to set the potential thereof to internal power supply potential Vaa. The plate line PL maintains the potential ref. Then, the potential of the bit line /BL is amplified and the rewriting operation is performed in the same manner as in the fourth embodiment. After this, the standby state is set in the same manner as in the seventh embodiment.

According to the semiconductor integrated circuit device of the ninth embodiment, the same effect as a combination of the effects of the fourth and sixth embodiments can be attained.

Tenth Embodiment

A tenth embodiment relates to one example of the driving method of the plate lines PL, /PL of the semiconductor integrated circuit device of the sixth embodiment (FIG. 7). More specifically, the plate lines PL, /PL are driven in the same manner as in the fifth embodiment.

Figure 11:
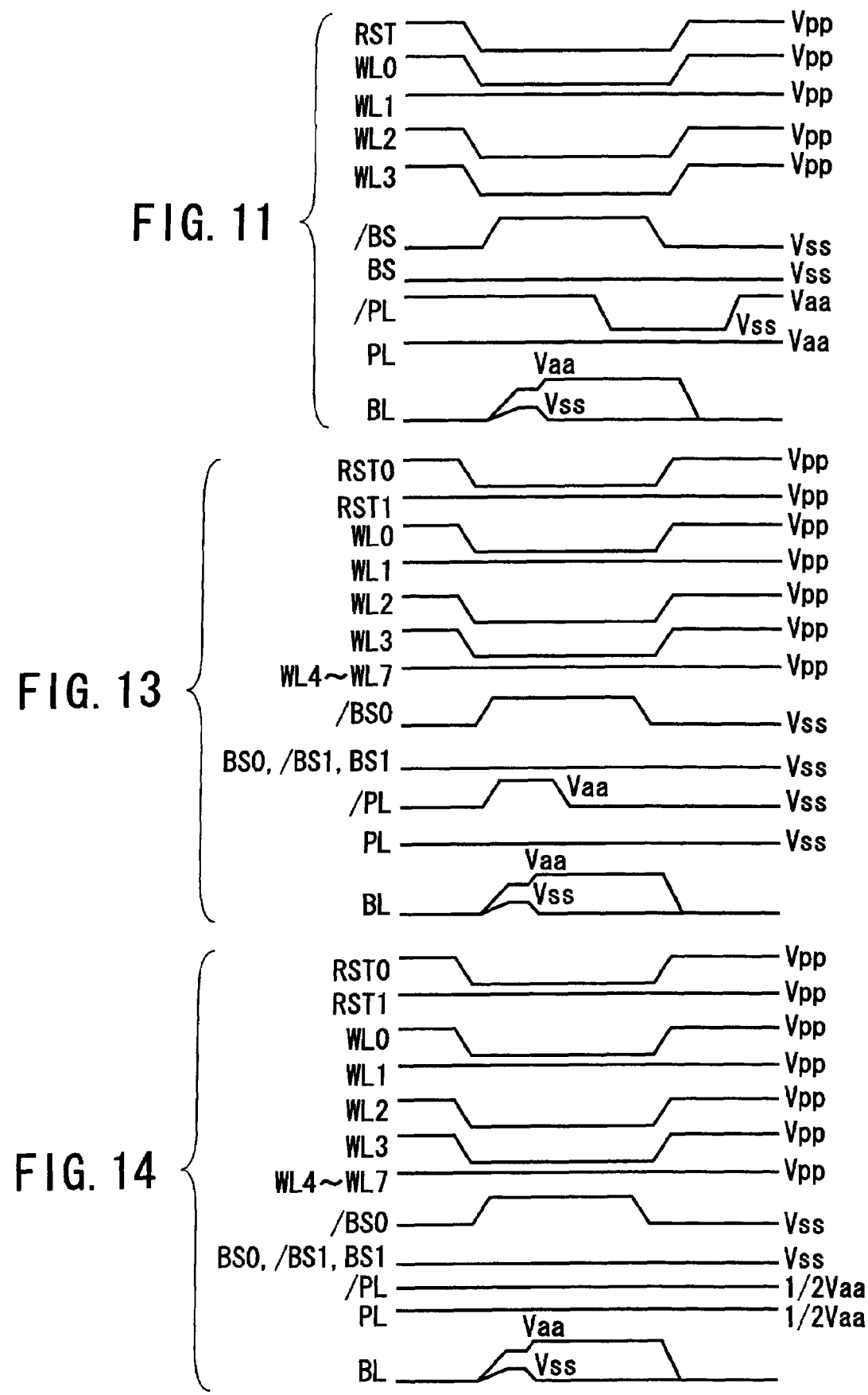
FIG. 11 is a diagram showing the operation of the semiconductor integrated circuit device of FIG. 7, for illustrating a tenth embodiment of the present invention.

FIG. 11 shows the operation of the semiconductor integrated circuit device of FIG. 7, for illustrating the tenth embodiment of the present invention. The operation is explained below by taking a case wherein information is read out from a ferroelectric capacitor C1 as an example.

As shown in FIG. 11, the state at the standby time is similar to that in the seventh embodiment except that the plate lines PL, /PL are driven and set to internal power supply potential Vaa. At the active time, a reset signal RST and potentials of the word lines WL0, WL2, WL3 are set to a low level. In this state, information is read out from the ferroelectric capacitor C1 to the bit line /BL by setting the block selection signal /BS to the high level. The block selection signal BS stays at the low level and the plate line PL stays at the internal power supply potential Vaa. Then, the potential of the bit line /BL is amplified and the rewriting operation is performed in the same manner as in the fifth embodiment. After this, the standby state is set in the same manner as in the seventh embodiment.

According to the semiconductor integrated circuit device of the tenth embodiment, the same effect as a combination of the effects of the fifth and sixth embodiments can be attained.

Eleventh Embodiment

An eleventh embodiment relates to a configuration in which a plate line /PL is commonly used by two cell blocks connected to a bit line /BL in addition to the configuration of the sixth embodiment (FIG. 7). Likewise, a plate line PL is commonly used by two cell blocks which are connected to a bit line BL.

Figure 12:
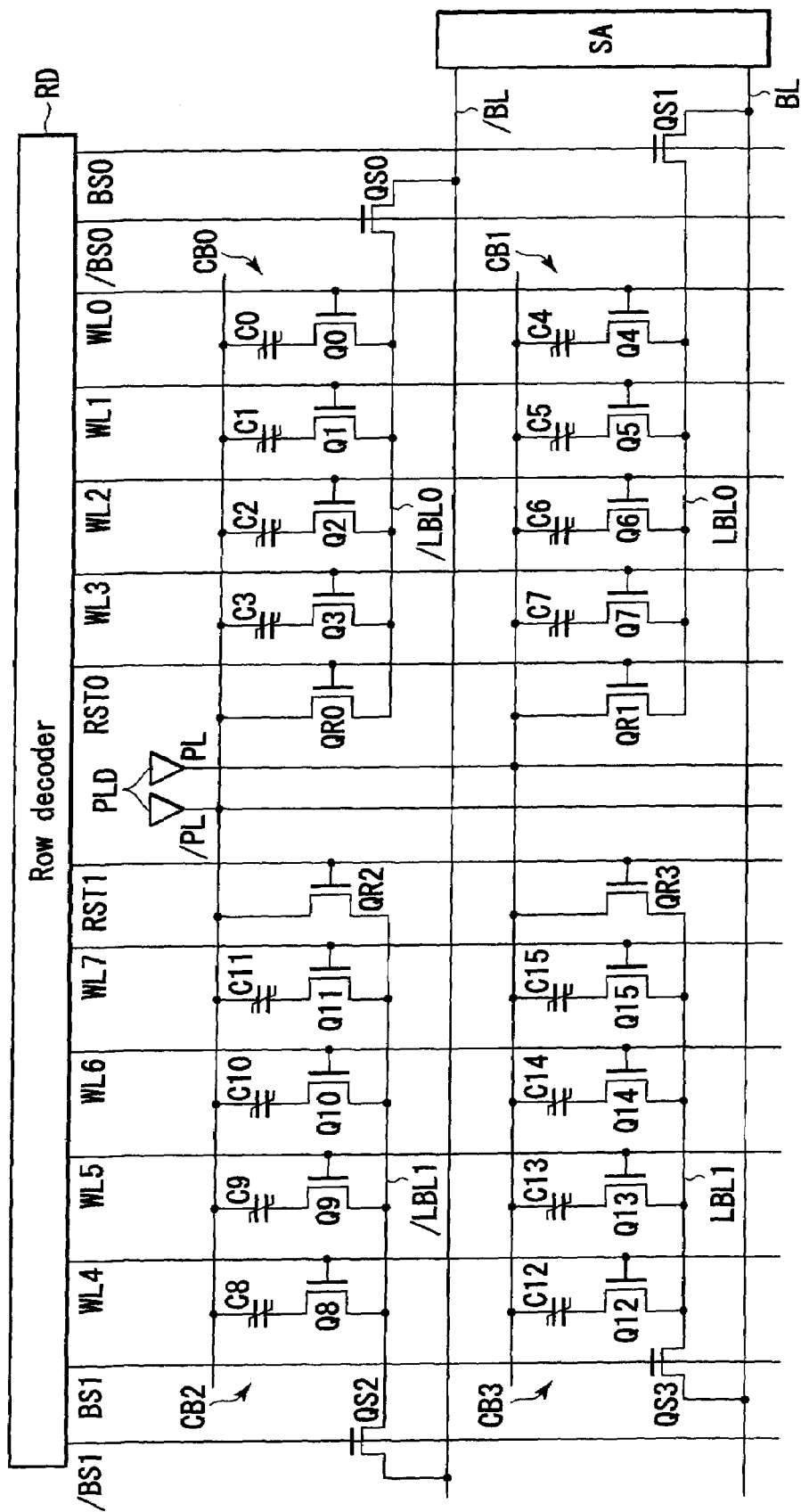
FIG. 12 is a diagram showing the circuit configuration of a semiconductor integrated circuit device according to an eleventh embodiment of the present invention.

FIG. 12 shows the circuit configuration of a semiconductor integrated circuit device according to the eleventh embodiment of the present invention. As shown in FIG. 12, cell blocks CB2, CB3 which have the same configuration as the cell block CB of FIG. 1 are respectively provided for the bit lines /BL, BL.

Cell blocks CB0, CB1 are similar to those of FIG. 7 except that the local bit line /LBL is replaced by a local bit line /LBL0 and the local bit line LBL is replaced by a local bit line LBL0. Selection transistors QR0, QR1 are controlled by a reset signal RST0. Block selection transistors QS0, QS1 are respectively controlled by block selection signals /BS0, BS0.

The cell block CB2 includes cell transistors Q8 to Q11, ferroelectric capacitors C8 to C11, reset transistor QR2, block selection transistor QS2 and local bit line /LBL1. Memory cells which are respectively configured by the cell transistors Q8 to Q11 and ferroelectric capacitors C8 to C11 are connected in parallel and each memory cell is connected between the plate line /PL and the local bit line /LBL1. Further, the reset transistor QR2 is connected between the plate line /PL and the local bit line /LBL1. In addition, the block selection transistor QS2 is connected between the local bit line /LBL1 and the bit line /BL.

The cell block CB3 includes cell transistors Q12 to Q15, ferroelectric capacitors C12 to C15, reset transistor QR3, block selection transistor QS3 and local bit line LBL1. Memory cells which are respectively configured by the cell transistors Q12 to Q15 and ferroelectric capacitors C12 to C15 are connected in parallel and each memory cell is connected between the plate line PL and the local bit line LBL1. Further, the reset transistor QR3 is connected between the plate line PL and the local bit line LBL1. In addition, the block selection transistor QS3 is connected between the local bit line LBL1 and the bit line BL.

The gates of the cell transistors Q8, Q12 are connected to a word line WL4. The gates of the cell transistors Q9, Q13 are connected to a word line WL5. The gates of the cell transistors Q10, Q14 are connected to a word line WL6. The gates of the cell transistors Q11, Q15 are connected to a word line WL7. The selection transistors QR2, QR3 are controlled by a reset signal RST1. The block selection transistors QS2, QS3 are respectively controlled by block selection signals /BS1, BS1.

Next, the operation of the semiconductor integrated circuit device of FIG. 12 is explained. The operation of each of the cell blocks CB0 to CB3 is the same as the cell block in the first embodiment. At the active time, the reset transistor QR0 (and QR1) is turned OFF and the cell transistors of non-selected cells are turned OFF in the case of readout of the memory cell in the cell block CB0. In this case, the reset transistor QR2 (and QR3) stays ON.

Then, only the block selection transistor QS0 is turned ON and the block selection transistors QS1 to QS3 are kept in the OFF state. In this state, only the plate line /PL is driven and the plate line PL is not driven. As a result, cell information is read out to the bit line /BL. The potential of the bit line /BL is amplified by the sense amplifier SA by using the potential of the bit line BL as reference potential. The same readout operation as described above is performed in a case wherein data of the memory cell in the cell blocks CB1 to CB3 is read out.

According to the semiconductor integrated circuit device of the eleventh embodiment, the same effect as the first embodiment can be attained. Since the plate line /PL is driven when information is read out from the ferroelectric capacitor in the cell block CB0, the potential of the plate line /PL is applied to the ferroelectric capacitors C8 to C11 in the non-selected cell block CB2. However, at this time, the two ends of each of the ferroelectric capacitors C8 to C11 are short-circuited and set to the same potential via the reset transistor QR2 and cell transistors Q8 to Q11. Therefore, information of the ferroelectric capacitors C8 to C11 will not be destroyed.

Further, according to the eleventh embodiment, the plate lines PL, /PL are commonly used by a plurality of cell blocks. Therefore, the area of the plate lines PL, /PL can be reduced and the resistances thereof can be reduced. As a result, the driving ability of the plate line driving circuit DPL can be enhanced in comparison with that in the first to tenth embodiments. In addition, the occupying area of the plate line driving circuit DPL can be reduced.

Twelfth Embodiment

A twelfth embodiment relates to one example of the driving method of the plate lines PL, /PL of the semiconductor integrated circuit device of the eleventh embodiment (FIG. 12). More specifically, like the second embodiment, the twelfth embodiment relates to a case wherein the potentials of the plate lines PL, /PL at the standby time are set at potential Vss and the potentials thereof at the driving time are set at internal power supply potential Vaa. Also, the operation is the same as a combination of the operations of the second and eleventh embodiments.

FIG. 13 shows the operation of the semiconductor integrated circuit device of FIG. 12, for illustrating the twelfth embodiment of the present invention. The operation is explained below by taking a case wherein information is read out from a ferroelectric capacitor C1 as an example.

As shown in FIG. 13, at the standby time, reset signals RST0, RST1 and potentials of word lines WL0 to WL7 are set at the high level and block selection signals BS0, /BS0 are set at the low level. The plate lines PL, /PL are set to potential Vss.

At the active time, the reset signal RST0 and the potentials of the word lines WL0, WL2, WL3 of non-selected cells are set to the low level. At this time, the reset signal RST1, the potential of the word line WL1 of a selected cell and the potentials of the word lines WL4 to WL7 of the non-selected cell blocks CB2, CB3 are kept at the high level. Then, the block selection transistor QS0 is turned ON by setting the block selection signal /BS0 to the high level. The block selection signals BS0, /BS1, BS1 are maintained at the low level.

In this state, cell information is read out from the ferroelectric capacitor C1 to the bit line /BL by driving the plate line /PL to set the potential thereof to the internal power supply potential Vaa. The potential of the plate line PL stays at the potential Vss. The potential read out to the bit line /BL is amplified by a sense amplifier SA and then the rewriting operation is performed in the same manner as in the second embodiment. After this, the reset signals RST0, RST1 and the potentials of the word lines WL0, WL2, WL3 are set to the high level. Then, the block selection signal /BS0 is set to the low level to set the standby state.

According to the semiconductor integrated circuit device of the twelfth embodiment, the same effect as a combination of the effects of the second and eleventh embodiments can be attained.

Thirteenth Embodiment

A thirteenth embodiment relates to one example of the driving method of the plate lines PL, /PL of the semiconductor integrated circuit device of the eleventh embodiment (FIG. 12). More specifically, like the third embodiment, the thirteenth embodiment relates to a case wherein the potentials of plate lines PL, /PL are fixed at Vaa/2.

FIG. 14 shows the operation of the semiconductor integrated circuit device of FIG. 12, for illustrating the thirteenth embodiment of the present invention. The operation is explained below by taking a case wherein information is read out from a ferroelectric capacitor C1 as an example.

As shown in FIG. 14, the state at the standby time is similar to that in the twelfth embodiment except that the plate lines PL, /PL are driven and set to Vaa/2. At the active time, a reset signal RST0 and potentials of word lines WL0, WL2, WL3 of non-selected cells are set to the low level. In this state, information is read out to the bit line /BL by setting a block selection signal /BS0 to the high level. Then, the potential of the bit line /BL is amplified. The potentials of word lines WL4 to WL7 are kept at the high level and block selection signals BS0, BS1, /BS1 are kept at the low level. Next, the potential of the bit line /BL is amplified and then the rewriting operation is performed in the same manner as in the third embodiment. After this, the standby state is set in the same manner as in the twelfth embodiment.

According to the semiconductor integrated circuit device of the thirteenth embodiment, the same effect as a combination of the effects of the third and eleventh embodiments can be attained.

Fourteenth Embodiment

A fourteenth embodiment relates to one example of the driving method of the plate lines PL, /PL of the semiconductor integrated circuit device of the eleventh embodiment (FIG. 12). More specifically, the plate lines PL, /PL are driven in the same manner as in the fourth embodiment.

Figure 15:
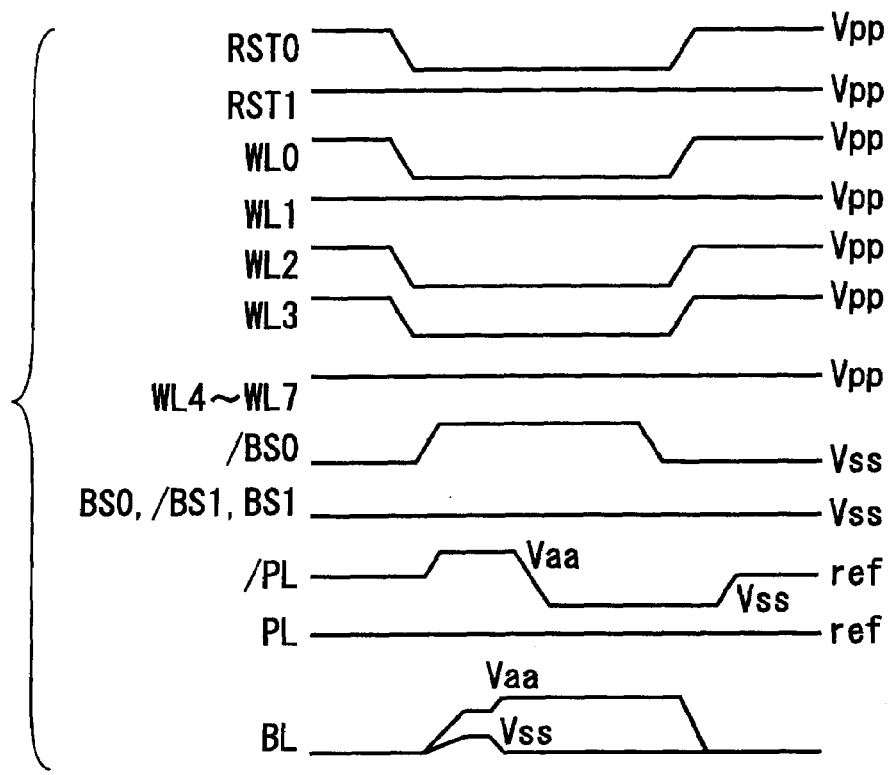
FIG. 15 is a diagram showing the operation of the semiconductor integrated circuit device of FIG. 12, for illustrating a fourteenth embodiment of the present invention.

FIG. 15 shows the operation of the semiconductor integrated circuit device of FIG. 12, for illustrating the fourteenth embodiment of the present invention. The operation is explained below by taking a case wherein information is read out from a ferroelectric capacitor C1 as an example.

As shown in FIG. 15, the state at the standby time is similar to that in the twelfth embodiment except that the plate lines PL, /PL are driven and set to potential Vref. At the active time, a reset signal RST0, potentials of word lines WL0, WL2, WL3 of non-selected cells are set to a low level and a block selection signal /BS0 is set to the high level. In this state, information is read out from the ferroelectric capacitor C1 by driving the plate line /PL to set the potential thereof to internal power supply potential Vaa. The potentials of word lines WL4 to WL7 are kept at the high level, block selection signals BS0, BS1, /BS1 are kept at the low level and the plate line PL is maintained at the potential Vref. Next, the potential of the bit line /BL is amplified and then the rewriting operation is performed in the same manner as in the fourth embodiment. After this, the standby state is set in the same manner as in the twelfth embodiment.

According to the semiconductor integrated circuit device of the fourteenth embodiment, the same effect as a combination of the effects of the fourth and eleventh embodiments can be attained.

Fifteenth Embodiment

A fifteenth embodiment relates to one example of the driving method of the plate lines PL, /PL of the semiconductor integrated circuit device of the eleventh embodiment (FIG. 12). More specifically, the plate lines PL, /PL are driven in the same manner as in the fifth embodiment.

Figure 16:
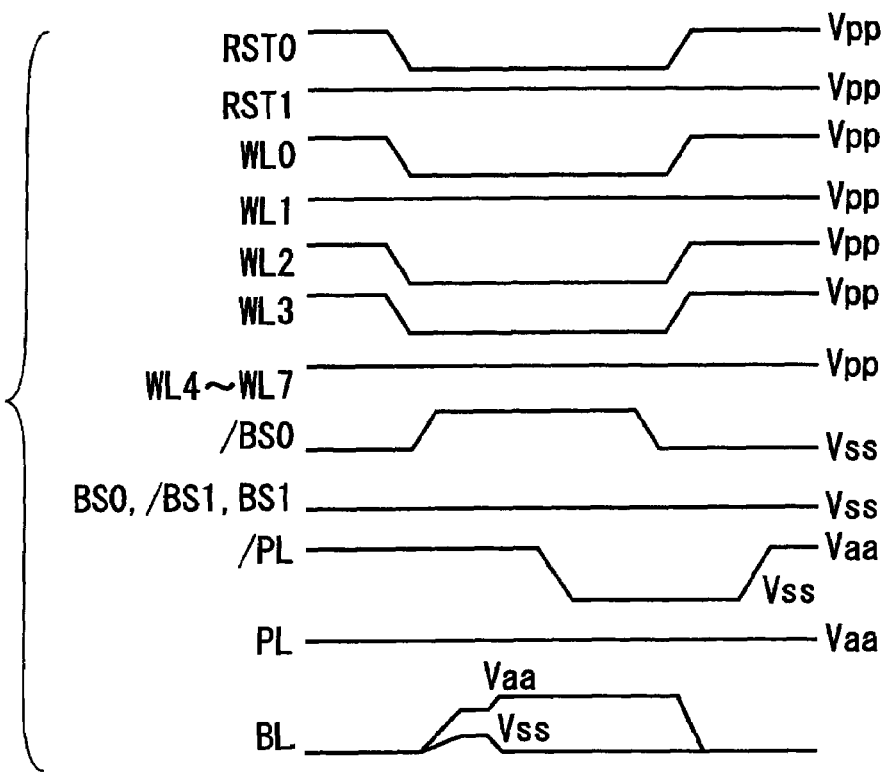
FIG. 16 is a diagram showing the operation of the semiconductor integrated circuit device of FIG. 12, for illustrating a fifteenth embodiment of the present invention.

FIG. 16 shows the operation of the semiconductor integrated circuit device of FIG. 12, for illustrating the fifteenth embodiment of the present invention. The operation is explained below by taking a case wherein information is read out from a ferroelectric capacitor C1 as an example.

As shown in FIG. 16, the state at the standby time is similar to that in the twelfth embodiment except that the plate lines PL, /PL are driven and set to internal power supply potential Vaa. At the active time, a reset signal RST0 and potentials of word lines WL0, WL2, WL3 of non-selected cells are set to the low level. In this state, information is read out from the ferroelectric capacitor C1 to the bit line /BL by setting a block selection signal /BS0 to the high level. At this time, potentials of word lines WL4 to WL7 are kept at the high level, block selection signals BS0, BS1, /BS1 are kept at the low level and the plate line PL stays at the internal power supply potential Vaa. Next, the potential of the bit line /BL is amplified and then the rewriting operation is performed in the same manner as in the fifth embodiment. After this, the standby state is set in the same manner as in the twelfth embodiment.

According to the semiconductor integrated circuit device of the fifteenth embodiment, the same effect as a combination of the effects of the fifth and eleventh embodiments can be attained.

Sixteenth Embodiment

Figure 17:
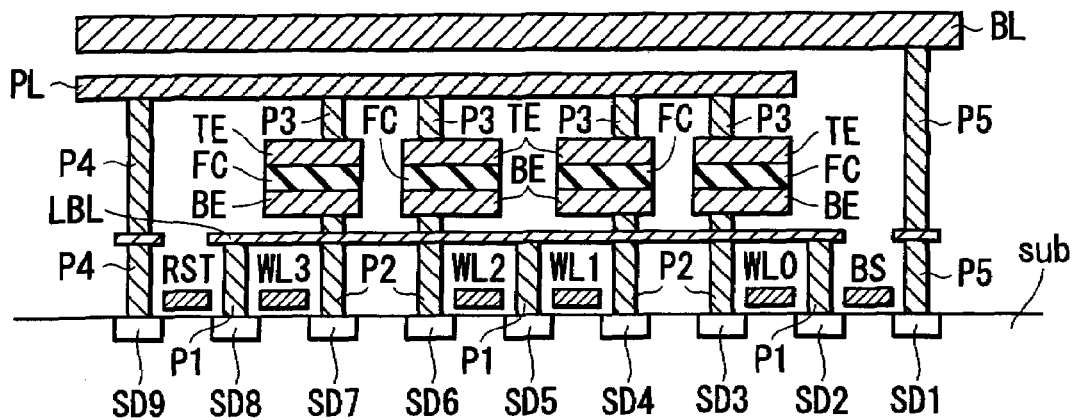
FIG. 17 is a view schematically showing the cross sectional structure of a cell block which can be applied to the semiconductor integrated circuit device of FIG. 1, for illustrating a sixteenth embodiment of the present invention.

A sixteenth embodiment relates to the configuration of the semiconductor integrated circuit device of the first embodiment (FIG. 1). FIG. 17 schematically shows the cross sectional structure of a cell block which can be applied to the semiconductor integrated circuit device of FIG. 1, for illustrating the sixteenth embodiment of the present invention. As shown in FIG. 17, source/drain regions (active regions) SD1 to SD9 are formed with a certain distance from one another on the surface of a semiconductor substrate sub. A gate electrode (block selection signal line) BS is formed above a portion of the semiconductor substrate sub which lies between the source/drain regions SD1 and SD2 with a gate insulating film (not shown) disposed therebetween. Likewise, gate electrodes (word lines) WL0, WL1, WL2, WL3 are respectively formed above portions of the semiconductor substrate sub which lie between the source/drain regions SD2 and SD3, SD4 and SD5, SD5 and SD6, and SD7 and SD8. Further, a gate electrode (reset signal line) RST is formed above a portion of the semiconductor substrate sub which lies between the source/drain regions SD8 and SD9. A cell transistor QR, block selection transistor QS and cell transistors Q0 to Q3 are each formed of a corresponding one of the gate electrodes and the two source/drain regions adjacent to the gate electrode.

A local bit line LBL is formed above the gate electrodes WL0 to WL3. The local bit line LBL is electrically connected to the source/drain regions SD2, SD5, SD8 via contacts P1. Ferroelectric capacitors C0 to C3 are formed above the local bit line LBL. Each of the ferroelectric capacitors C0 to C3 is formed of a lower electrode BE, ferroelectric film FC and upper electrode TE. The lower electrodes BE of the ferroelectric capacitors C0 to C3 are electrically connected to the source/drain regions SD3, SD4, SD6, SD7 via contacts P2, respectively. The contacts P2 are provided on a plane different from the plane on which the contacts P1 are formed (on the front or rear side of the contacts P1).

The upper electrodes TE of the ferroelectric capacitors C0 to C3 are electrically connected to a plate line PL formed above the upper electrodes TE via contacts P3. The plate line PL is electrically connected to the source/drain region SD9 via a contact P4.

A bit line BL is provided above the plate electrode PL. The bit line BL is electrically connected to the source/drain region SD1 via a contact P5.

According to the semiconductor integrated circuit device of the sixteenth embodiment, the cell block CB of the semiconductor integrated circuit device of the first embodiment can be realized. Further, it is possible to attain a memory cell with approximately $6F^2$ in size which stretch 3F in the extending direction of the bit line BL and 2F in the extending direction of the word line WL0 to WL3

Seventeenth Embodiment

Figure 18:
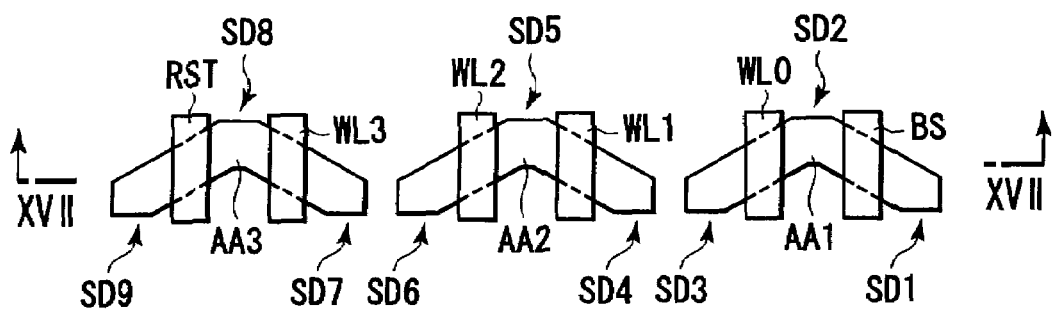
FIG. 18 is a view showing the layout which can be applied to the semiconductor integrated circuit device of FIG. 17, for illustrating a seventeenth embodiment of the present invention.
Figure 19:
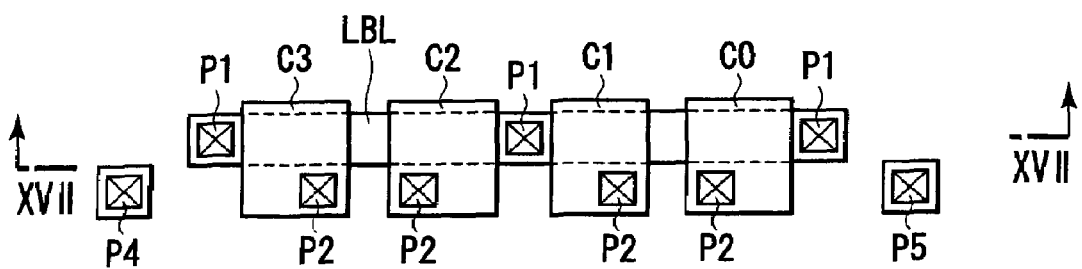
FIG. 19 is a view showing the layout which can be applied to the semiconductor integrated circuit device of FIG. 17, for illustrating the seventeenth embodiment of the present invention.

A seventeenth embodiment relates to the layout which can be applied to the sixteenth embodiment. FIGS. 18, 19 show the layout which can be applied to the semiconductor integrated circuit device of FIG. 17, for illustrating the seventeenth embodiment of the present invention. The cross sections taken along the XVII-XVII lines of FIGS. 18, 19 correspond to FIG. 17.

As shown in FIGS. 18, 19, an active region AA1 has substantially a "V-shaped" configuration. The respective sides of the V-shaped configuration are arranged to cross the gate electrodes BS, WL0. A source/drain region SD2 is formed in the apex of the V-shaped configuration (one end of each of the two sides) and a contact P1 is formed in this position. Source/drain regions SD1, SD3 are respectively formed in tips of the active area AA1 and contacts P5, P2 are formed in the source/drain regions SD1, SD3, respectively. The active area AA1 is not limited to the "V-shaped" configuration and can be formed in a desired form as long as coordinate values on the axes of the source/drain regions SD1 and SD3 and the source/drain region SD2 are different from each other in the gate electrode extending direction.

An active area AA2 is formed in the same manner as the active area AA1 with respect to gate electrodes WL1, WL2. A source/drain region SD5 is formed in the apex of the active area AA2 and a contact P1 is formed therein. Source/drain regions SD4, SD6 are respectively formed in tips of the active area AA2 and contacts P2 are formed therein.

Further, an active area AA3 is formed in the same manner as the active area AA1 with respect to gate electrodes WL3, RST. A source/drain region SD8 is formed in the apex of the active area AA3 and a contact P1 is formed therein. Source/drain regions SD7, SD9 are respectively formed in tips of the active area AA3 and contacts P2, P4 are formed in the source/drain region SD7, SD9, respectively.

According to the semiconductor integrated circuit device of the seventeenth embodiment, the semiconductor integrated circuit device of FIG. 17 can be realized and the same effect as the sixteenth embodiment can be attained.

Eighteenth Embodiment

Figure 20:
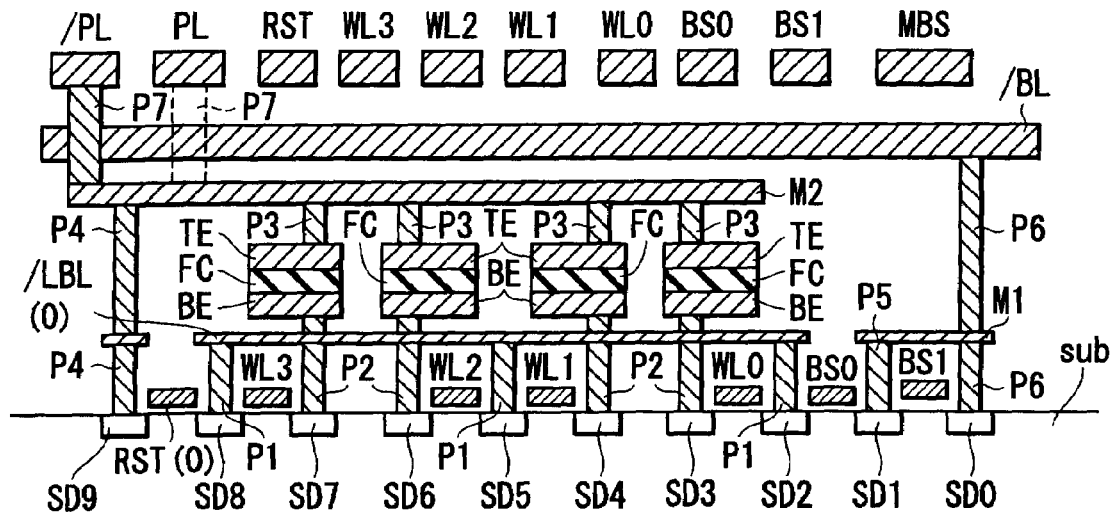
FIG. 20 is a view schematically showing the cross sectional structure of a cell block which can be applied to the semiconductor integrated circuit devices of FIGS. 7 and 12, for illustrating an eighteenth embodiment of the present invention.

An eighteenth embodiment relates to the configurations of the semiconductor integrated circuit devices of the sixth embodiment (FIG. 7) and eleventh embodiment (FIG. 12). FIG. 20 schematically shows the cross sectional structure of a cell block CB0 which can be applied to the semiconductor integrated circuit devices of FIGS. 7 and 12, for illustrating the eighteenth embodiment of the present invention. Cell blocks CB1 to CB3 also have the same configuration.

As shown in FIG. 20, the semiconductor integrated circuit device is different from the semiconductor integrated circuit device of FIG. 17 in the structure of plate lines PL, /PL and in that a block selection transistor QS1 is additionally provided. That is, a source/drain region SD0 is formed at a distance from a source/drain region SD1 on the surface of a semiconductor substrate sub. A gate electrode (block selection signal line) BS1 is formed above a portion of the semiconductor substrate sub which lies between the source/drain regions SD0 and SD1 with a gate insulating film (not shown) disposed therebetween. A block selection transistor QS1 is configured by the source/drain regions SD0, SD1 and gate electrode BS1.

An interconnection layer M1 is arranged above the gate electrode BS1. The interconnection layer M1 is electrically connected to the source/drain region SD1 via a contact P5. The bit line /BL is electrically connected to the source/drain region SD0 via a contact P6.

An interconnection layer M2 is disposed instead of the plate line PL of FIG. 17. The interconnection layer M2 is electrically connected to the plate line /PL provided above the bit line /BL via a contact P7.

When the cell block CB1 having the same configuration as the cell block CB0 of FIG. 20 is provided, the interconnection layer M2 of the cell block CB1 is electrically connected to the plate line PL via a contact P7.

Wiring layers RST, WL0 to WL3, BS0, BS1 for shunt are disposed in the same layer (level) as that of the plate line /PL. The delay of the signal by the resistances of the gate electrodes of the transistor RST, WL0 to WL3, BS0, BS1 can be eased by these wiring layers for shunt RST, WL0 to WL3, BS0, BS1. For example, the wiring layers for shunt RST, WL0 to WL3, BS0, BS1 extend in the same direction as that of the gate electrode, and are electrically connected to the corresponding gate electrodes (denoted with the same reference symbols) at a certain distance in the extending direction.

Moreover, a main block selection transistor wiring MBS for realizing a hierarchical word line system is disposed in the same layer as that of the metal wiring for shunt.

A configuration using either the wiring for shunt or the hierarchical word line system is also possible.

Note that in the present and following embodiments which relate to the structures, each transistor formed of a field transistor has been described, but may also be formed by shallow trench isolation (STI).

According to the semiconductor integrated circuit device of the eighteenth embodiment, the cell blocks CB0 to CB3 of the semiconductor integrated circuit device of the sixth and eleventh embodiments can be realized and the folded bit line configuration can be attained.

Nineteenth Embodiment

Figure 21:
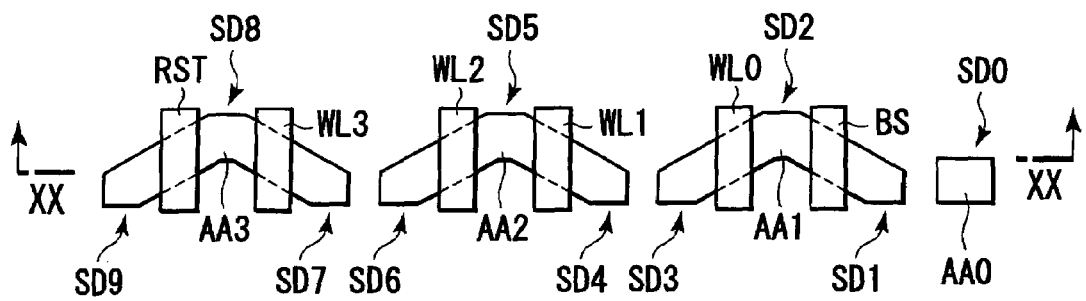
FIG. 21 is a view showing the layout which can be applied to the semiconductor integrated circuit device of FIG. 20, for illustrating a nineteenth embodiment of the present invention.
Figure 22:
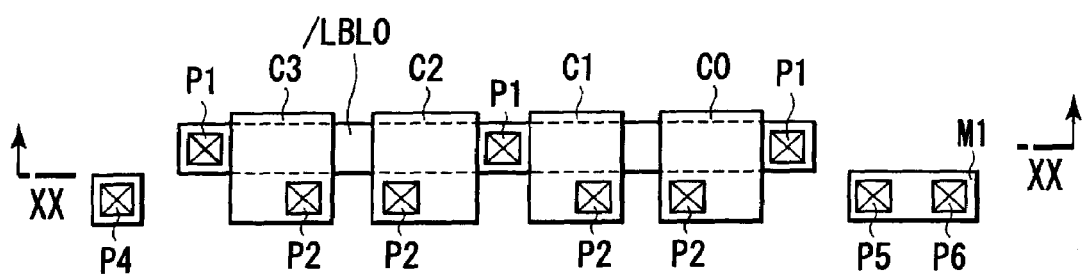
FIG. 22 is a view showing the layout which can be applied to the semiconductor integrated circuit device of FIG. 20, for illustrating the nineteenth embodiment of the present invention.

A nineteenth embodiment relates to the layout which can be applied to the eighteenth embodiment. FIGS. 21, 22 show the layout which can be applied to the semiconductor integrated circuit device of FIG. 20, for illustrating the nineteenth embodiment of the present invention. The cross sections taken along the XX-XX lines of FIGS. 21, 22 correspond to FIG. 20.

FIGS. 21, 22 are similar to FIGS. 18, 19 except that an active area AA0 and contact P6 are additionally provided. The active area AA0 is formed at a distance from an active area AA1 and the contact P6 is formed in the above position. Like the seventeenth embodiment, the shape of the active areas AA1 to AA3 is not limited to substantially the "V-Shape".

According to the semiconductor integrated circuit device of the nineteenth embodiment, the semiconductor integrated circuit device of FIG. 20 can be realized and the same effect as the eighteenth embodiment can be attained.

Twentieth Embodiment

A twentieth embodiment relates to the configuration of a semiconductor integrated circuit device. In the eighteenth embodiment, the plate lines PL, /PL are formed on the hierarchical layer above the bit line /BL and electrically connected to the ferroelectric capacitors C0 to C3 via the interconnection layer M2. On the other hand, in the twentieth embodiment, the plate lines PL, /PL are formed on the hierarchical layer of the interconnection layer M2 as in the sixteenth embodiment.

Figure 23:
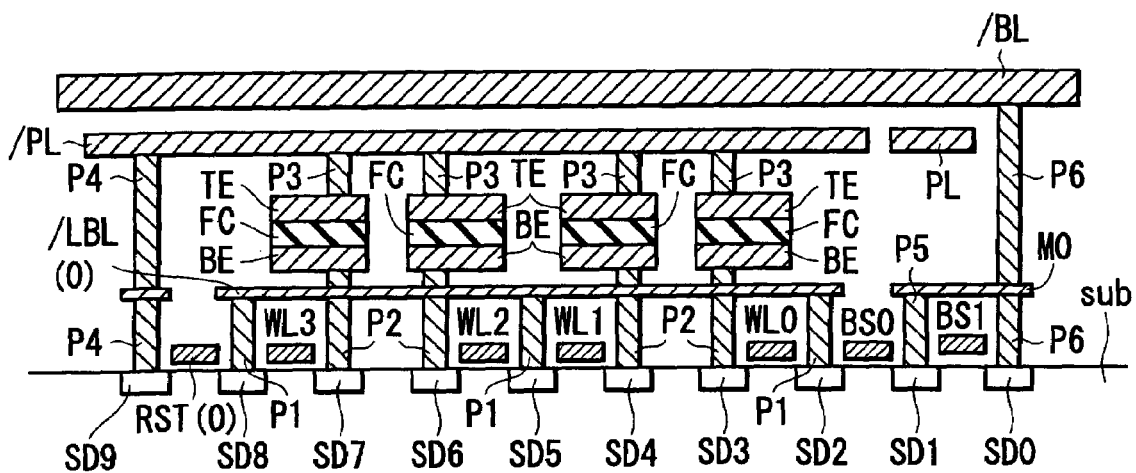
FIG. 23 is a view schematically showing the cross sectional structure of a cell block which can be applied to the semiconductor integrated circuit devices of FIGS. 7 and 12, for illustrating a twentieth embodiment of the present invention.

FIG. 23 schematically shows the cross sectional structure of a cell block CB0 which can be applied to the semiconductor integrated circuit devices of FIGS. 7 and 12, for illustrating the twentieth embodiment of the present invention. As shown in FIG. 23, the semiconductor integrated circuit device is different from the semiconductor integrated circuit device of FIG. 20 in that the interconnection layer M2 is used as the plate line /PL and the plate line PL is formed on the same hierarchical layer of the plate line /PL. The plate line PL is formed to extend in the same direction as the plate line /PL, for example, on a plane different from the plane of FIG. 23 and is electrically connected to an upper electrode TE of a cell block CB1 (not shown) via a contact P3.

According to the twentieth embodiment, the folded bit line configuration can be attained without additionally providing an interconnection layer of an upper layer to the configuration of FIG. 17.

Twenty-first Embodiment

Figure 24:
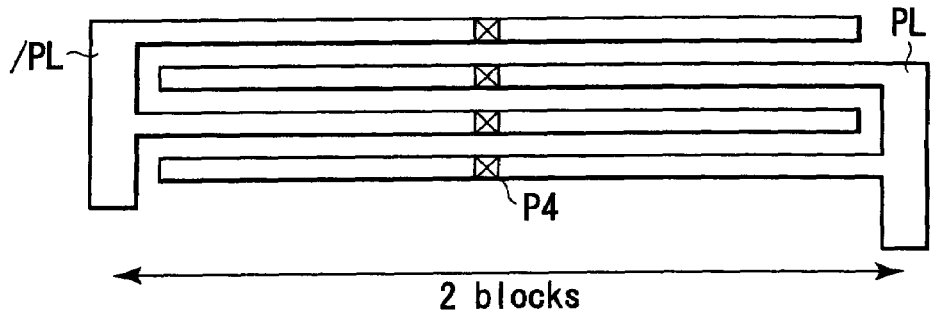
FIG. 24 is a view showing the plane form of plate lines which can be applied to the semiconductor integrated circuit device of FIG. 23, for illustrating a twenty-first embodiment of the present invention.

A twenty-first embodiment relates to the configuration of plate lines PL, /PL which can be applied to the twentieth embodiment. FIG. 24 shows the plane configuration of the plate lines PL, /PL which can be applied to the semiconductor integrated circuit device of FIG. 23, for illustrating the twenty-first embodiment of the present invention. As shown in FIG. 24, the plate lines PL, /PL have substantially a comb shape. Portions corresponding to the teeth of the comb shape of the plate lines PL, /PL are provided in positions of the plate lines PL, /PL which extend in the lateral direction in FIG. 23. The plate lines PL, /PL are formed to extend over two cell blocks in the lateral direction of FIG. 24 and contacts P4 are formed in substantially the central positions of the portions corresponding to the teeth.

According to the twenty-first embodiment, the same effect as the twentieth embodiment can be attained.

Twenty-second Embodiment

A twenty-second embodiment relates to the configuration of a semiconductor integrated circuit device. In the sixteenth to twentieth embodiments, the local bit lines LBL (local bit lines /LBL, LBL0) can be realized by using the interconnection layers formed above the gate electrodes WL0 to WL3. On the other hand, in the twenty-second embodiment, it is realized by use of an active area.

Figure 25:
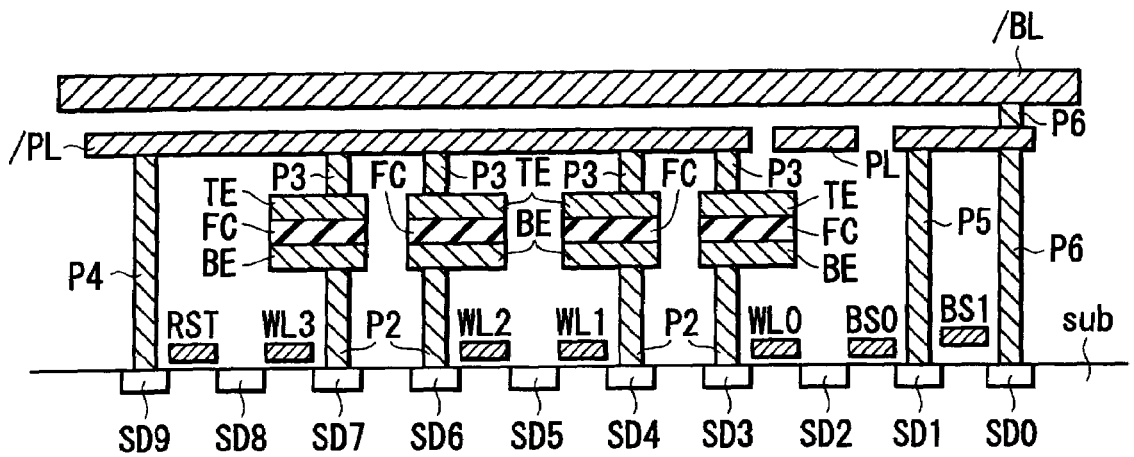
FIG. 25 is a view schematically showing the cross sectional structure of a cell block which can be applied to the semiconductor integrated circuit devices of FIGS. 7 and 12, for illustrating a twenty-second embodiment of the present invention.

FIG. 25 schematically shows the cross sectional structure of a cell block which can be applied to the semiconductor integrated circuit devices of FIGS. 7 and 12, for illustrating the twenty-second embodiment of the present invention. As shown in FIG. 25, none of the local bit line LBL(0) and contacts P1 are formed. Source/drain regions SD2, SD5, SD8 are connected to one another via an active area formed on a plane different from the plane of FIG. 25 (that is, on the front or rear side of the plane). Thus, the source/drain regions SD2, SD5, SD8 are electrically connected to one another.

According to the twenty-second embodiment, the local bit line /LBL is realized by use of the active area. Therefore, it is not necessary to provide the local bit line /LBL which functions as the interconnection layer. As a result, the same effect as the twentieth embodiment can be attained while suppressing the manufacturing cost of the semiconductor integrated circuit device.

Twenty-third Embodiment

Figure 26:
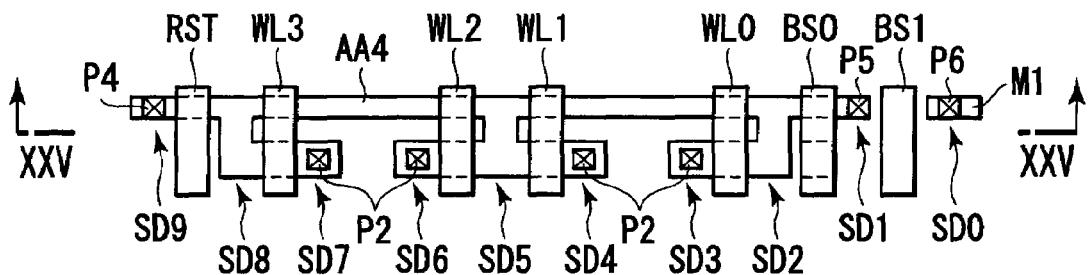
FIG. 26 is a view showing the layout which can be applied to the semiconductor integrated circuit device of FIG. 25, for illustrating a twenty-third embodiment of the present invention.

A twenty-third embodiment relates to the layout which can be applied to the twenty-second embodiment. FIG. 26 shows the layout which can be applied to the semiconductor integrated circuit device of FIG. 25, for illustrating the twenty-third embodiment of the present invention. As shown in FIG. 26, an active area AA4 includes first and second portions. The first portion crosses gate electrodes BS0, WL0 to WL3 and RST. The second portion extends from the first portion in the direction of the gate electrodes BS0, WL0 to WL3 and RST and then extends in the same direction as the first portion to cross the gate electrodes WL0 to WL3. Both ends of the first portion correspond to source/drain regions SD1 and SD9.

Parts of the second portion next to the both sides of the gate electrode WL0 correspond to source/drain regions SD2 and SD3. Parts of the second portion next to the both sides of the gate electrode WL1 correspond to source/drain regions SD4 and SD5. Parts of the second portion next to the both sides of the gate electrode WL2 correspond to source/drain regions SD5 and SD6. Parts of the second portion next to the both sides of the gate electrode WL3 correspond to source/drain regions SD7 and SD8.

According to the twenty-third embodiment, the source/drain regions SD2, SD5, SD8 are electrically connected to one another via the first portion of the active area AA4. Therefore, the same effect as the twenty-second embodiment can be attained.

Twenty-fourth Embodiment

Figure 27:
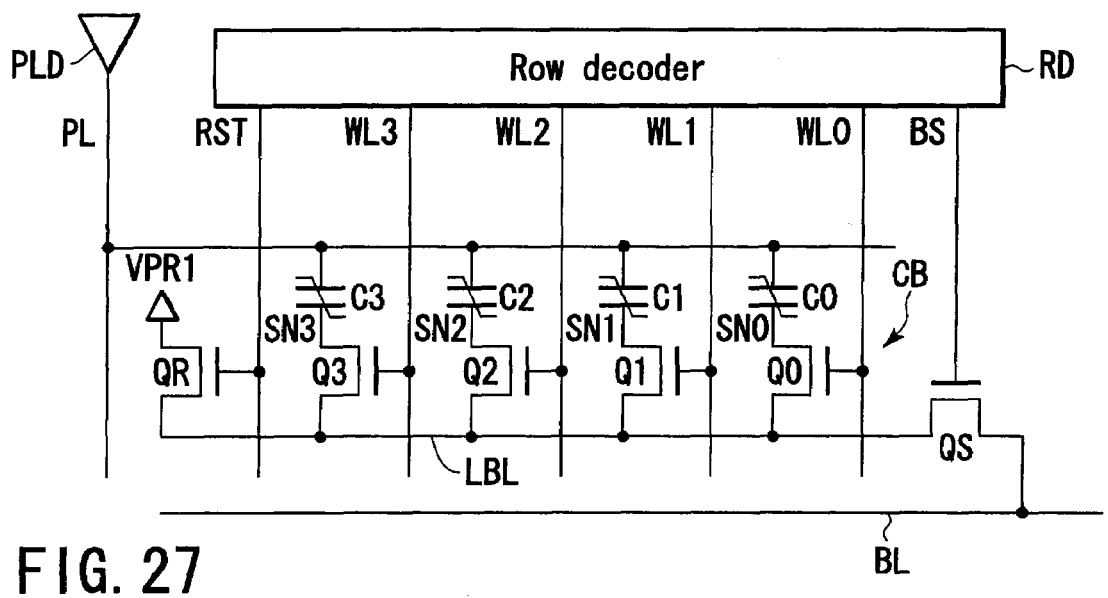
FIG. 27 is a diagram showing the circuit configuration of a semiconductor integrated circuit device according to a twenty-fourth embodiment of the present invention.

A twenty-fourth embodiment is a modification of the first embodiment (FIG. 1). FIG. 27 shows the circuit configuration of a semiconductor integrated circuit device according to the twenty-fourth embodiment of the present invention. As shown in FIG. 27, one end of a reset transistor QR (one end which is opposite to the end portion thereof connected to the local bit line LBL) is connected to a first power supply VPR1. At the standby time, the potential of the first power supply is set equal to the potential of the plate line PL and the same state as that in the first embodiment can be attained. The other configuration and operation are the same as those of the first embodiment.

According to the twenty-fourth embodiment, the same effect as the first embodiment can be attained.

Twenty-fifth Embodiment

A twenty-fifth embodiment relates to one example of the driving method of the plate line PL of the semiconductor integrated circuit device of the twenty-fourth embodiment (FIG. 27). More specifically, like the second embodiment, the twenty-fifth embodiment relates to a case wherein the potential of the plate line PL at the standby time is set at potential Vss and the potential thereof at the driving time is set at internal power supply potential Vaa.

Figure 28:
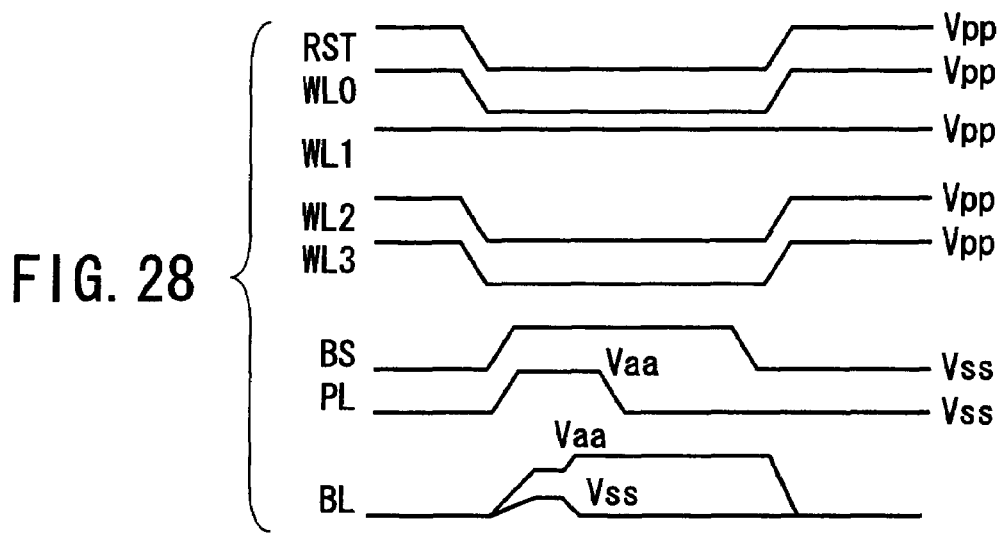
FIG. 28 is a diagram showing the operation of the semiconductor integrated circuit device of FIG. 27, for illustrating a twenty-fifth embodiment of the present invention.

FIG. 28 shows the operation of the semiconductor integrated circuit device of FIG. 27, for illustrating the twenty-fifth embodiment of the present invention. At the standby time, a first power supply VPR1 is set at potential Vss. In this state, the same operation as the second embodiment is performed.

According to the twenty-fifth embodiment, the same effect as the second embodiment can be attained.

Twenty-sixth Embodiment

Figure 29:
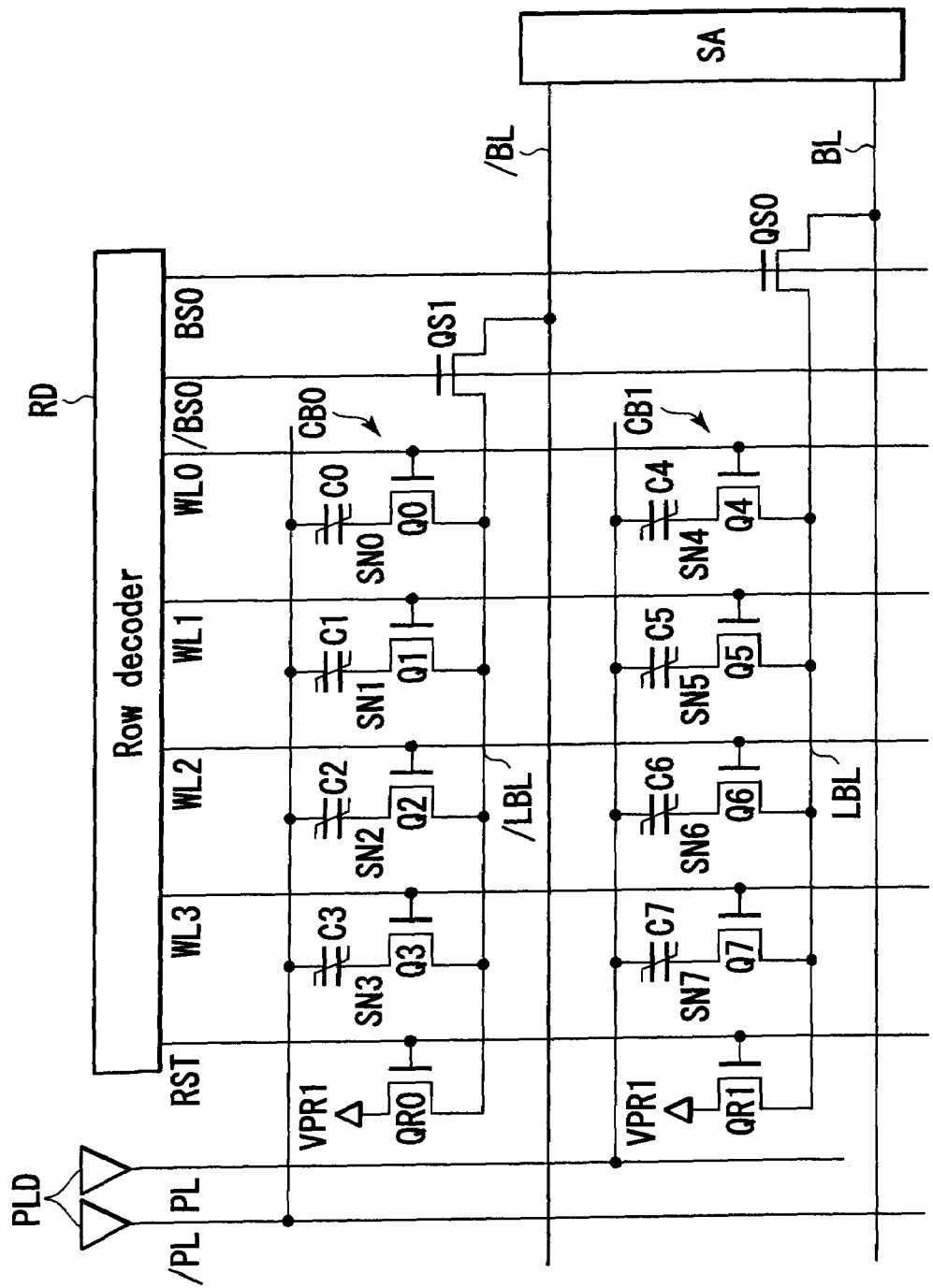
FIG. 29 is a diagram showing the circuit configuration of a semiconductor integrated circuit device according to a twenty-sixth embodiment of the present invention.

A twenty-sixth embodiment relates to the configuration attained by combining the configurations of the sixth embodiment (FIG. 7) and twenty-fourth embodiment (FIG. 27). FIG. 29 shows the circuit configuration of a semiconductor integrated circuit device according to the twenty-sixth embodiment of the present invention. As shown in FIG. 29, like the twenty-fourth embodiment, each one end of reset transistors QR0, QR1 (one end which are opposite to an end thereof connected to local bit lines /LBL, LBL) is connected to a first power supply VPR1, in the configuration of the sixth embodiment (FIG. 7). At the standby time, the potential of the first power supply VPR1 is set equal to the potential of the plate line PL to attain the same state as the sixth embodiment. The other configuration and operation are the same as those of the sixth embodiment.

According to the twenty-sixth embodiment, the same effect as the sixth embodiment can be attained.

Twenty-seventh Embodiment

A twenty-seventh embodiment relates to one example of the driving method of the plate lines PL, /PL of the semiconductor integrated circuit device of the twenty-sixth embodiment (FIG. 29). More specifically, like the second embodiment, the twenty-seventh embodiment relates to a case wherein the potentials of the plate lines PL, /PL at the standby time are set at potential Vss and the potentials thereof at the driving time are set at internal power supply potential Vaa.

Figure 30:
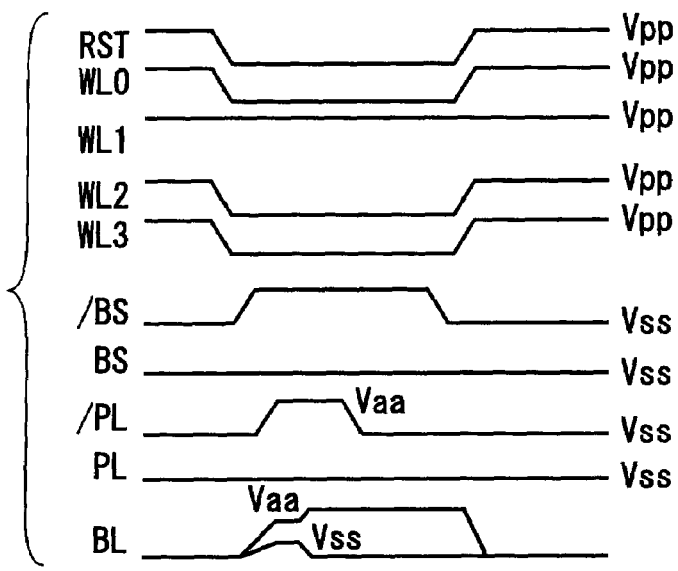
FIG. 30 is a diagram showing the operation of the semiconductor integrated circuit device of FIG. 29, for illustrating a twenty-seventh embodiment of the present invention.

FIG. 30 shows the operation of the semiconductor integrated circuit device of FIG. 29, for illustrating the twenty-seventh embodiment of the present invention. At the standby time, the potential of a first power supply VPR1 is set at Vss. In this state, the same operation as the operation in the second and seventh embodiments is performed.

According to the twenty-seventh embodiment, the same effect as a combination of the effects of the second and twenty-sixth embodiments can be attained.

Twenty-eighth Embodiment

A twenty-eighth embodiment relates to one example of the driving method of the plate lines PL, /PL of the semiconductor integrated circuit device of the twenty-sixth embodiment (FIG. 29). More specifically, like the third embodiment, the twenty-eighth embodiment relates to a case wherein the potentials of the plate lines PL, /PL are fixed at Vaa/2.

Figure 31:
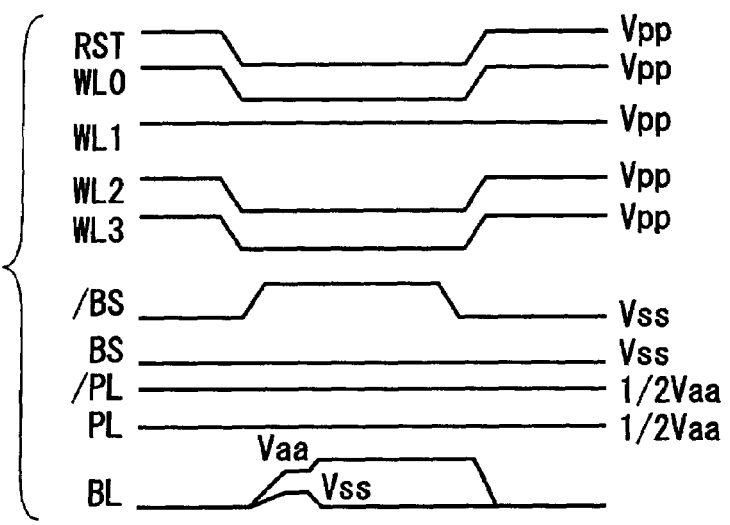
FIG. 31 is a diagram showing the operation of the semiconductor integrated circuit device of FIG. 29, for illustrating a twenty-eighth embodiment of the present invention.

FIG. 31 shows the operation of the semiconductor integrated circuit device of FIG. 29, for illustrating the twenty-eighth embodiment of the present invention. At the standby time, the potential of a first power supply VPR1 is set at Vaa/2. In this state, the same operation as the operation in the third and eighth embodiments is performed.

According to the twenty-eighth embodiment, the same effect as a combination of the effects of the third and twenty-sixth embodiments can be attained.

Twenty-ninth Embodiment

A twenty-ninth embodiment relates to one example of the driving method of the plate lines PL, /PL of the semiconductor integrated circuit device of the twenty-sixth embodiment (FIG. 29). More specifically, the plate lines PL, /PL are driven in the same manner as in the fourth embodiment.

Figure 32:
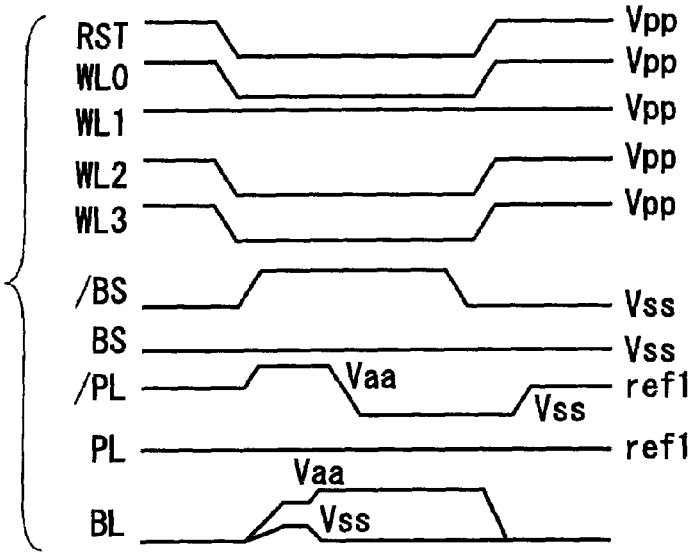
FIG. 32 is a diagram showing the operation of the semiconductor integrated circuit device of FIG. 29, for illustrating a twenty-ninth embodiment of the present invention.

FIG. 32 shows the operation of the semiconductor integrated circuit device of FIG. 29, for illustrating the twenty-ninth embodiment of the present invention. At the standby time, the potential of a first power supply VPR1 is set to Vref. In this state, the same operation as the operation in the fourth and ninth embodiments is performed.

According to the twenty-ninth embodiment, the same effect as a combination of the effects of the fourth and twenty-sixth embodiments can be attained.

Thirtieth Embodiment

A thirtieth embodiment relates to one example of the driving method of the plate lines PL, /PL of the semiconductor integrated circuit device of the twenty-sixth embodiment (FIG. 29). More specifically, the plate lines PL, /PL are driven in the same manner as in the fifth and tenth embodiments.

Figure 33:
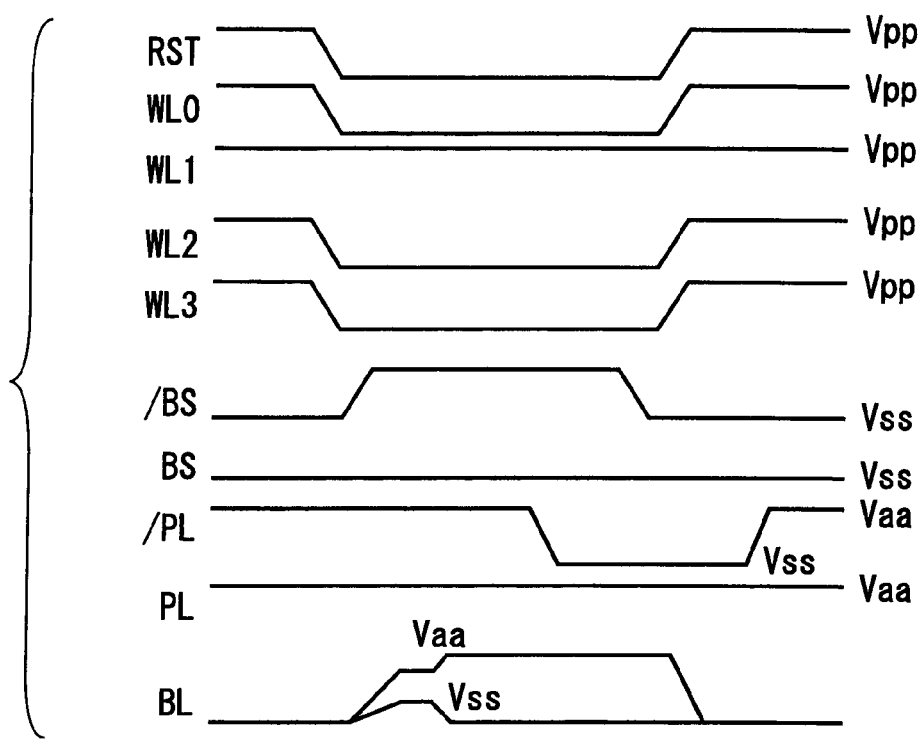
FIG. 33 is a diagram showing the operation of the semiconductor integrated circuit device of FIG. 29, for illustrating a thirtieth embodiment of the present invention.

FIG. 33 shows the operation of the semiconductor integrated circuit device of FIG. 29, for illustrating the thirtieth embodiment of the present invention. At the standby time, the potential of a first power supply VPR1 is set to internal power supply potential Vaa. In this state, the same operation as the operation in the fifth and tenth embodiments is performed.

According to the thirtieth embodiment, the same effect as a combination of the effects of the fifth and twenty-sixth embodiments can be attained.

Thirty-first Embodiment

Figure 34:
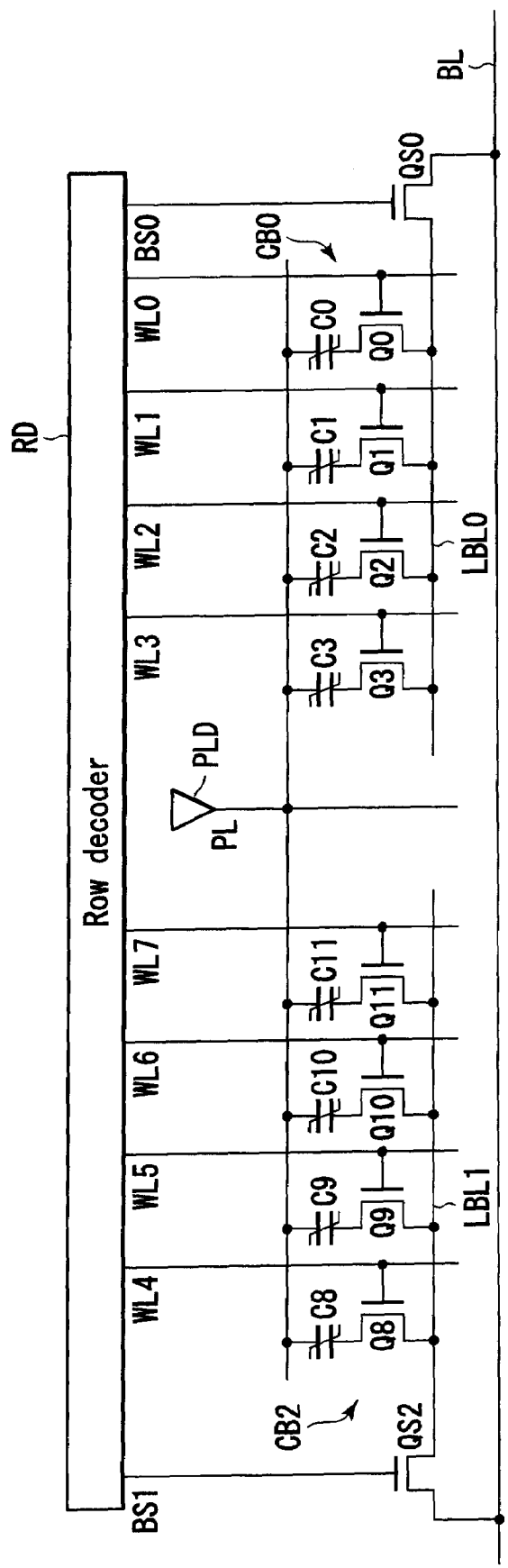
FIG. 34 is a diagram showing the circuit configuration of a semiconductor integrated circuit device according to a thirty-first embodiment of the present invention.

In a thirty-first embodiment, a reset transistor is not provided. FIG. 34 shows the circuit configuration of a semiconductor integrated circuit device according to the thirty-first embodiment of the present invention. As shown in FIG. 34, cell blocks CB0, CB2 of the configuration obtained by removing the reset transistor QR from the circuit configuration of FIG. 1 are connected to a bit line BL. Each one end of ferroelectric capacitors C0 to C3 and C8 to C12 are connected to a plate line PL. Next, the operation is explained below by taking a case wherein information is read out from the ferroelectric capacitor C1 as an example.

At the standby time, the same potential (potential Vss) is applied to the plate line PL and bit line BL. In this state, cell transistors Q0 to Q3 and Q8 to Q11 and block selection transistors QS0, QS2 are set in the ON state in the standby state. Therefore, the two ends of the ferroelectric capacitors C0 to C3 and C8 to C12 are set at the same potential.

At the active time, the block selection transistor QS2 of the non-selected cell block CB2 is turned OFF and the cell transistors Q0, Q2, Q3 other than the selected cell in the selected cell block CB0 are turned OFF. Then, the plate line PL is driven to permit information to be read out from the ferroelectric capacitor C1 of the selected cell. After this, the amplification and rewriting operations for the potential of the bit line BL are performed in the same manner as in the first embodiment.

According to the thirty-first embodiment, the same effect as the first embodiment can be attained.

Thirty-second Embodiment

A thirty-second embodiment relates to one example of the driving method of the plate line PL of the semiconductor integrated circuit device of the thirty-first embodiment (FIG. 34). More specifically, like the second embodiment, the potential of the plate line PL at the standby time is set at potential Vss and the potential thereof at the driving time is set at internal power supply potential Vaa.

Figure 35:
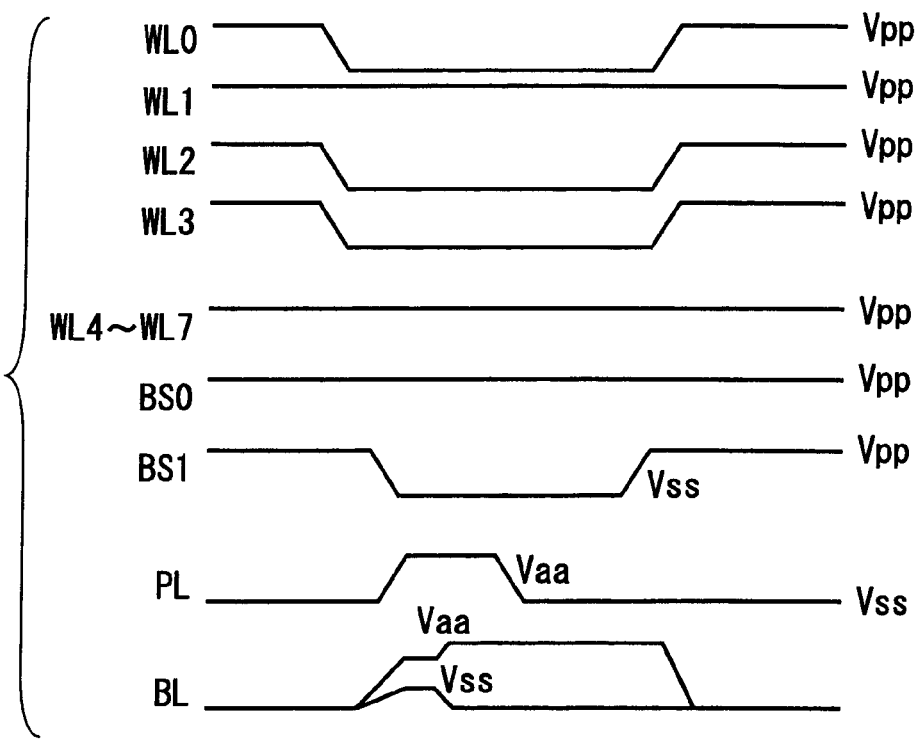
FIG. 35 is a diagram showing the operation of the semiconductor integrated circuit device of FIG. 34, for illustrating a thirty-second embodiment of the present invention.

FIG. 35 shows the operation of the semiconductor integrated circuit device of FIG. 34, for illustrating the thirty-second embodiment of the present invention. The operation is explained below by taking a case wherein information is read out from a ferroelectric capacitor C1 as an example.

As shown in FIG. 35, at the standby time, the potentials of word lines WL0 to WL7 and block selection signals BS0, BS1 are set to the high level. At the active time, the potentials of the word lines WL0, WL2, WL3 of cell transistors of cells other than the selected cell in the selected cell block CB0 are set to a low level. Then, the block selection signal BS1 of the non-selected cell block CB1 is set to the low level. The block selection signal BS0 of the selected cell block CB0 stays at the high level. In this state, the operation of the plate line PL is set to internal power supply potential Vaa so as to permit cell information to be read out from the ferroelectric capacitor C1 to the bit line BL. After this, the amplification and rewriting operations for the potential of the bit line BL are performed in the same manner as in the first embodiment. Then, the potentials of the word lines WL0, WL2, WL3 and block selection signal BS1 are set to the high level to set the standby state.

According to the thirty-second embodiment, the same effect as the thirty-first embodiment can be attained.

Thirty-third Embodiment

Figure 36:
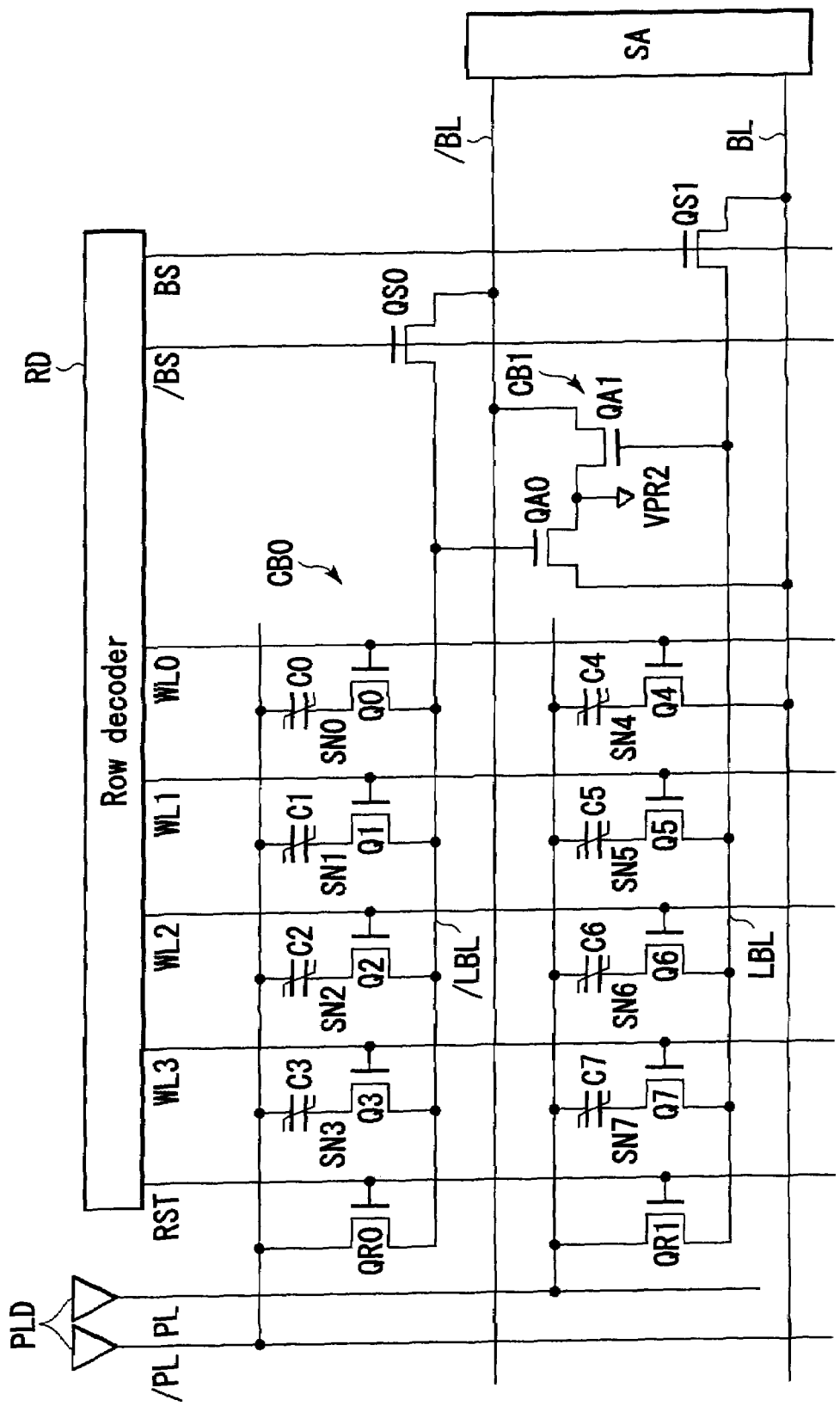
FIG. 36 is a diagram showing the circuit configuration of a semiconductor integrated circuit device according to a thirty-third embodiment of the present invention.

A thirty-third embodiment relates to the configuration having an amplifying section which amplifies the potentials of bit lines BL, /BL in addition to the configuration of the sixth embodiment (FIG. 7). FIG. 36 shows the circuit configuration of a semiconductor integrated circuit device according to the thirty-third embodiment of the present invention. As shown in FIG. 36, amplification transistors QA0, QA1 are provided in a cell block CB0 (CB1). One end of the amplification transistor QA0 is connected to the bit line BL, the other end thereof is connected to a second power supply VPR2 and the gate thereof is connected to a local bit line /LBL. One end of the amplification transistor QA1 is connected to the bit line /BL, the other end thereof is connected to the second power supply VPR2 and the gate thereof is connected to a local bit line LBL. It is possible to connect the other end of the amplification transistor QA1 to a third power supply and set the third power supply to the same potential as the second power supply.

Next, the operation is explained. The state at the standby time is the same as that in the sixth embodiment. At the active time, reset transistors QR0, QR1 and cell transistors Q0, Q2, Q3, Q4, Q6, Q7 are turned OFF. In this state, if information is read out from a cell in the cell block CB0, only the plate line /PL is driven and the plate line PL is not driven. As a result, cell information is read out to the local bit line /LBL.

The potential read out to the local bit line /LBL is supplied to the gate of the amplification transistor QA0 and amplified by the amplification transistor QA0. As a result, a signal obtained by amplifying inverted data of the potential read out to the local bit line /LBL appears on the bit line BL. A difference between the potential of the bit line BL and reference potential of the bit line /BL is amplified by a sense amplifier SA.

After amplification by the sense amplifier SA, a block selection transistor QS0 of the selected cell block is turned ON. As a result, the potential of the bit line /BL is transferred to the local bit line /LBL via the block selection transistor QS0. Therefore, information of positive logic of the bit line /BL is rewritten into a ferroelectric capacitor of the selected cell. That is, like the first embodiment, when the readout information is "0" data, data is rewritten into the ferroelectric capacitor C1 with the potential of the plate line /PL kept at the high level. When the readout information is "1" data, data is rewritten after the potential of the plate line /PL is set to a low level.

When information is read out from the cell in the cell block CB1, readout potential is input to the gate of the amplification transistor QA1 and amplified by the amplification transistor QA1. As a result, a signal obtained by amplifying inverted data of the readout potential appears on the bit line /BL. The potentials of the bit lines BL and /BL are further amplified by a sense amplifier SA.

After amplification by the sense amplifier SA, a block selection transistor QS1 of the selected cell block is turned ON. As a result, the potential of the local bit line LBL is set equal to that of the bit line BL. Therefore, information of positive logic of the bit line BL is rewritten into a ferroelectric capacitor of the selected cell.

According to the thirty-third embodiment, the same effect as the sixth embodiment can be attained. Further, according to the thirty-third embodiment, the amplification transistors QA0, QA1 which amplify the readout potentials of the local bit lines LBL, /LBL are provided. Therefore, a readout signal can be acquired even when the ferroelectric capacitor is small.

Thirty-fourth Embodiment

A thirty-fourth embodiment relates to one example of the driving method of the plate lines PL, /PL of the semiconductor integrated circuit device of the thirty-third embodiment (FIG. 36). More specifically, like the second embodiment, the thirty-fourth embodiment relates to a case wherein the potentials of the plate lines /PL, PL at the standby time are set at potential Vss and the potentials thereof at the driving time are set at internal power supply potential Vaa.

Figure 37:
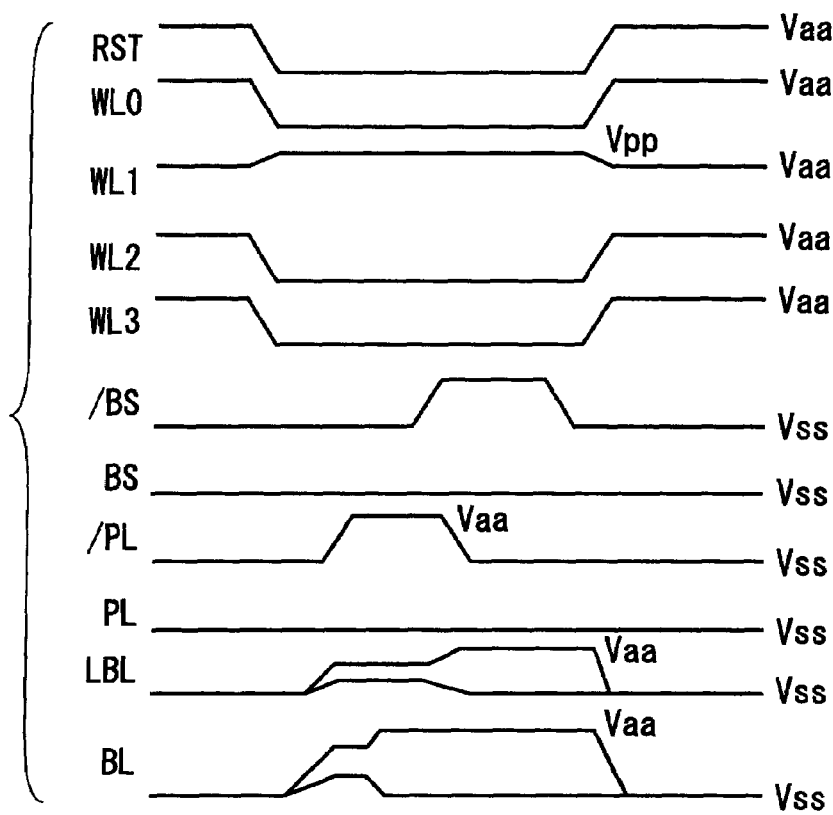
FIG. 37 is a diagram showing the operation of the semiconductor integrated circuit device of FIG. 36, for illustrating a thirty-fourth embodiment of the present invention.

FIG. 37 shows the operation of the semiconductor integrated circuit device of FIG. 36, for illustrating the thirty-fourth embodiment of the present invention. The operation is explained below by taking a case wherein information is read out from a ferroelectric capacitor C1 as an example.

As shown in FIG. 37, at the standby time, a reset signal RST and potentials of word lines WL0 to WL3 are set at the high level (potential Vaa), block selection signals BS, /BS are set at a low level and potentials of the plate lines PL, /PL are set at potential Vss. Therefore, the potential of a local bit line /LBL is set to the low level and the two ends of each of the ferroelectric capacitors C0 to C3 are set at the same potential. This applies to a local bit line LBL.

At the active time, the reset signal RST and the potentials of the word lines WL0, WL2, WL3 of non-selected cells are set to the low level while the word line WL1 is set at potential Vpp. In this state, the plate line PL is driven and set to internal power supply potential Vaa so that information will be read out from the ferroelectric capacitor C1 to the local bit line /LBL. The readout potential is amplified by the amplification transistor QA0 and, as a result, a signal obtained by amplifying inverted data of the potential read out to the local bit line /LBL appears on the bit line BL. The potentials of the bit lines BL, /BL are further amplified by the sense amplifier SA.

After amplification, the block selection signal /BS is set to the high level. As a result, the potential of the bit line /BL is transferred to the local bit line /LBL and rewritten into the ferroelectric capacitor C1. After this, the reset signal RST and the potentials of the word lines WL0, WL2, WL3 are set to the high level and the block selection signal /BS is set to the low level to set the standby state.

According to the thirty-fourth embodiment, the same effect as a combination of the effects of the second and thirty-third embodiments can be attained.

Thirty-fifth Embodiment

Figure 38:
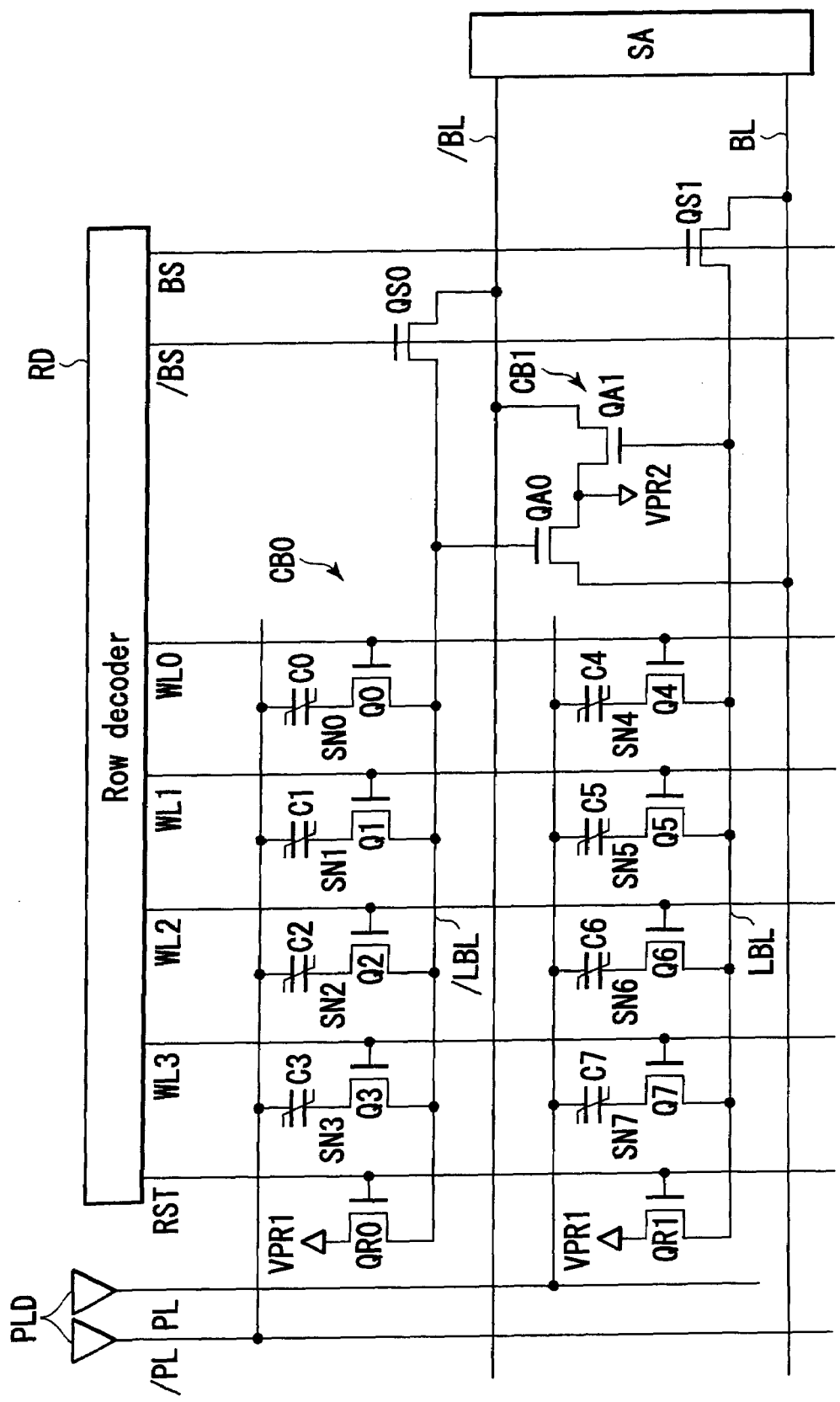
FIG. 38 is a diagram showing the circuit configuration of a semiconductor integrated circuit device according to a thirty-fifth embodiment of the present invention.

A thirty-fifth embodiment relates to the configuration obtained by combining the configurations of the thirty-third embodiment (FIG. 36) and the twenty-fourth embodiment (FIG. 27). FIG. 38 shows the circuit configuration of a semiconductor integrated circuit device according to the thirty-fifth embodiment of the present invention. As shown in FIG. 38, with the configuration of the thirty-third embodiment (FIG. 36), like the twenty-fourth embodiment, each one end of reset transistors QR0, QR1 is connected to a first power supply VPR1. At the standby time, the potential of the first power supply VPR1 is set equal to the potential of a plate line PL. As a result, the same state as the thirty-fourth embodiment can be attained. The other configuration and operation are the same as those of the thirty-fourth embodiment.

In the thirty-fifth embodiment, the same effect as the thirty-fourth embodiment can be attained.

Thirty-sixth Embodiment

A thirty-sixth embodiment relates to one example of the driving method of the plate lines PL, /PL of the semiconductor integrated circuit device of the thirty-fifth embodiment (FIG. 38). More specifically, like the second embodiment, the potentials of the plate lines PL, /PL at the standby time are set at potential Vss and the potentials thereof at the driving time are set at internal power supply potential Vaa.

Figure 39:
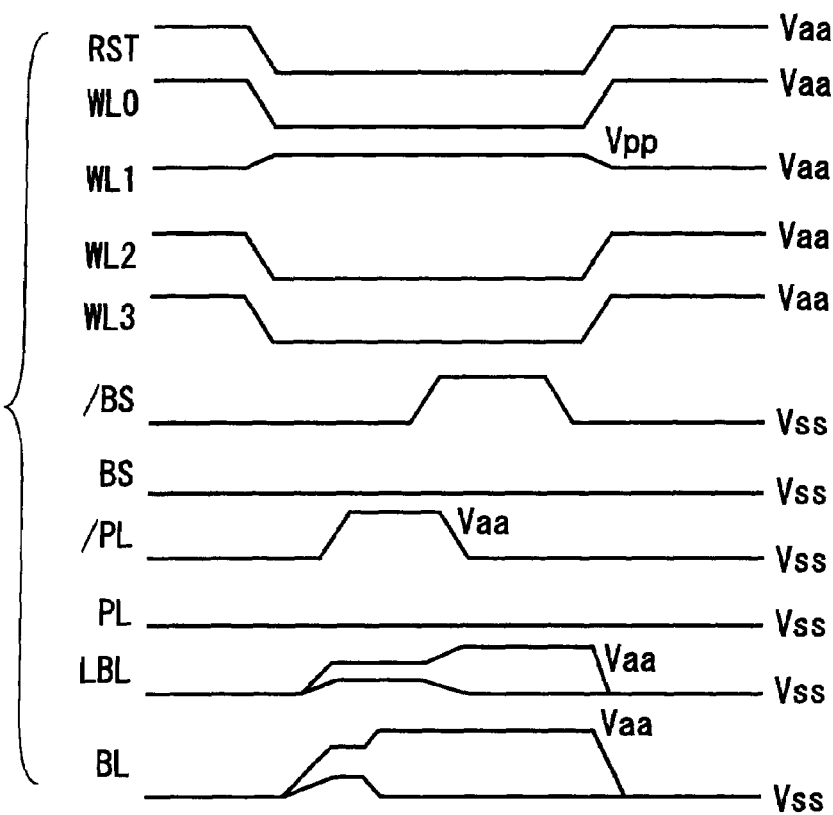
FIG. 39 is a diagram showing the operation of the semiconductor integrated circuit device of FIG. 38, for illustrating a thirty-sixth embodiment of the present invention.

FIG. 39 shows the operation of the semiconductor integrated circuit device of FIG. 38, for illustrating the thirty-sixth embodiment of the present invention. As shown in FIG. 39, at the standby time, the potential of a first power supply VPR1 is set at the potential Vss. In this state, the same operation as the thirty-fourth embodiment is performed.

According to the thirty-sixth embodiment, the same effect as a combination of the effects of the second and thirty-fifth embodiments can be attained.

Thirty-seventh Embodiment

Figure 40:
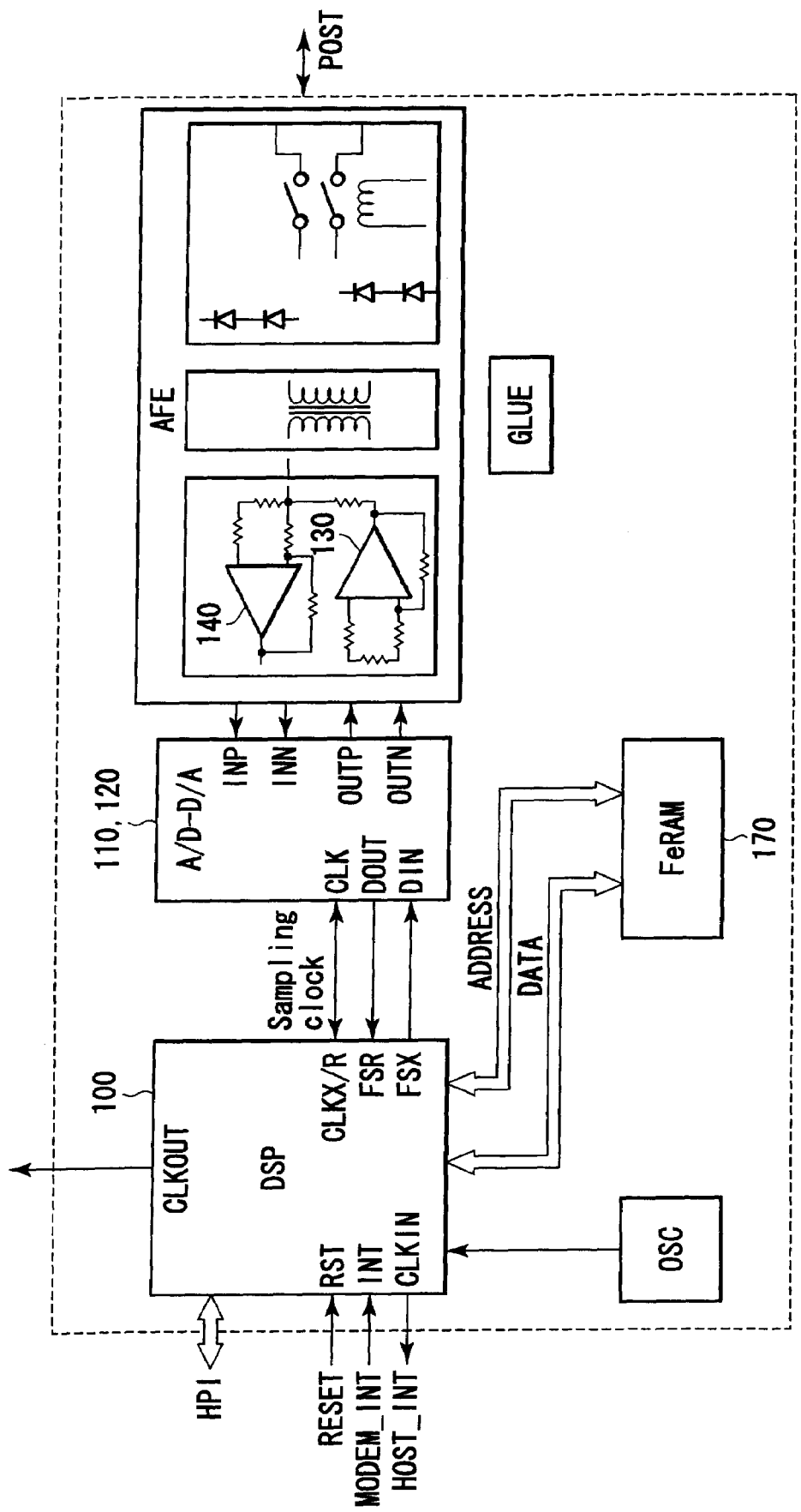
FIG. 40 is a block diagram showing a data bus portion of a modem for a digital subscriber line according to a thirty-seventh embodiment of the present invention.

A thirty-seventh embodiment relates to an application of the semiconductor integrated circuit devices according to the first to thirty-sixth embodiments and semiconductor integrated circuit devices according to forty-first to sixty-second embodiments which will be described later. FIG. 40 is a block diagram showing a data bus portion of a modem for a digital subscriber line according to the thirty-seventh embodiment of the present invention. As shown in FIG. 40, the modem includes a programmable digital processor (DSP: Digital Signal Processor) 100, analog-digital (A/D) converter 110, digital-analog (D/A) converter 120, transmission driver 130 and receiver amplifier 140.

In FIG. 40, a band-pass filter is omitted. Instead of the band-pass filter, various types of optional memories which hold a line code program, which is a program used to select and operate the modem according to coded subscriber line information, transmission condition (line code: QAM, CAP, RSK, FM, AM, PAM, DWMT or the like) executed by the DSP, are provided. As the memory, a semiconductor integrated circuit device (FeRAM) 170 which is one of the semiconductor integrated circuit devices according to the first to thirty-sixth embodiments and forty-first to sixty-second embodiments is shown.

In the present embodiment, the semiconductor integrated circuit device 170 used as the memory which holds the line code program is provided. However, it is also possible to connect the conventional MROM, SRAM, flash memory in addition to the memory of the semiconductor integrated circuit device 170.

Thirty-eighth Embodiment

Figure 41:
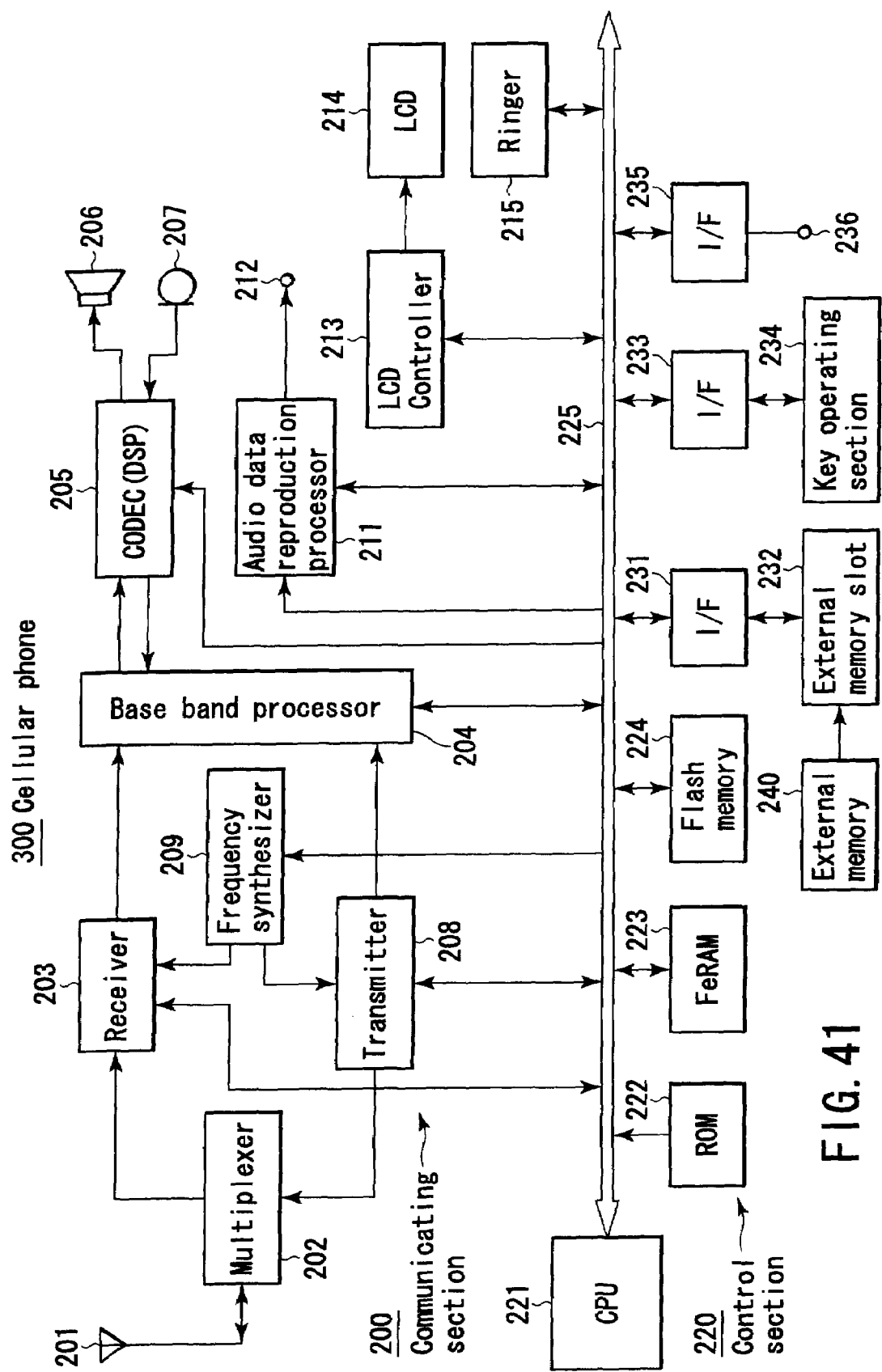
FIG. 41 is a block diagram showing a portable telephone terminal according to a thirty-eighth embodiment of the present invention.

A thirty-eighth embodiment relates to an application of the semiconductor integrated circuit devices according to the first to thirty-sixth embodiments and forty-first to sixty-second embodiments. FIG. 41 shows a portable telephone terminal 300 according to the thirty-eighth embodiment of the present invention. As shown in FIG. 41, a communication section 200 which performs a communication function includes a transmission/reception antenna 201, antenna multiplexer 202, receiver 203, base band processor 204, DSP 205 used as a voice codec, speaker (receiver) 206, microphone (transmitter) 207, transmitter 208 and frequency synthesizer 209.

Further, the portable telephone terminal 300 includes a control section 220 which controls various sections of the portable telephone terminal. The control section 220 is a microcomputer configured by connecting a CPU (Central Processing Unit) 221, ROM 222, a semiconductor integrated circuit device (FeRAM) 223 according to one of the first to thirty-sixth embodiments and forty-first to sixty-second embodiments and flash memory 224 to one another via a CPU bus 225. In the ROM 222, a program executed by the CPU 221 and necessary data associated with fonts for display are stored in advance.

The FeRAM 223 is mainly used as a working area and used to store data which is held immediately before turn-OFF of the power supply. For example, it is used to store data obtained in the course of calculation while the program is being executed by the CPU 221 as required or temporarily store data transferred between the control section 220 and the respective sections during the turn-OFF time of the power supply. Further, the flash memory 224 is used for data storage such as program loading at the turn-ON time of the power supply since the write operation speed thereof is low. The capacity thereof is large and it is used to store a large capacity of data.

Further, the portable telephone terminal 300 includes a voice data reproduction processor 211, external output terminal 212, LCD (Liquid Crystal Display) controller 213, display LCD 214 and a ringer 215 which generates a ring. The voice data reproduction processor 211 reproduces voice data input to the portable telephone terminal 300 (or voice data stored in a external memory 240 which will be described later). The reproduced voice data is transmitted to a headphone, portable speaker or the like via the external output terminal 212 and output to the exterior. The LCD controller 213 receives display information from the CPU 221, for example, via the CPU bus 225 and converts the received information into LCD control information used to control the LCD 214. The LCD 214 is driven based on the control information to display information.

Further, the portable telephone terminal 300 includes interface circuits (I/F) 231, 233, 235, external memory 240, external memory slot 232, key operating section 234 and external input/output terminal 236. The external memory 240 such as a memory card is inserted into the external memory slot 232. The external memory slot 232 is connected to the CPU bus 225 via the interface circuit 231. Thus, by providing the slot 232 in the portable telephone terminal 300, it is possible to write information of the internal portion of the portable telephone terminal 300 into the external memory 240 or input information (for example, voice data) stored in the external memory 240 to the portable telephone terminal 300. The key operating section 234 is connected to the CPU bus 225 via the interface circuit 233. Key input information input from the key operating section 234 is transmitted to the CPU 221, for example. The external input/output terminal 236 is connected to the CPU bus 225 via the interface circuit 233 and functions as a terminal which permits various information items to be input from the exterior to the portable telephone terminal 300 or permits information to be output from the portable telephone terminal 300 to the exterior.

In this embodiment, the ROM 222, FeRAM 223 and flash memory 224 are used, but both or one of the flash memory 224 and ROM 222 can be replaced by an FeRAM.

Thirty-ninth Embodiment

A thirty-ninth embodiment relates to an application example of the semiconductor integrated circuit devices according to the first to thirty-sixth embodiments and forty-first to sixty-second embodiments. Further, it relates to an application of the semiconductor integrated circuit devices according to the first to thirty-sixth embodiments and forty-first to sixty-second embodiments to a memory card which receives media contents such as smart media.

Figure 42:
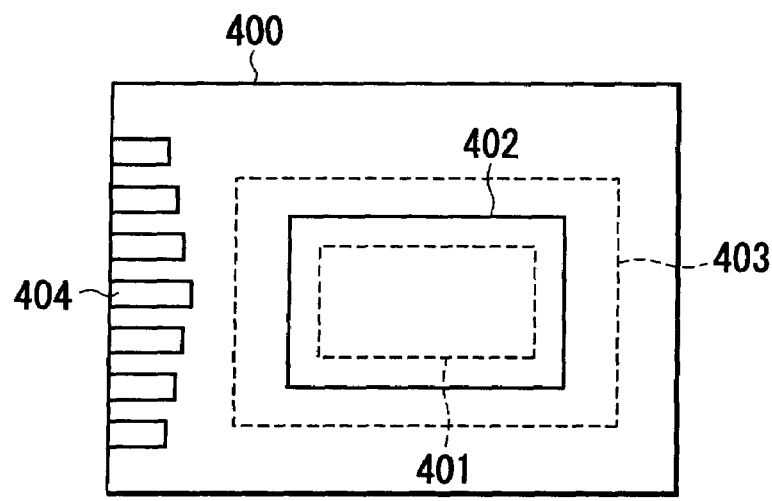
FIG. 42 is a view showing a memory card according to a thirty-ninth embodiment of the present invention.

FIG. 42 shows a memory card according to the thirty-ninth embodiment of the present invention. As shown in FIG. 42, an FeRAM chip 401 is contained in a memory card 400. The FeRAM chip 401 contains at least one or some of the semiconductor integrated circuit devices according to the first to thirty-sixth embodiments and forty-first to sixty-second embodiments.

Fortieth Embodiment

Figure 43:
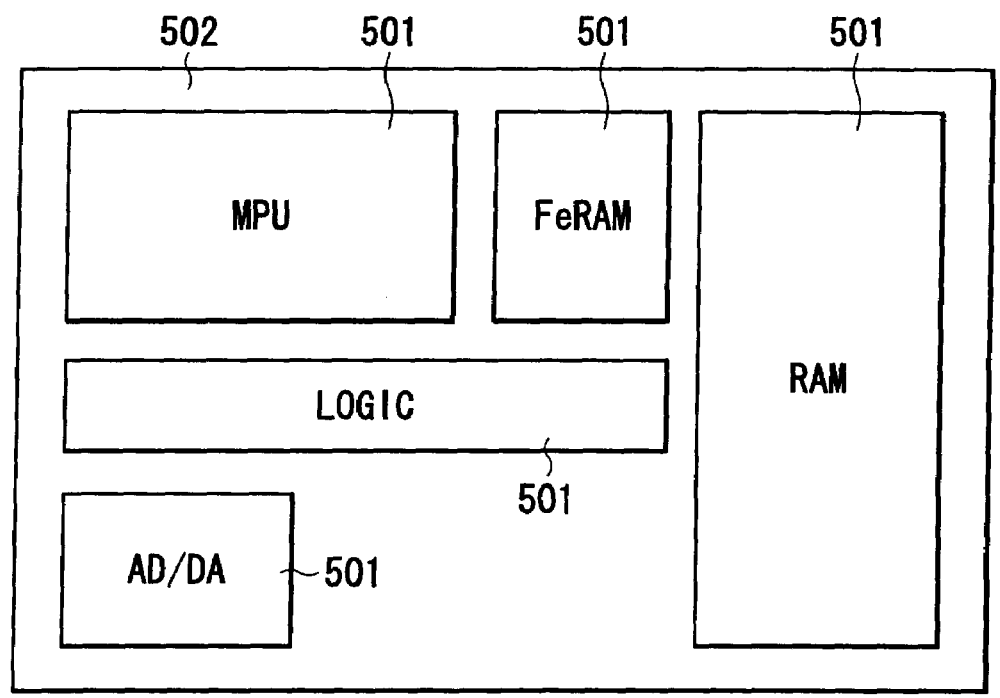
FIG. 43 is a view showing a system LSI according to a fortieth embodiment of the present invention.

A fortieth embodiment relates to an application example of the semiconductor integrated circuit devices according to the first to thirty-sixth embodiments and forty-first to sixty-second embodiments. Further, it relates to an application of the semiconductor integrated circuit devices according to the first to thirty-sixth embodiments and forty-first to sixty-second embodiments to a system LSI. A so-called system LSI (Large Scale Integrated Circuit) is known in which a memory, logic circuit and the like are integrated in one system chip to form one system. As shown in FIG. 43 as an example, a plurality of function blocks 501 (core, macro, IP (Intellectual property)) such as a RAM circuit RAM and logic circuit LOGIC are provided on a semiconductor chip (semiconductor substrate) 502. The macros 501 are combined to configure a desired system as a whole. For example, the RAM circuit RAM includes an SRAM, DRAM or the like.

Forty-first Embodiment

Figure 53:
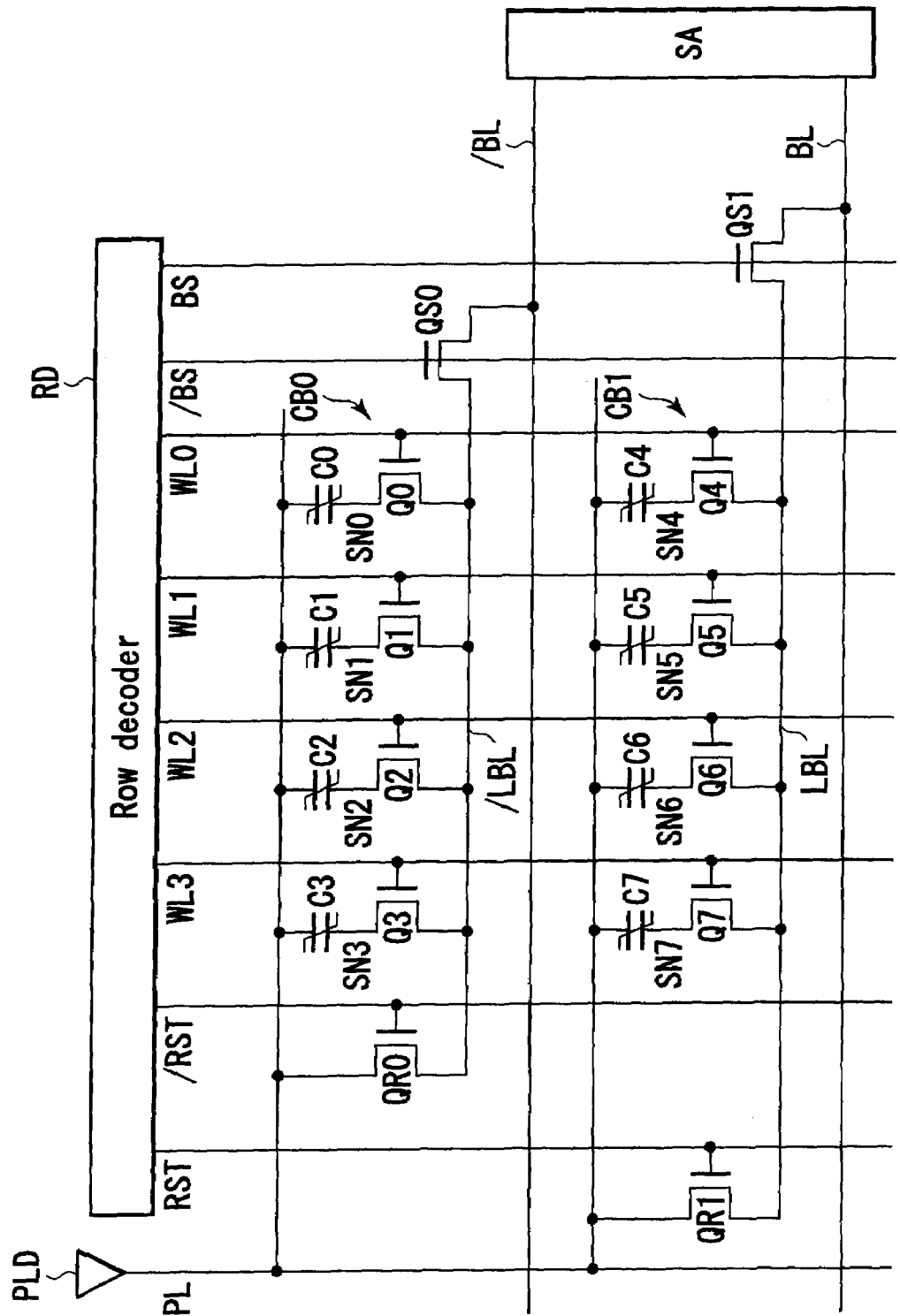
FIG. 53 is a diagram showing the circuit configuration of a semiconductor integrated circuit device according to a forty-first embodiment of the present invention.

A forty-first embodiment relates to a folded bit line configuration in which one plate line PL is commonly used. FIG. 53 shows the circuit configuration of a semiconductor integrated circuit device according to the forty-first embodiment (FIG. 53). As shown in FIG. 53, the circuit configuration of the forty-first embodiment is similar to that of the sixth embodiment shown in FIG. 7 except the following respects. That is, in FIG. 7, the plate lines /PL, PL are respectively provided for the two bit lines /BL, BL. On the other hand, in FIG. 53, one plate line PL is connected to local bit lines /LBL, LBL via reset transistors QR0, QR1. The gates of the reset transistors QR0, QR1 are supplied with reset signals /RST, RST.

The operation is the same as the sixth embodiment. That is, at the standby time, the reset transistors QR0, QR1 are set in the ON state. In a case where information is read out from a memory cell in a cell block CB0 at the active time, the reset transistor QR0 is turned OFF and a cell transistor of a non-selected cell is turned OFF. Then, a block selection transistor QS0 is turned ON and the plate line PL is driven. At this time, the reset transistor QR1 stays ON and a block selection transistor QS1 stays OFF. In a case where information is read out from a memory cell in a cell block CB1, the same operation is performed except that the block selection transistor QS1 is turned ON and the block selection transistor QS0 stays OFF.

According to the semiconductor integrated circuit device of the forty-first embodiment, the same effect as the sixth embodiment can be attained. Further, according to the forty-first embodiment, the plate line PL is commonly used by the two cell blocks CB0, CB1. Therefore, the limitation on the pitch between the plate lines can be alleviated in comparison with a case wherein two plate lines PL are provided for the two cell blocks. Further, since the number of plate lines can be further reduced in comparison with a case of the sixth embodiment in the folded bit line configuration, the area of a plate line driving circuit PLD can be further reduced and the driving ability can be enhanced.

Forty-second Embodiment

A forty-second embodiment relates to one example of the driving method of the plate line PL of the semiconductor integrated circuit device of the forty-first embodiment. More specifically, like the second embodiment, the potential of the plate line PL at the standby time is set to potential Vss and the potential thereof at the drive time is set to internal power supply potential Vaa.

Figure 54:
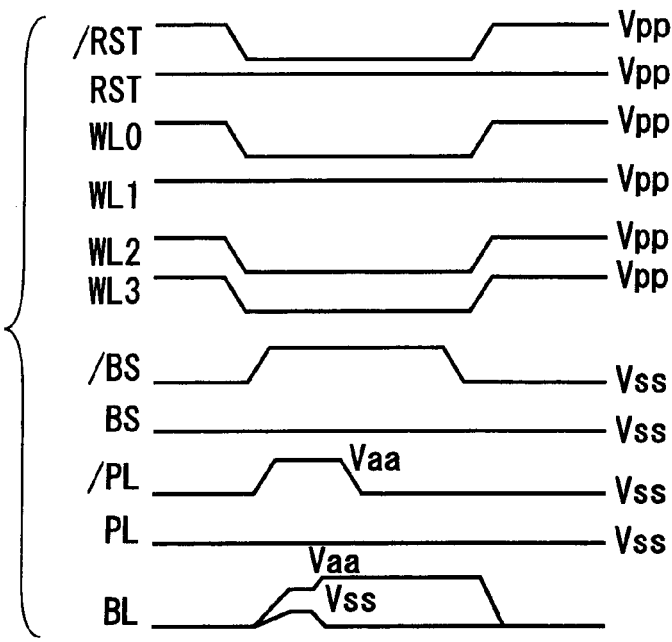
FIG. 54 is a diagram showing the operation of the semiconductor integrated circuit device of FIG. 53, for illustrating a forty-second embodiment of the present invention.

FIG. 54 shows the operation of the semiconductor integrated circuit device of FIG. 53, for illustrating the forty-second embodiment of the present invention. The operation is explained below by taking a case wherein information is read out from a ferroelectric capacitor C1 as an example.

As shown in FIG. 54, at the standby time, reset signals RST, /RST and potentials of word lines WL0 to WL3 are set at the high level and block selection signals BS, /BS are set at a low level. The plate line PL is set at potential Vss.

At the active time, the reset signal /RST is set to the low level and the potentials of the word lines WL0, WL2, WL3 of non-selected cells are set to the low level. The potential of the word line WL1 of a selected cell stays at the high level. Then, the block selection signal /BS is set to the high level to turn ON the block selection transistor QS0. During this time, the reset signal RST stays at the high level and the block selection signal BS stays at the low level.

In this state, the plate line PL is driven and set to internal power supply potential Vaa so as to permit information to be read out from the ferroelectric capacitor C1 to the bit line /BL. The potential of the bit line /BL is amplified by a sense amplifier by using the potential of the bit line BL as reference potential. The same operation is performed when information is read out from a memory cell in the cell block CB1.

The reset signal RST stays at the high level and the block selection signal BS stays at the low level while information is being read out from the ferroelectric capacitors C0 to C3 in the cell block CB0. Therefore, even if the plate line PL is driven, the local bit line LBL and plate line PL are short-circuited to each other and the cell block CB1 is electrically isolated from the bit line BL. As a result, no voltage is applied to the ferroelectric capacitors C4 to C7 in the cell block CB1.

According to the semiconductor integrated circuit device of the forty-second embodiment, the same effect as a combination of the effects of the second and forty-first embodiments can be attained.

The forty-second embodiment relates to a combination of the circuit configuration of the forty-first embodiment and the plate line driving method which is the same as the second embodiment. It is also possible to apply the plate line driving method according to the eighth to tenth embodiments to the forty-first embodiment. In this case, the effect obtained by combining the effect of the forty-first embodiment and the effects of the eighth to tenth embodiments can be attained.

Forty-third Embodiment

A forty-third embodiment relates to the configuration in which the connection relation between the ferroelectric capacitors and the cell transistors is reversed in the memory cells of the first embodiment (FIG. 1).

Figure 55:
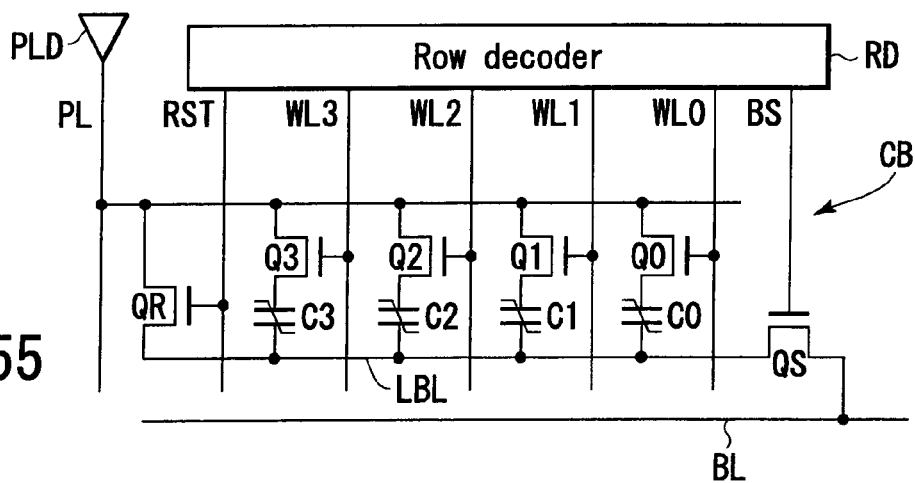
FIG. 55 is a diagram showing the circuit configuration of a semiconductor integrated circuit device according to a forty-third embodiment of the present invention.

FIG. 55 shows the circuit configuration of a semiconductor integrated circuit device according to the forty-third embodiment of the present invention. As shown in FIG. 55, the circuit configuration of the forty-third embodiment is the same as FIG. 1 except that the connection relation between the ferroelectric capacitors C0 to C3 and cell transistors Q0 to Q3 is reversed. That is, in the memory cells, each one end of the cell transistors Q0 to Q3 is respectively connected to the ferroelectric capacitors C0 to C3 and the other ends thereof are connected to a plate line PL. Further, the other ends of the ferroelectric capacitors C0 to C3 are connected to a local bit line LBL. The operation is completely the same as the first embodiment.

According to the semiconductor integrated circuit device of the forty-third embodiment, the same effect as the first embodiment can be attained. The configuration of the memory cell of the forty-third embodiment can be applied to each of the memory cells with the circuit configurations of the sixth, eleventh, twenty-fourth, twenty-sixth, thirty-first, thirty-third and thirty-eighth embodiments.

Forty-fourth Embodiment

A forty-fourth embodiment relates to one example of the driving method of the plate line PL of the semiconductor integrated circuit device of the forty-third embodiment (FIG. 55). More specifically, like the second embodiment, the potential of the plate line PL at the standby time is set to potential Vss and the potential thereof at the drive time is set to internal power supply potential Vaa.

Figure 56:
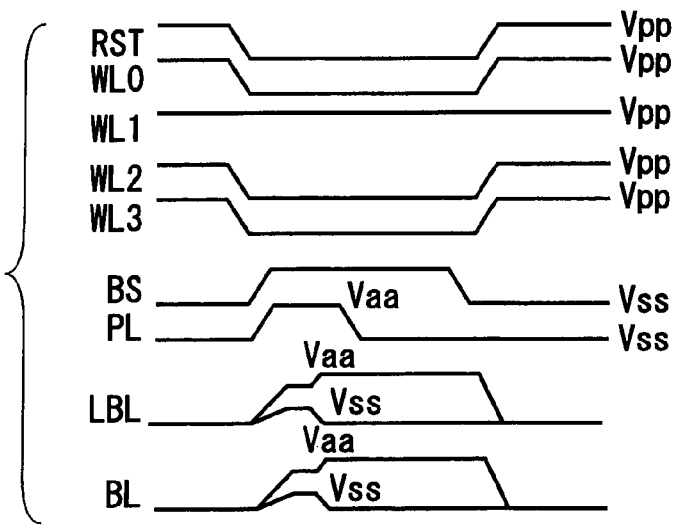
FIG. 56 is a diagram showing the operation of the semiconductor integrated circuit device of FIG. 55, for illustrating a forty-fourth embodiment of the present invention.

FIG. 56 shows the operation of the semiconductor integrated circuit device of FIG. 55 which shows the forty-fourth embodiment of the present invention. As shown in FIG. 56, the potentials of respective signal lines fluctuate in the same manner as in the second embodiment.

According to the forty-fourth embodiment, the same effect as a combination of the effects of the second and forty-third embodiments can be attained.

Further, the forty-fourth embodiment relates to a combination of the circuit configuration of the forty-fourth embodiment and the plate line driving method which is the same as the second embodiment. It is also possible to apply the plate line driving method according to the second to fourth embodiments to the forty-third embodiment. In this case, the same effect as a combination of the effect of the second to fourth embodiments and the effect of the forty-third embodiment (including the sixth, eleventh, twenty-fourth, twenty-sixth, thirty-first, thirty-third and thirty-eighth embodiments) can be attained.

Forty-fifth Embodiment

A forty-fifth embodiment has a configuration in which a plurality of cell blocks having the same configuration as that of the first embodiment (FIG. 1) are connected in series. That is, firstly, the series-connected ferroelectric capacitor and cell transistor constitute one memory cell, and the memory cells are connected in parallel, in the same manner as in the first embodiment. Secondly, these memory cells are connected in parallel with the reset transistor to constitute one memory cell unit. Thirdly, the memory cell units are connected in series, and the end of the end memory cell unit is connected to a memory cell group selection transistor to constitute one memory cell group (cell group).

Figure 57:
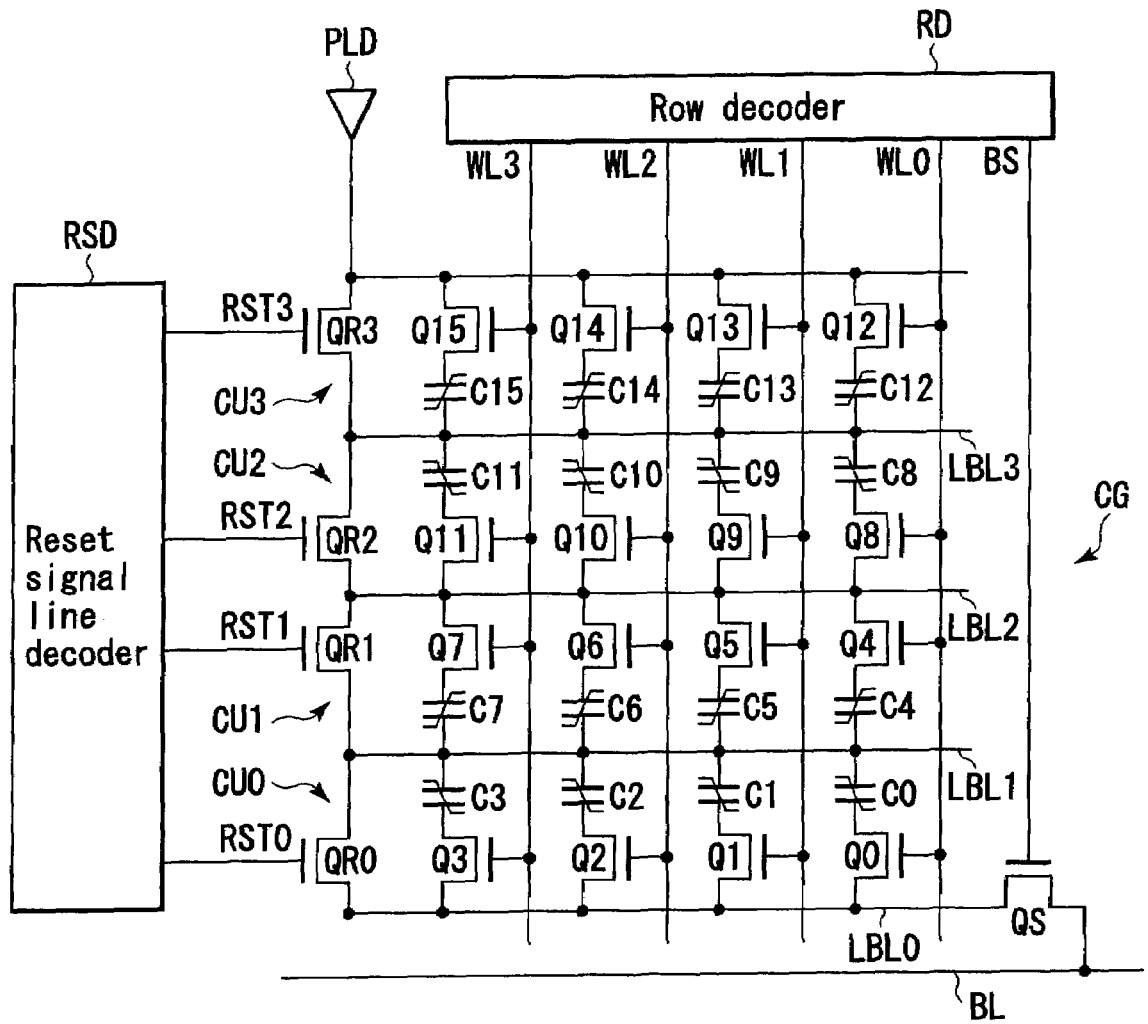
FIG. 57 is a diagram showing the circuit configuration of the semiconductor integrated circuit device according to a forty-fifth embodiment of the present invention.

FIG. 57 shows the circuit configuration of the semiconductor integrated circuit device according to the forty-fifth embodiment of the present invention. As shown in FIG. 57, a cell unit CU0 has a configuration similar to that of the cell block CB0 of the first embodiment. That is, a plurality of memory cells each constituted of series-connected cell transistors Q0 to Q3 and ferroelectric capacitors C0 to C3, and reset transistor QR0 are connected in parallel. One end of each memory cell, that is, each end of the cell transistors Q0 to Q3 opposite to the connection node to the ferroelectric capacitors C0 to C3 is connected to a local bit line LBL0. The other end of each memory cell, that is, the end of the ferroelectric capacitors C0 to C3 opposite to the connection node to the cell transistors Q0 to Q3 is connected to a local bit line LBL1.

A cell unit CU1 is disposed between the local bit line LBL1 and a local bit line LBL2. The cell unit CU1 has a configuration in which a plurality of memory cells and reset transistor QR1 are connected in parallel in the same manner as in the cell unit CU0. The memory cell is constituted of series-connected cell transistors Q4 to Q7 and ferroelectric capacitors C4 to C7. The memory cell of the cell unit CU1 is reverse to that of the cell unit CU0 in the connections of the cell transistors Q4 to Q7 and the ferroelectric capacitors C4 to C7. Therefore, the ends of the ferroelectric capacitors C4 to C7 opposite to the connection nodes to the cell transistors Q4 to Q7 are connected to the local bit line LBL1. The ends of the cell transistors Q4 to Q7 opposite to the connection nodes to the ferroelectric capacitors C4 to C7 are connected to a local bit line LBL2.

A cell unit CU2 is disposed between the local bit line LBL2 and a local bit line LBL3. The cell unit CU2 has a configuration similar to that of the cell unit CU0. That is, cell transistors Q8 to Q11 correspond to the cell transistors Q0 to Q3, ferroelectric capacitors C8 to C11 correspond to the ferroelectric capacitors C0 to C3, and a reset transistor QR2 corresponds to the reset transistor QR0.

A cell unit CU3 is disposed between the local bit line LBL3 and a plate line PL. The cell unit CU3 has a configuration similar to that of the cell unit CU1. That is, cell transistors Q12 to Q15 correspond to the cell transistors Q4 to Q7, ferroelectric capacitors C12 to C15 correspond to the ferroelectric capacitors C4 to C7, and a reset transistor QR3 corresponds to the reset transistor QR0.

The gates of the cell transistors Q0, Q4, Q8, Q12 are connected to a word line WL0. The gates of the cell transistors Q1, Q5, Q9, Q13 are connected to a word line WL1. The gates of the cell transistors Q2, Q6, Q10, Q14 are connected to a word line WL2. The gates of the cell transistors Q3, Q7, Q11, Q15 are connected to a word line WL3. The reset transistors QR0 to QR3 are respectively controlled by reset signals RST0 to RST3. Reset signal lines RST0 to RST3 are connected to a reset signal line decoder RSD.

The cell units CU0 to CU3 constitute a cell group. The cell group is connected to a bit line BL via a cell group selection transistor QS. That is, one end of the cell group selection transistor QS is connected to the local bit line LBL0, the other end is connected to the bit line BL, and a cell group selection signal BS is supplied to the gate.

Figure 58:
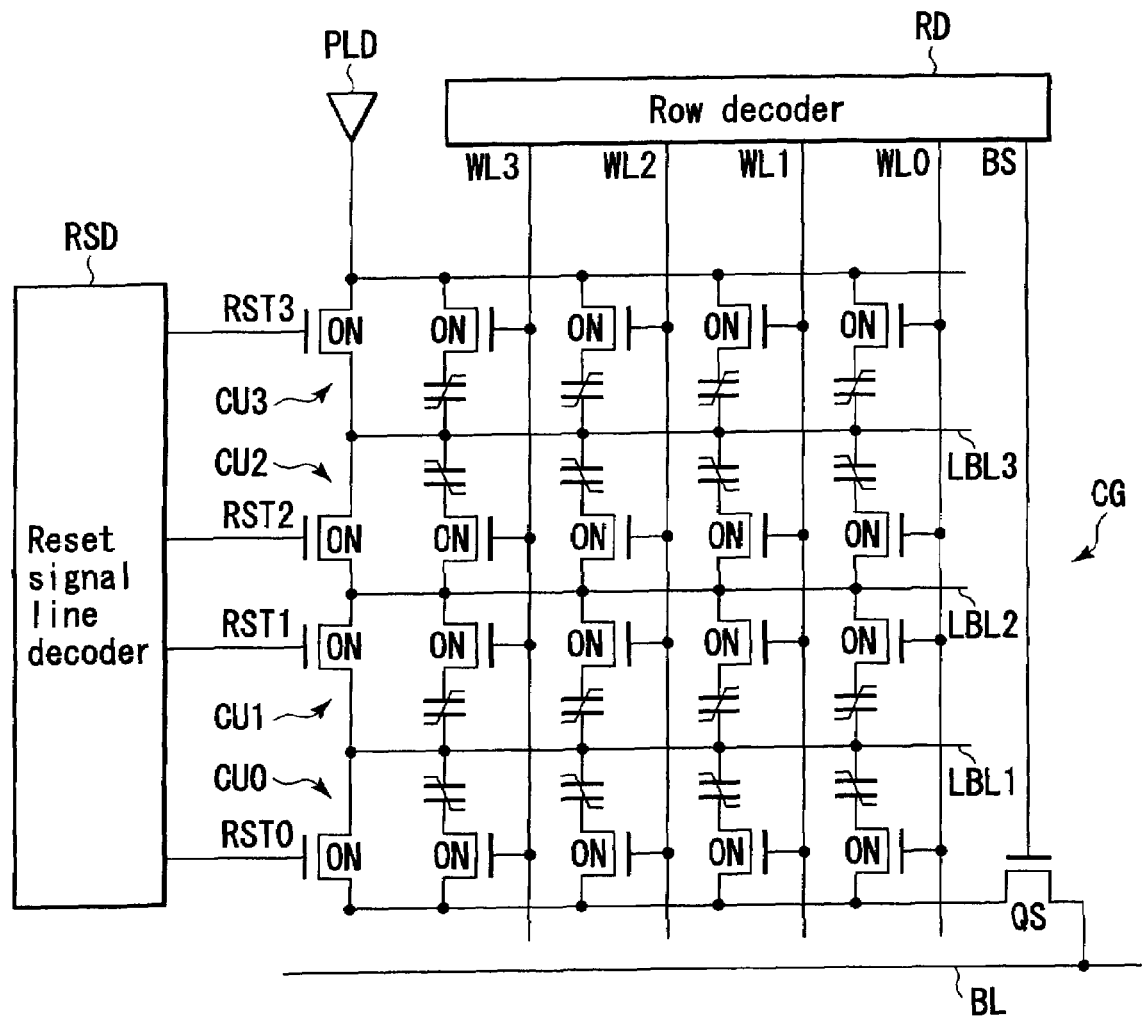
FIG. 58 is a diagram showing the operation of the semiconductor integrated circuit device of FIG. 57.

Next, the operation of the semiconductor integrated circuit device of FIG. 57 will be described in accordance with an example in which information is read out from the ferroelectric capacitor C6 with reference to FIGS. 58, 59. FIG. 58 shows the state of the semiconductor integrated circuit device of FIG. 57 at the standby time, and FIG. 59 illustrates the state at the active time.

As shown in FIG. 58, all the cell transistors Q0 to Q15 in the cell group are on at the standby time. Therefore, the potentials of the opposite ends of all the ferroelectric capacitors C0 to C15 are equal to the potential of the plate line PL, and any voltage is not applied to the ferroelectric capacitors C0 to C15. The cell group selection transistor QS is off.

Figure 59:
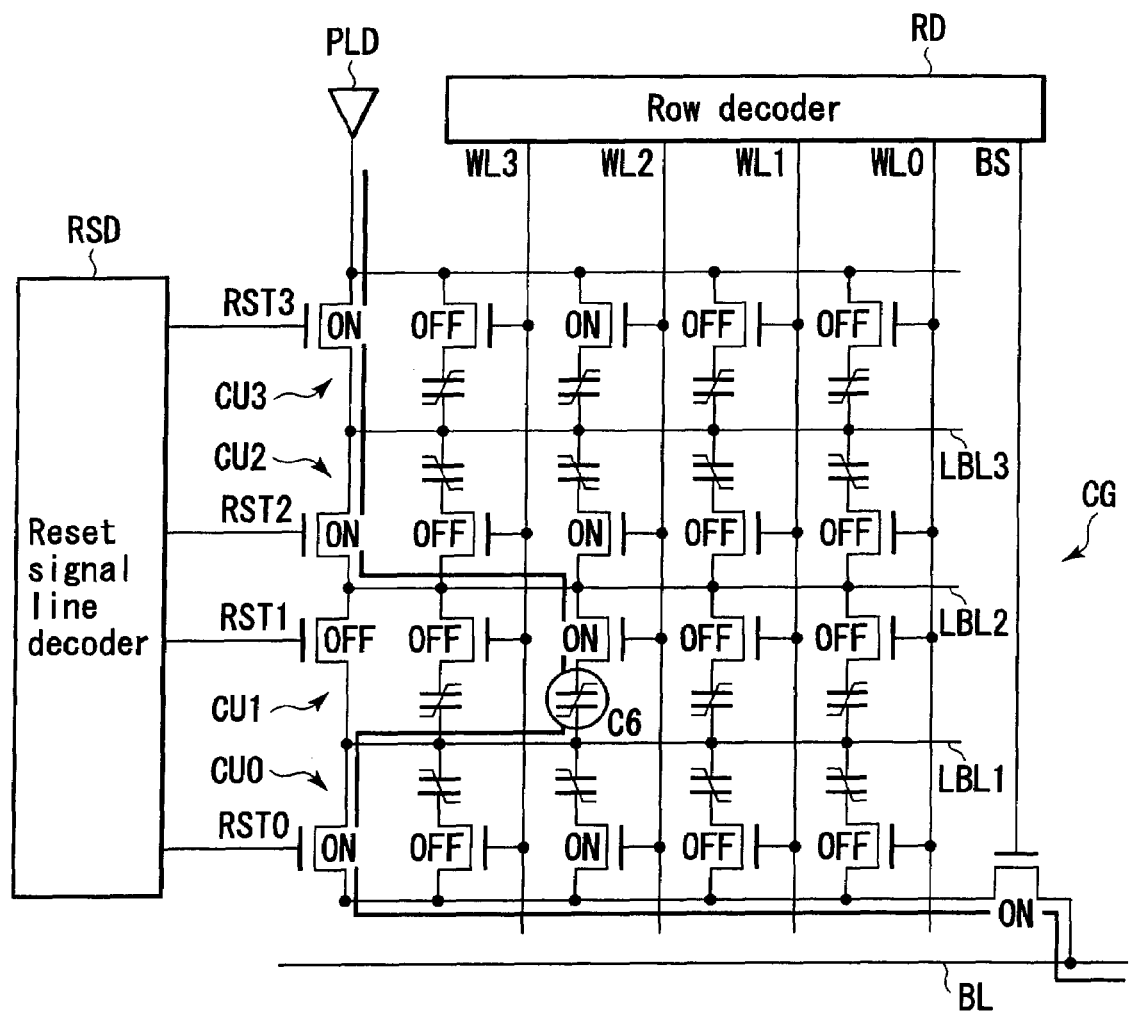
FIG. 59 is a diagram showing the operation of the semiconductor integrated circuit device of FIG. 57.

As shown in FIG. 59, at the active time, the reset transistor QR1 in the cell unit to which the ferroelectric capacitor C6 belongs is turned off, and the cell transistors Q0, Q1, Q3, Q4, Q5, Q7, Q8, Q9, Q11, Q12, Q13, Q15 other than the cell transistors Q2, Q6, Q10, Q14 in the same column as that of the selected cell are turned off. Next, the cell group selection transistor QS is turned on, and the plate line PL is driven.

In the active state, since the reset transistors QR0, QR2, QR3 are kept ON, the potentials are equal between the local bit lines LBL0 and LBL1, between the local bit lines LBL2 and LBL3, and between the local bit line LBL3 and the plate line PL. Therefore, the information of the memory cells in the cell units CU0, CU2, CU3 is protected without being read out.

Moreover, since the reset transistor QR1 is off, the voltage is applied to four memory cells in the cell unit CU1. However, since only the cell transistor Q6 of the selected cell in the cell unit CU1 is on, both the potentials of the plate line PL and bit line BL are applied only to the ferroelectric capacitor C6. That is, the potential of the plate line PL is applied to one end of the ferroelectric capacitor C6 via the cell transistor Q6. The potential of the bit line BL is applied to the other end of the ferroelectric capacitor C6 via the cell group selection transistor QS. As a result, the cell information from the ferroelectric capacitor C6 is read out to the bit line BL via the local bit line LBL0. This readout signal is amplified by a sense amplifier (not shown).

After the readout of the cell information, the data is rewritten into the ferroelectric capacitor C6 with the potential of the plate line PL kept at the high level when the readout information is "0" data. When the information is "1" data, the data is rewritten after the potential of the plate line PL is set to the low level. At this time, the cell transistors Q0, Q1, Q3, Q4, Q5, Q7, Q8, Q9, Q11, Q12, Q13, Q15 are off, the reset transistors QR0, QR2, QR3 are on, and therefore the voltage is not applied to the ferroelectric capacitors other than the ferroelectric capacitor C6 of the selected cell.

After this, the cell group selection transistor QS is turned off and the reset transistor QR1 and cell transistors Q0, Q1, Q3, Q4, Q5, Q7, Q8, Q9, Q11, Q12 Q13, Q15 are turned on to set the standby state.

In the active state, the ferroelectric capacitors other than those of the non-selected cell are set into the electrically floating state. Therefore, when the potential of one end of the ferroelectric capacitor fluctuates, the voltage is slightly applied to the ferroelectric capacitor by the ratio of the parasitic capacitance between the ferroelectric capacitor and the cell transistor. However, capacitance of the ferroelectric capacitor is large, the problem of destruction of the cell information or the like does not occur.

Moreover, the connection node of the ferroelectric capacitor to the cell transistor is set in the floating state in each non-selected cell. Therefore, at the active time, the potential of the connection node of the non-selected cell is lowered by a junction leak, and the disturb voltage is applied to the ferroelectric capacitor of the non-selected cell. However, when returning to the standby state, the potential difference between the opposite ends of each ferroelectric capacitor is reset to 0V, and the problem by the disturb voltage is substantially negligible.

According to the semiconductor integrated circuit device of the forty-fifth embodiment, the memory cells are not one-dimensionally arranged as in the other embodiments, and the memory cells are two-dimensionally arranged and connected. In this configuration, the readout and write are possible with respect to any memory cell, and further the same effect as that of the first embodiment is obtained. That is, the significant reduction of the delay of the signal on the plate line PL, the reduction of the area of the plate line driving circuit PLD, and the enhancement of the driving ability can be realized.

Moreover, according to the forty-fifth embodiment, since each cell group CG is connected to the bit line BL, the number of required bit lines decreases. As a result, the pitch of the bit line is largely eased. Since the pitch of the bit line is eased (the decrease of the number of bit lines), the number of sense amplifiers decreases by the decrease of the bit lines. Therefore, it is possible to reduce the chip size.

Since a cell group CG unit is connected to the bit line BL, the number of contacts of the bit line BL decrease remarkably, and the same effect as that of the first embodiment is obtained. The number of memory cells connected to one bit line is very small as compared with the first embodiment in which each cell block is connected to the bit line BL, and therefore an effect obtained by the decrease of the number of bit line contacts is further great.

Moreover, according to the forty-fifth embodiment, in the same manner as in the first embodiment, the small memory cells of approximately minimum $6F^2$ size can be realized, and the data of the memory cells can be prevented from being destroyed by the disturb voltage.

Furthermore, according to the forty-fifth embodiment, the problem of the delay by the serial connection of a plurality of memory cells can be eased more than the prior-application and conventional memories at the active time, and the same effect as that of the first embodiment is obtained. This effect will be described in accordance with an example of the configuration of the cell group constituted of N×M memory cells including N cells in a bit line direction and M cells in a word line direction. In this case, at the active time, only M−1 reset transistors, one cell transistor, and one cell group selection transistor which are on are connected in series between the plate line PL and the bit line BL. Therefore, different from the memory cells of the memory in the prior application, with the same number of cells of the cell group, the number of series-connected transistors can be reduced drastically as compared with the memory in the prior application.

Fourth-sixth Embodiment

A forty-sixth embodiment relates to one example of the driving method of the plate line PL of the semiconductor integrated circuit device of the forty-fifth embodiment (FIG. 57). More specifically, in the same manner as in the second embodiment, the present embodiment relates to a case where the potential of the plate line PL at the standby time is set to the potential Vss and the potential thereof at the drive time is set to the internal power supply potential Vaa. For the operation, the present embodiment is a combination of the forty-sixth and second embodiments.

Figure 60:
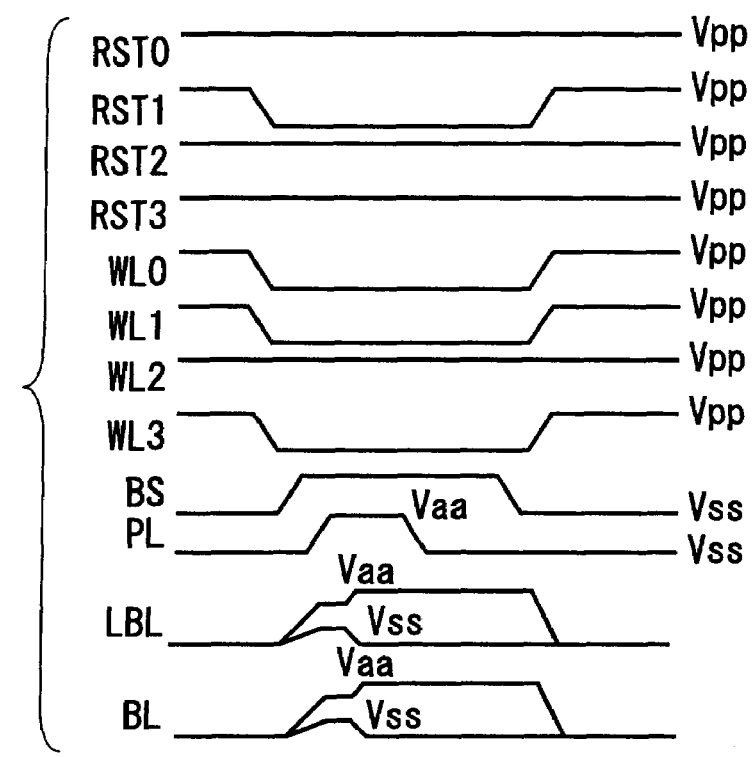
FIG. 60 is a diagram showing the operation of the semiconductor integrated circuit device of FIG. 57, for illustrating a forty-sixth embodiment of the present invention.

FIG. 60 shows the operation of the semiconductor integrated circuit device of FIG. 57, for illustrating the forty-sixth embodiment of the present invention. The operation will now be described in accordance with an example in which the information is read out from the ferroelectric capacitor C6.

As shown in FIG. 60, at the standby time, reset signals RST0 to RST3 and word lines WL0 to WL3 are set at the high level and a cell group selection signal BS is set at the low level. The plate line PL is set at the potential Vss. Therefore, in all the memory cell units CU0 to CU3, all the cell transistors Q0 to Q15 and all the reset transistors QR0 to QR3 are on. On the other hand, the cell group selection transistor QS is off. Therefore, the potential of the opposite ends of the ferroelectric capacitor C0 to C15 of all the memory cells is set equal to that of the plate line PL. Thus, at the standby time, the voltage is not applied to the ferroelectric capacitors C0 to C15 regardless of the potential of the plate line PL, and the polarization information is stably held.

At the active time, the word lines WL0, WL1, WL3 of the non-selected cells are set to the low level, and the reset signal RST1 is set to the low level. The word line WL2 of the selected cell, and the reset signals RST0, RST2, RST3 maintain the high level. Next, when the cell group selection signal BS is set to the high level, the cell group selection transistor QS is turned on.

In this state, the plate line PL is driven at the internal power supply potential Vaa, and accordingly the cell information is read out to the bit line BL from the ferroelectric capacitor C6. The potential read out to the bit line BL is amplified by the sense amplifier SA, and the rewriting is carried out in the same manner as in the second embodiment. Thereafter, the reset signals RST0, RST2, RST3 are set to the high level, the word lines WL0, WL1, WL3 are set to the high level, and the cell group selection signal BS is set to the low level to shift to the standby state.

According to the semiconductor integrated circuit device of the forty-sixth embodiment, the combined effect of the forty-fifth and second embodiments can be attained.

Forty-seventh Embodiment

A forty-seventh embodiment relates to one example of the driving method of the plate line PL of the semiconductor integrated circuit device of the forty-fifth embodiment (FIG. 57). In further detail, the plate line PL is driven in the same manner as in the fourth embodiment.

Figure 61:
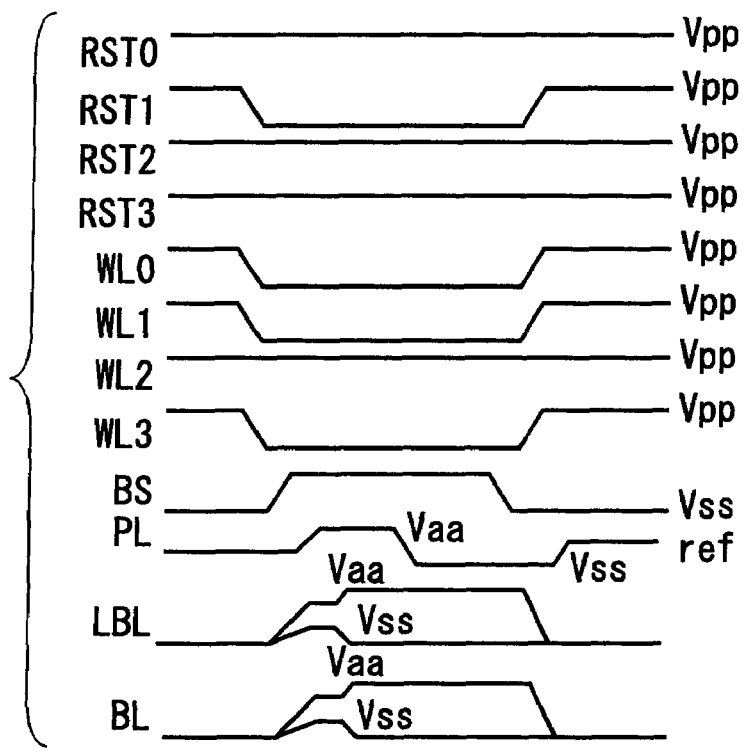
FIG. 61 is a diagram showing the operation of the semiconductor integrated circuit device of FIG. 57, for illustrating a forty-seventh embodiment of the present invention.

FIG. 61 shows the operation of the semiconductor integrated circuit device of FIG. 57 in the forty-seventh embodiment of the present invention. The operation will now be described in accordance with an example in which the information is read out from the ferroelectric capacitor C6.

As shown in FIG. 61, the state at the standby time is similar to that of the forty-sixth embodiment except that the plate line PL is driven at a potential ref. At the active time, the word lines WL0, WL1, WL3 are set to the low level, the reset signal RST1 is set to the low level, and the cell group selection signal BS is set to the high level. When the plate line PL is driven at the internal power supply potential Vaa in this state, the information is read out from the ferroelectric capacitor C6. Subsequently, the potential on the bit line BL is amplified, next the rewriting operation is performed in the same manner as in the fourth embodiment, and next the standby state is set in the same manner as in the forty-sixth embodiment.

According to the semiconductor integrated circuit device of the forty-seventh embodiment, the combined effect of the forty-fifth and fourth embodiments can be attained.

Forty-eighth Embodiment

In a forty-eighth embodiment, different from the forty-fifth embodiment (FIG. 57), the reset signal line and word line extend in the same direction.

Figure 62:
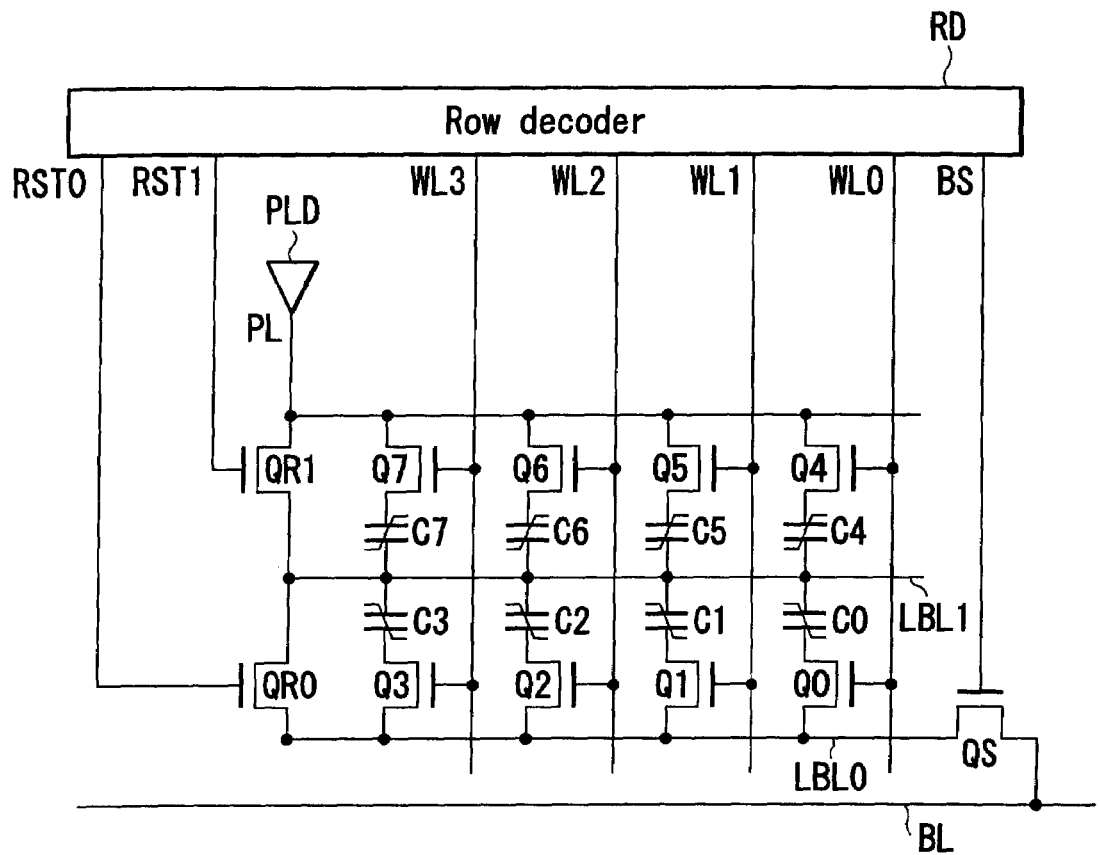
FIG. 62 is a diagram showing the circuit configuration of the semiconductor integrated circuit device according to a forty-eighth embodiment of the present invention.

FIG. 62 shows the circuit configuration of the semiconductor integrated circuit device according to the forty-eighth embodiment of the present invention. The extending directions of the word lines WL0 to WL3 and signal line (reset signal line) for supplying the reset signals RST0, RST1 are symbolic of a positional relation between the lines in an actual semiconductor integrated circuit device. That is, the word lines WL0 to WL3 and the reset signal line actually extend in the same direction on the chip. On the other hand, in FIG. 57, the reset signal line extends in a direction different from that of the word lines WL0 to WL3, and in the same direction as that of the bit line BL and local bit lines LBL0 to LBL3.

As shown in FIG. 62, the forty-eighth embodiment is substantially the same as the forty-fifth embodiment. That is, the cell units CU0, CU1 are connected, and one end of the cell unit CU0 is connected to the bit line BL via the cell group selection transistor QS. The reset signal lines RST0, RST1 extend in the same direction as that of the word lines WL0 to WL3. That is, even on the actual semiconductor integrated circuit device, the reset signals RST0, RST1 and word lines WL0 to WL3 are disposed along the same direction. Therefore, the reset signal line decoder (shown together with the row decoder in the drawing) is disposed on the end of a memory cell array in the direction of the word lines WL0 to WL3. For the operation, the present embodiment is the same as the forty-fifth embodiment.

According to the semiconductor integrated circuit device of the forty-eighth embodiment of the present invention, the same effect as that of the forty-fifth embodiment can be attained.

Forty-ninth Embodiment

A forty-ninth embodiment relates to one example of the driving method of the plate line PL of the semiconductor integrated circuit device of the forty-eighth embodiment (FIG. 62). In more detail, in the same manner as in the second embodiment, the present embodiment relates to the case where the potential of the plate line PL at the standby time is set to the potential Vss, and the potential at the drive time is set to the internal power supply potential Vaa.

Figure 63:
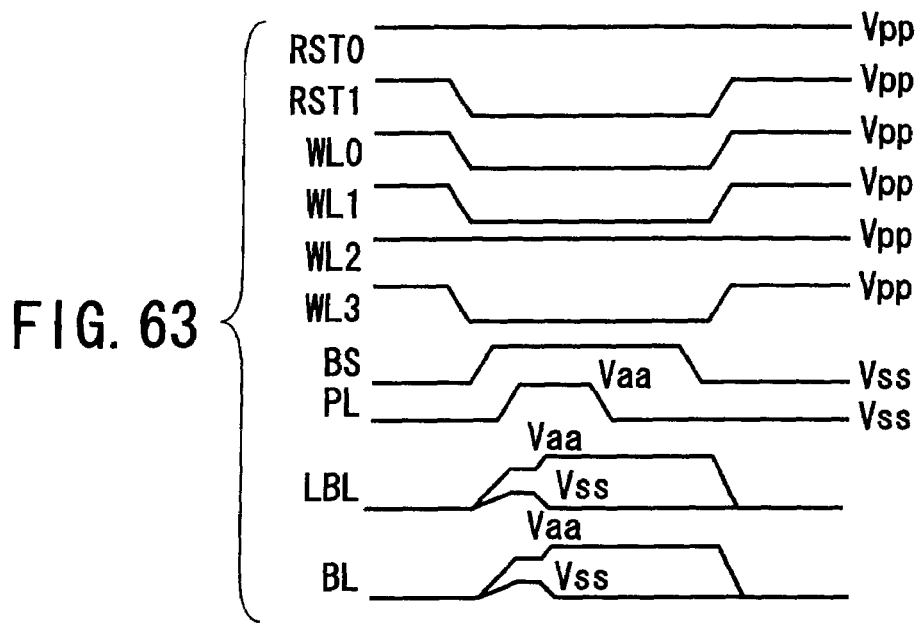
FIG. 63 is a diagram showing the operation of the semiconductor integrated circuit device of FIG. 62, for illustrating a forty-ninth embodiment of the present invention.

FIG. 63 shows the operation of the semiconductor integrated circuit device of FIG. 62, for illustrating the forty-ninth embodiment of the present invention. The operation will now be described in accordance with the case where the information is read out from the ferroelectric capacitor C6.

As shown in FIG. 63, at the standby time, the reset signals RST0, RST1 and word lines WL0 to WL3 are set to the high level, and the cell group selection signal BS is set to the low level. The plate line PL is set to the potential Vss.

At the active time, the word lines WL0, WL1, WL3 of the non-selected cell are set to the low level, and the reset signal RST1 is set to the low level. The word line WL2 of the selected cell, and the reset signal RST0 are kept at the high level. Subsequently, when the cell group selection signal BS is set to the high level, the cell group selection transistor QS is turned on.

When the plate line PL is driven at the internal power supply potential Vaa in this state, the cell information is read out to the bit line BL from the ferroelectric capacitor C6. The sense amplifier SA amplifies the potential read out to the bit line BL, and next the rewriting is performed in the same manner as in the second embodiment. Thereafter, the reset signal RST1 is set to the high level, the word lines WL0, WL1, WL3 are set to the high level, and the cell group selection signal BS is set to the low level to shift to the standby state.

According to the semiconductor integrated circuit device of the forty-ninth embodiment, the combined effect of the forty-eighth and second embodiments can be attained.

Fiftieth Embodiment

Figure 64:
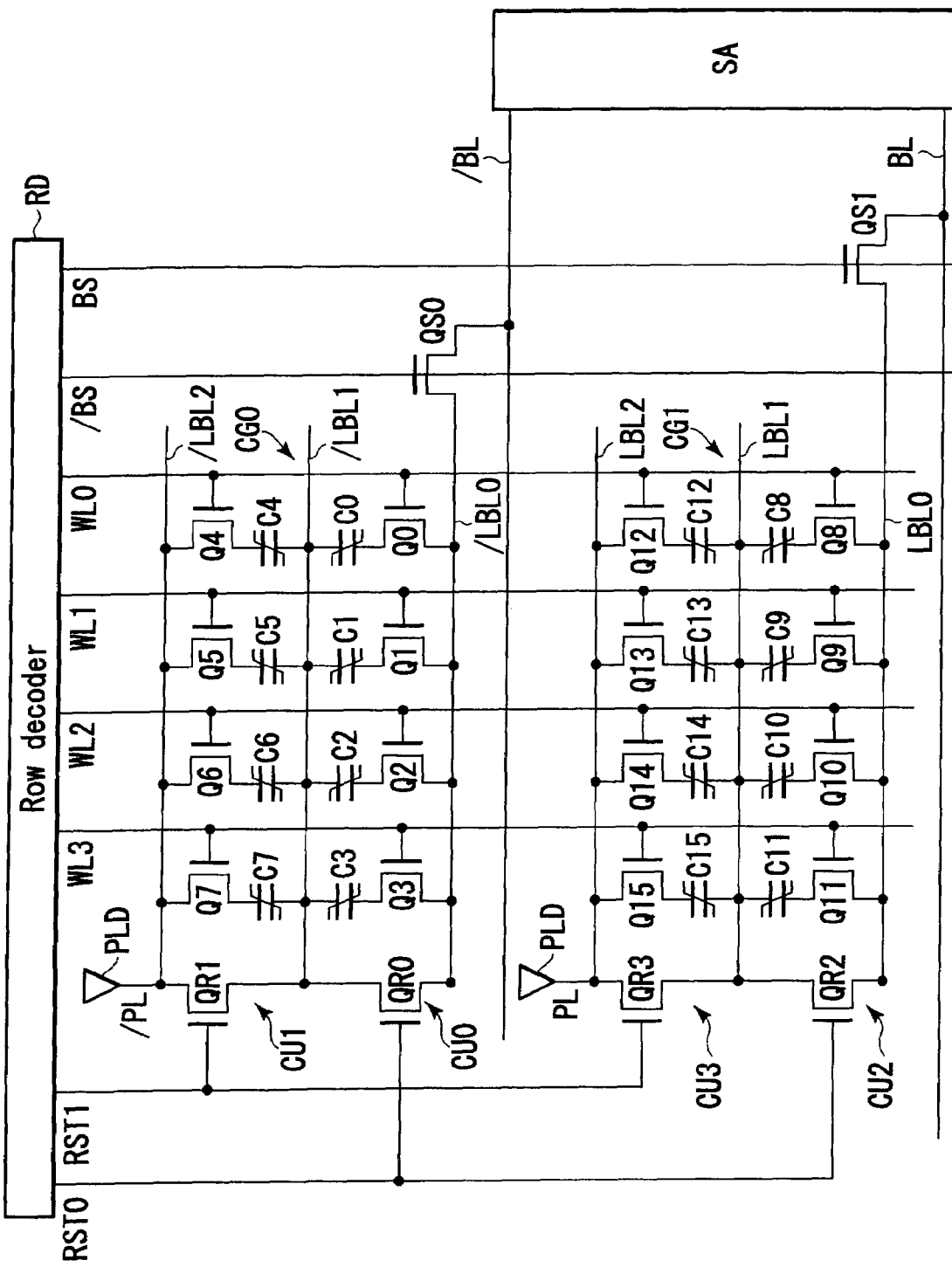
FIG. 64 is a diagram showing the circuit configuration of the semiconductor integrated circuit device according to a fiftieth embodiment of the present invention.

A fiftieth embodiment relates to a folded bit line configuration of the forty-eighth embodiment. FIG. 64 shows the circuit configuration of the semiconductor integrated circuit device according to the fiftieth embodiment of the present invention. As shown in FIG. 64, cell groups CG0, CG1 having the same configuration as that of the cell group having the cell units CU0, CU1 of FIG. 62 are disposed. The cell groups CG0, CG1 are respectively disposed for bit lines /BL, BL.

The cell unit CU0 having the same configuration of the cell unit CU0 of FIG. 62 is connected between local bit lines /LBL0 and /LBL1. The cell unit CU1 having the same configuration of the cell unit CU1 of FIG. 62 is connected between the local bit line /LBL1 and a plate line /PL (local bit line /LBL2). A group selection transistor QS0 is connected between the local bit lines /LBL0 and a bit line /BL.

In the same manner as in the cell unit CU0, the cell unit CU2 constituted of the ferroelectric capacitors C8 to C11, cell transistors Q8 to Q11, and reset transistor QR2 is connected between the local bit lines LBL0 and LBL1. In the cell unit CU2, the ferroelectric capacitors C8 to C11 correspond to the ferroelectric capacitors C0 to C3, the cell transistors Q8 to Q11 correspond to the cell transistors Q0 to Q3, and the reset transistor QR2 corresponds to the reset transistor QR0.

In the same manner as in the cell unit CU1, the cell unit CU3 constituted of the ferroelectric capacitors C12 to C15, cell transistors Q12 to Q15, and reset transistor QR3 is connected between the local bit line LBL1 and the plate line PL (local bit line LBL2). In the cell unit CU3, the ferroelectric capacitors C12 to C15 correspond to the ferroelectric capacitors C4 to C7, the cell transistors Q12 to Q15 correspond to the cell transistors Q4 to Q7 and the reset transistor QR3 corresponds to the reset transistor QR0. A group selection transistor QS1 is connected between the local bit line LBL0 and the bit line BL.

The gates of the cell transistors Q0, Q4, Q8, Q12 are connected to the word line WL0. The gates of the cell transistors Q1, Q5, Q9, Q13 are connected to the word line WL1. The gates of the cell transistors Q2, Q6, Q10, Q14 are connected to the word line WL2. The gates of the cell transistors Q3, Q7, Q11, Q15 are connected to the word line WL3. The reset transistors QR0, QR2 are controlled by the reset signal RST0. The reset transistors QR1, QR3 are controlled by the reset signal RST1. Cell group selection transistors QS0, QS1 are respectively controlled by cell group selection signals /BS, BS.

Next, the operation will be described. The operation in the respective cell groups CG0, CG1 is the same as that of the forty-seventh embodiment (forty-fifth embodiment). At the active time, in the same manner as in the forty-seventh embodiment, the reset transistor QR1, and cell transistors Q0, Q1, Q3, Q4, Q5, Q7 are turned off. Thereafter, for the readout of the memory cells in the cell group CG0, only the cell group selection transistor QS0 is turned on, and the cell group selection transistor QS1 stays OFF. Next, only the plate line /PL is driven, and the plate line PL is not driven. As a result, the cell information is read out to the bit line /BL. The potential on the bit line BL is used as a reference potential. The potential on the bit line /BL is amplified by the sense amplifier SA using the potential on the bit line BL. This flow applies to the readout of the memory cells in the cell group CG1.

According to the semiconductor integrated circuit device of the sixth embodiment, with the folded bit line configuration, the combined effect of the forty-fifth and sixth embodiments can be attained.

Fifty-first Embodiment

A fifty-first embodiment relates to one example of the driving method of the plate lines PL, /PL. In more detail, in the same manner as in the second embodiment, the present embodiment relates to the case where the potentials of the plate lines PL, /PL at the standby time are set to the potential Vss, and the potential at the drive time is set to the internal power supply potential Vaa. Also for the operation, the present embodiment is the same as the combination of the fiftieth and second embodiments.

Figure 65:
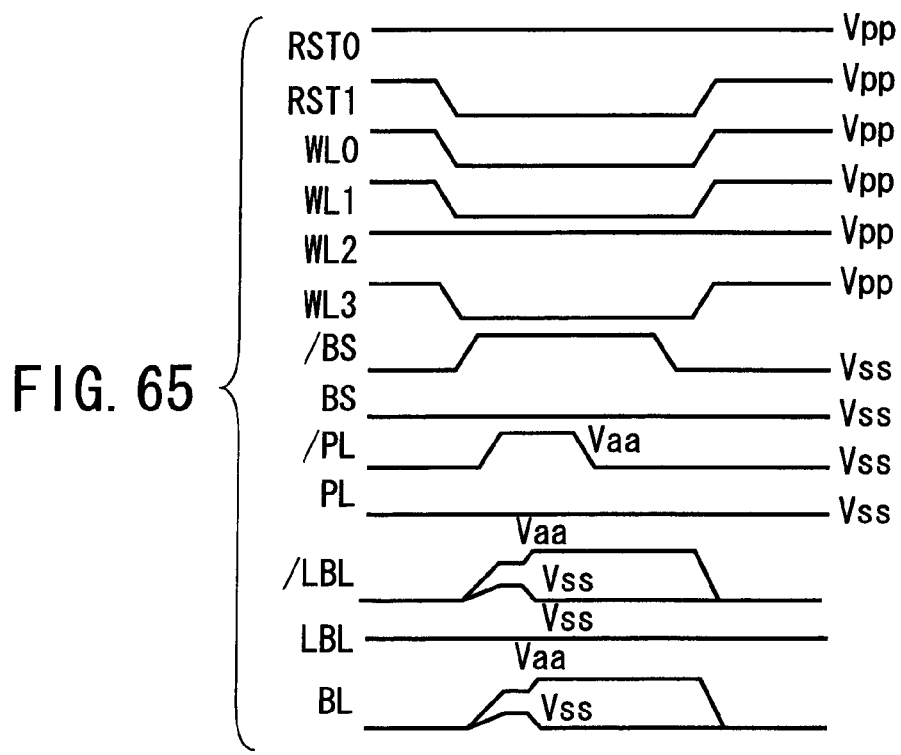
FIG. 65 is a diagram showing the operation of the semiconductor integrated circuit device of FIG. 64, for illustrating a fifty-first embodiment of the present invention.

FIG. 65 shows the operation of the semiconductor integrated circuit device of FIG. 64, for illustrating the fifty-first embodiment of the present invention. The operation will now be described in accordance with the example in which the information is read out of the ferroelectric capacitor C6.

As shown in FIG. 65, at the standby time, the reset signals RST0, RST1 and the word lines WL0 to WL3 are set to the high level, and the cell group selection signals BS, /BS are set to the low level. The plate lines PL, /PL are set to the potential Vss.

At the active time, the reset signal RST1 is set to the low level, and the word lines WL0, WL1, WL3 of the non-selected cells are set to the low level. The word line WL2 of the selected cell is maintained at the high level. Next, when the cell group selection signal /BS is set to the high level, the block selection transistor QS0 is turned on. The cell group selection signal BS is maintained at the low level.

When the plate line /PL is driven at the internal power supply potential Vaa in this state, the cell information is read out to the bit line /BL from the ferroelectric capacitor C6. The plate line PL is maintained at the potential Vss. The potential read out to the bit line /BL is amplified by the sense amplifier SA, and next the rewrite operation is performed in the same manner as in the second embodiment. Thereafter, the reset signal RST1 and the word lines WL0, WL1, WL3 are set to the high level, and the cell group selection signal /BS is set to the low level to shift to the standby state.

According to the semiconductor integrated circuit device of the fifty-first embodiment, the combined effect of the fiftieth and second embodiments can be attained.

Fifty-second Embodiment

A fifty-second embodiment is similar to the forty-fifth embodiment, and is different in that two terminals are replaced with each other in some memory cells.

Figure 66:
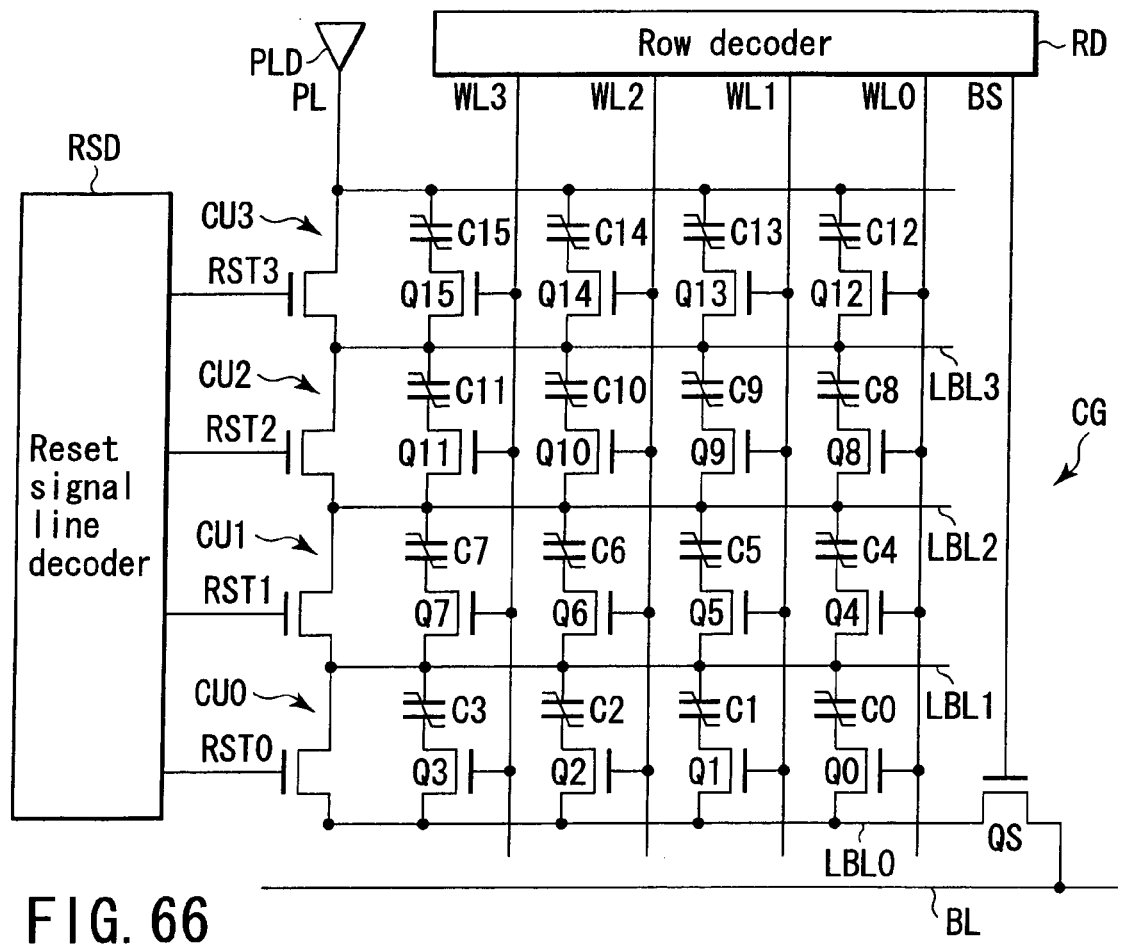
FIG. 66 is a diagram showing the circuit configuration of the semiconductor integrated circuit device according to a fifty-second embodiment of the present invention.

FIG. 66 shows the circuit configuration of the semiconductor integrated circuit device according to the fifty-second embodiment of the present invention. As shown in FIG. 66, as compared with FIG. 57, the connection of the memory cells of the cell units CU1, CU3 is the same as that of the cell unit CU0 (or CU2). That is, in the cell unit CU1, the ends of the cell transistors Q4 to Q7 opposite to the connection nodes to the ferroelectric capacitors C4 to C7 are connected to the local bit line LBL1. The ends of the ferroelectric capacitors C4 to C7 opposite to the connection nodes to the cell transistors Q4 to Q7 are connected to the local bit line LBL2. Similarly, in the cell unit CU3, the ends of the cell transistors Q12 to Q15 opposite to the connection nodes to the ferroelectric capacitors C12 to C15 are connected to the local bit line LBL3. The ends of the ferroelectric capacitors C12 to C15 opposite to the connection nodes to the cell transistors Q12 to Q15 are connected to the plate line PL. The remaining parts are the same as the forty-fifth embodiment.

According to the semiconductor integrated circuit device of the fifty-second embodiment, the same effect as that of the forty-fifth embodiment can be attained.

An illustration is given in which the cell units CU1, CU3 are connected in the same manner as in the cell unit CU0 (or CU2) of the forty-fifth embodiment (FIG. 57). However, it is also possible to invert these. It is not essential to achieve the same connection with respect to two terminals of the memory cell. Furthermore, as derived from the present embodiment and the forty-fifth embodiment, it is possible to optionally connect two terminals of the memory cell in each memory cell. For example, the same connection may also be achieved for each column or row, and the same effect can be attained even from the totally optional connection without imparting any regularity.

Fifty-third Embodiment

Figure 67:
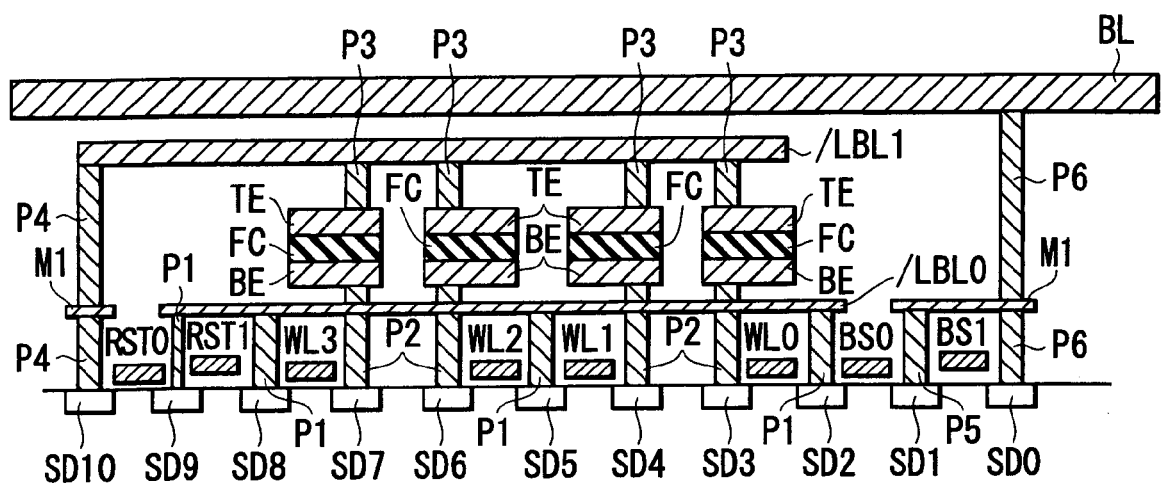
FIG. 67 is a view schematically showing the cross sectional structure of a cell unit which can be applied to the semiconductor integrated circuit device of FIG. 64, for illustrating a fifty-third embodiment of the present invention.
Figure 68:
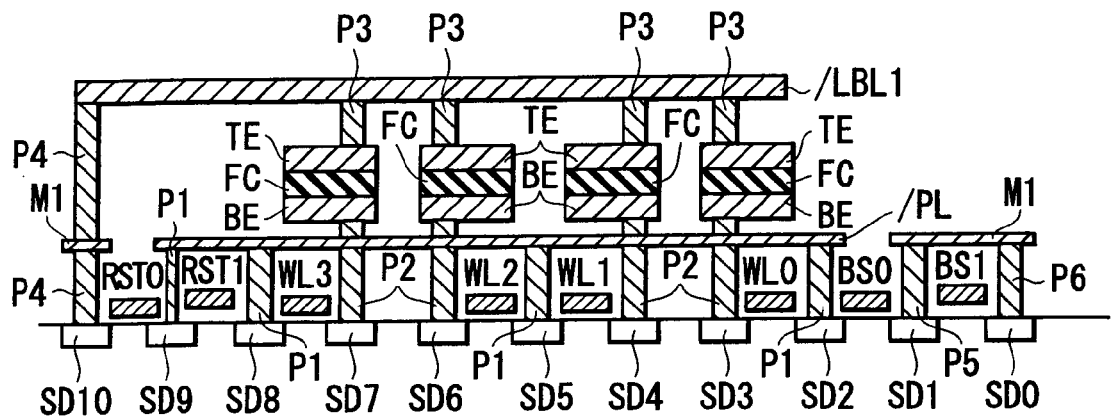
FIG. 68 is a view schematically showing the cross sectional structure of the cell unit which can be applied to the semiconductor integrated circuit device of FIG. 64, for illustrating the fifty-third embodiment of the present invention.
Figure 69:
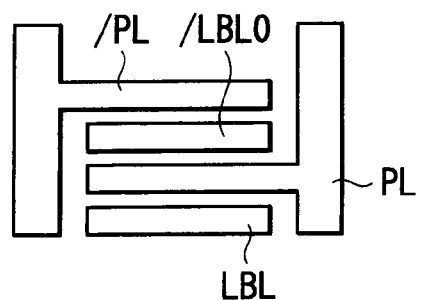
FIG. 69 is a view showing the layout which can be applied to the semiconductor integrated circuit device of FIG. 64, for illustrating the fifty-third embodiment of the present invention.

A fifty-third embodiment relates to the configuration of the semiconductor integrated circuit device of the fiftieth embodiment (FIG. 64). FIGS. 67, 68, 69 show the fifty-third embodiment of the present invention. FIGS. 67, 68 correspond to the cross sectional structures of the cell units CU0, CU1 which can be applied to the semiconductor integrated circuit device of FIG. 64. FIG. 69 schematically shows the plane configuration of a part of FIG. 67 or 68.

The configuration of FIG. 67 is similar to that of FIG. 17, and a different part will be described. The bit line BL is connected to the source/drain region SD0 via the contact P6 and interconnection layer M1. The source/drain region SD0 is formed with a distance from the source/drain region SD1 in the surface of the semiconductor substrate sub. A gate electrode BS1 is formed above the semiconductor substrate sub between the source/drain regions SD0, SD1. The source/drain regions SD0 is connected to SD1 via the contacts P5, P6, and interconnection layer M1. The transistor constituted of the source/drain regions SD1, SD2 and the gate electrode BS0 above the semiconductor substrate sub between the regions corresponds to the cell group selection transistor QS0.

The local bit line /LBL1 is disposed in the position of the plate line PL of FIG. 17. The local bit line /LBL1 is connected to a source/drain region SD10 via a contact P4 and the interconnection layer M1. The source/drain region SD10 is formed with a distance from a source/drain region SD9 in the surface of the semiconductor substrate sub. The transistor constituted of the source/drain regions SD10, SD9 and the gate electrode RST0 above the semiconductor substrate sub between the regions corresponds to the reset transistor QR0. The gate electrode RST0 is disposed above the semiconductor substrate sub between the source/drain regions SD9, SD8. The source/drain region SD9 is connected to SD8 via the contact P1 and local bit line /LBL0.

The configuration of FIG. 68 is similar to that of FIG. 67, and is the same as FIG. 67 except the following different part. That is, the bit line BL does not exist in the cross sectional structure, and the plate line /PL is disposed in the position of the local bit line /LBL0 of FIG. 67. The local bit line /LBL1 in FIG. 67 and the local bit line /LBL1 in FIG. 68 are connected to each other.

The configuration similar to that of FIG. 67 is disposed with respect to the cell unit CU2 of FIG. 64. The configuration similar to that of FIG. 68 is disposed with reference to the cell unit CU3 of FIG. 64. The local bit line /LBL0 (LBL0), and the plate line /PL (PL) of these configurations are disposed as shown in FIG. 69. That is, the respective island-shaped local bit line /LBL0, plate line PL, local bit line /LBL0, and plate line /PL are successively arranged. In actual, more configurations are arranged (not shown). A line extending in the word line direction (vertical direction of the drawing) connect the plate lines PL. This also applies to the plate line /PL.

According to the semiconductor integrated circuit device of the fifty-third embodiment of the present invention, the cell units CU0 to CU3 of the semiconductor integrated circuit device of the fiftieth embodiment can be realized.

Fifty-fourth Embodiment

Figure 70:
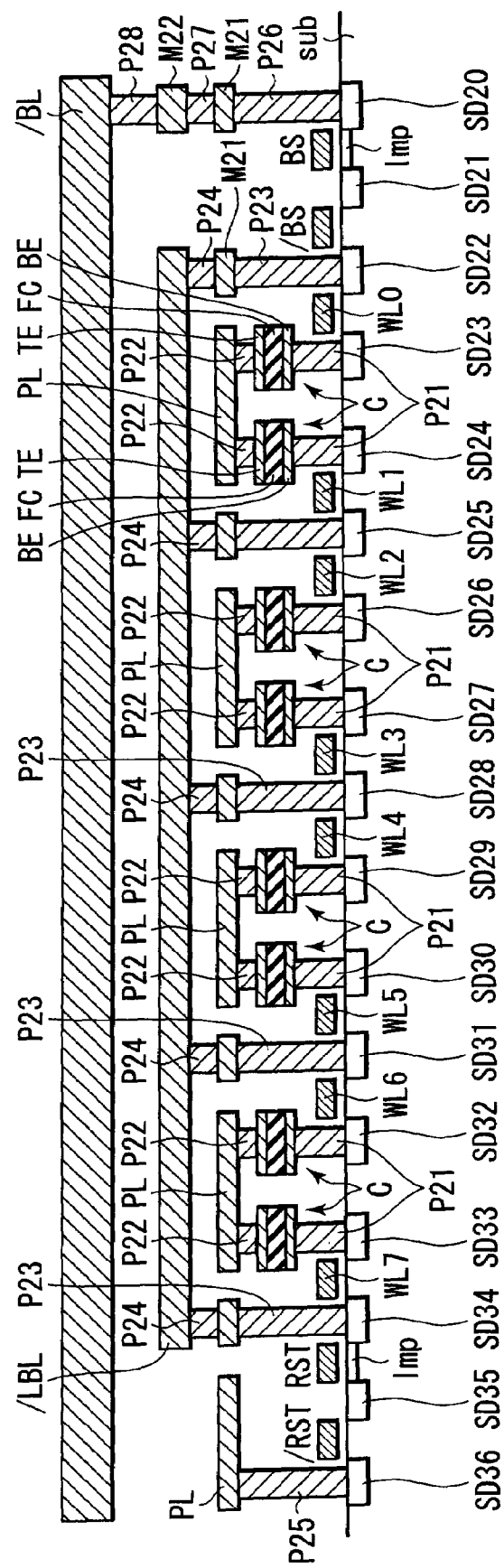
FIG. 70 is a view schematically showing the cross sectional structure of a cell block which can be applied to the semiconductor integrated circuit device of FIG. 53, for illustrating a fifty-fourth embodiment of the present invention.
Figure 71:
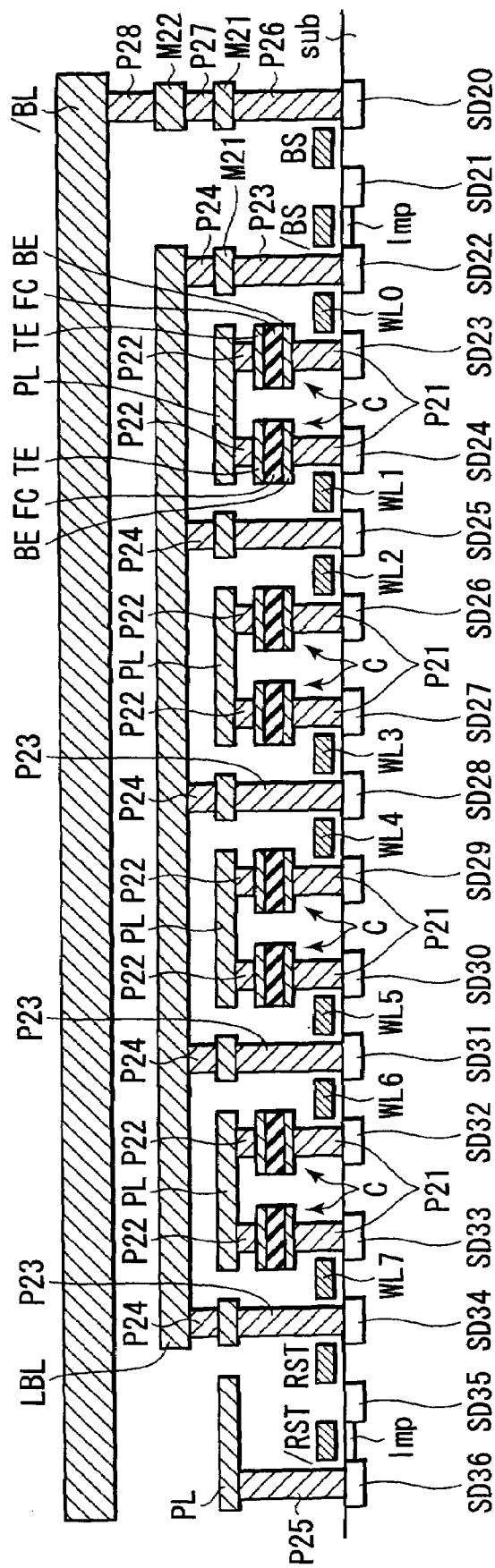
FIG. 71 is a view schematically showing the cross sectional structure of the cell block which can be applied to the semiconductor integrated circuit device of FIG. 53, for illustrating the fifty-fourth embodiment of the present invention.

A fifty-fourth embodiment relates to the configuration of the semiconductor integrated circuit device of the forty-first embodiment (FIG. 53). FIGS. 70, 71 schematically show the cross sectional structure of the cell block which can be applied to the semiconductor integrated circuit device of FIG. 53, for illustrating the fifty-fourth embodiment of the present invention. FIGS. 70, 71 show the configurations corresponding to the cell blocks CB0, CB1 of FIG. 53. FIG. 53 illustrates four memory cells in one cell block, but FIGS. 70, 71 illustrate eight cases. When the number of repetitions of the configuration forming the memory cells of FIGS. 70, 71 is increased/decreased, the desired number of memory cells can be realized.

As shown in FIG. 70, source/drain regions (active regions) SD20 to SD36 are formed with mutual distances in the surface of the semiconductor substrate sub. The gate electrodes (cell group selection signal line) BS, /BS are respectively disposed above the semiconductor substrate sub between the source/drain regions SD20 and SD21 and between the source/drain regions SD21 and SD22. Similarly, the gate electrodes (word lines) WL0, WL1, WL2, WL3 are respectively disposed above the semiconductor substrate sub between the source/drain regions SD22, SD23, between SD24, SD25, between SD25, SD26, and between SD27, SD28. The gate electrodes WL4, WL5, WL6, WL7 are respectively disposed above the semiconductor substrate sub between the source/drain regions SD28, SD29, between SD30, SD31, between SD31, SD32, and between SD33, SD34.

The gate electrodes (reset signal lines) RST, /RST are respectively disposed above the semiconductor substrate between the source/drain regions SD34, SD35 and between SD35, SD36.

An impurity region in which impurities are injected is formed in a channel region between the source/drain regions SD20 and SD21, and the transistor constituted of the source/drain regions SD20, SD21 and gate electrode BS is formed as a depression type. Similarly, the transistor constituted of the source/drain regions SD34, SD35 and gate electrode RST is also of the depression type.

The source/drain regions SD23, SD24 are connected to the lower electrodes BE of the ferroelectric capacitors C disposed above these source/drain regions SD23, SD24 via contacts P21. The upper electrode TE of each ferroelectric capacitor C is connected to the plate line PL disposed above the ferroelectric capacitor C via a contact P22 disposed with respect to each upper electrode. Similarly, the source/drain regions SD26, SD27, SD29, SD30, SD32, SD33 are connected to the lower electrodes BE of the ferroelectric capacitors C via contacts P21. The plate lines PL are disposed in the positions above the source/drain regions SD26, SD27, above the source/drain regions SD29, SD30, above the source/drain regions SD32, SD33. The plate line PL is connected to the upper electrode TE of the corresponding ferroelectric capacitor C via the contact P22.

The local bit line /LBL is disposed above the plate line PL. The source/drain regions SD22, SD25, SD28, SD31, SD34 are connected to contacts P23. Each contact P23 is connected to the local bit line /LBL via an interconnection layer M21 and contact P24. The interconnection layer M21 is disposed as the same layer as that of the plate line PL. The plate line PL is also disposed over a position above the source/drain regions SD35, SD36, and is connected to the source/drain region SD36 via a contact P25.

The bit line /BL is disposed above the local bit line /LBL. The source/drain region SD20 is connected to the bit line /BL via a contact P26, interconnection layer M21, contact P27, interconnection layer M22, and contact P28. The interconnection layer M22 is disposed as the same layer as that of the local bit line /LBL.

FIG. 71 is substantially the same as FIG. 70 except the following. The transistor constituted of the source/drain regions SD20, SD21, and gate electrode BS, and the transistor constituted of the source/drain regions SD34, SD35 and gate electrode RST are formed as an enhancement type. On the other hand, the transistor constituted of the source/drain regions SD21, SD22 and gate electrode /BS, and the transistor constituted of the source/drain regions SD35, SD36 and gate electrode /RST are formed in the depression type. The local bit line LBL is positioned instead of the local bit line /LBL, and the bit line BL is positioned instead of the bit line /BL.

According to the semiconductor integrated circuit device of the fifty-fourth embodiment of the present invention, the cell group of the semiconductor integrated circuit device of the forty-first embodiment can be realized.

Moreover, according to the fifty-fourth embodiment, no wiring layer is disposed between the semiconductor substrate sub and the layer of the lower electrode BE. That is, in a manufacturing process, metal wirings of copper (Cu), aluminum (Al) and the like are not formed before forming the ferroelectric capacitor. If the metal wiring layers, for example, of Cu, Al and the like are formed before forming the ferroelectric capacitor in the manufacturing process, these metal wiring layers cannot bear a thermal process in forming the ferroelectric capacitor. Therefore, when the wiring layer is formed before forming the ferroelectric capacitor, for example, tungsten (W) or the like needs to be used. However, for an embedded memory of FeRAM and logic circuit and the like, since this tungsten wiring is disposed to form FeRAM, the wiring is extra as seen from the whole, and this increases a manufacturing cost. On the other hand, according to the fifty-fourth embodiment, it is not necessary to dispose this extra wiring layer, and the manufacturing cost can be inhibited from increasing.

Moreover, according to the fifty-fourth embodiment, different from the seventeenth embodiment (FIG. 18) or the nineteenth embodiment (FIG. 21), active regions AA1 to AA3 do not have to be bent. Therefore, the cell size can further be reduced, and a size of $6F^2$ can be truly realized.

Fifty-fifth Embodiment

A fifty-fifth embodiment is used in addition to the fifty-fourth embodiment (FIGS. 70, 71), and a wiring for shunt, a main block selection transistor wiring and the like are added.

Figure 72:
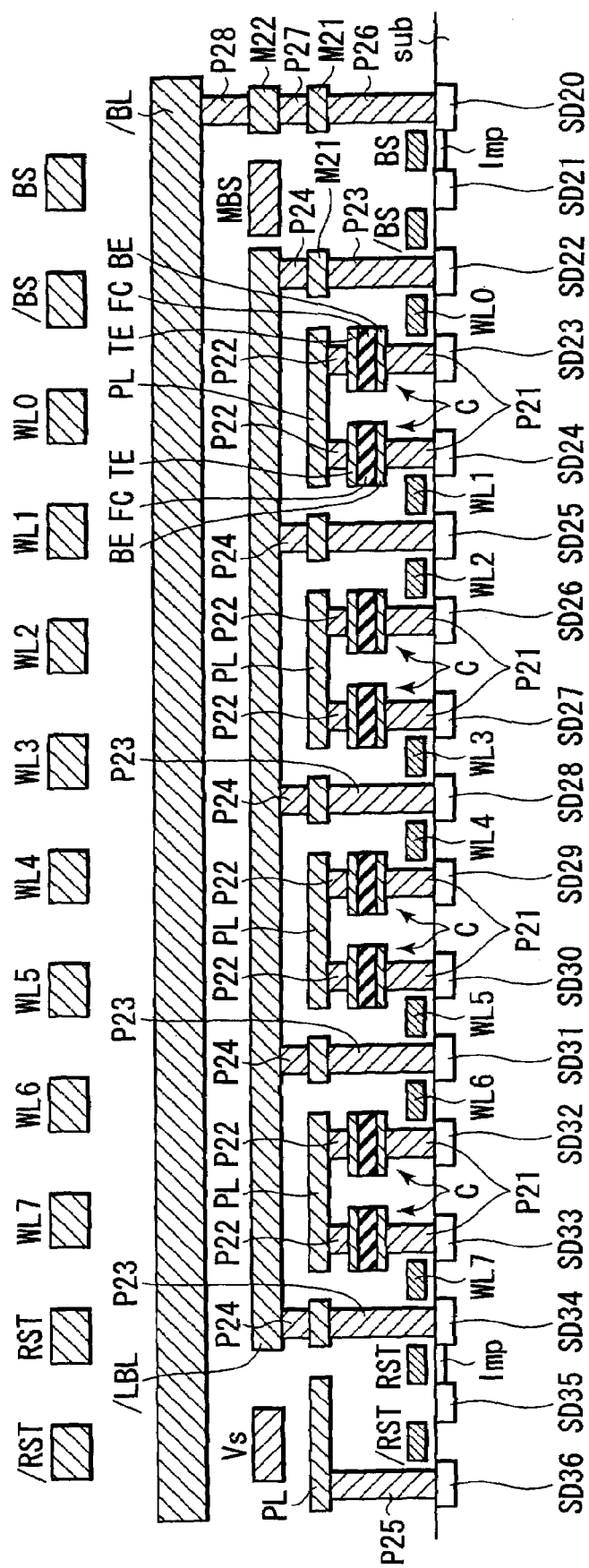
FIG. 72 is a view schematically showing the cross sectional structure of the semiconductor integrated circuit according to a fifty-fifth embodiment of the present invention.
Figure 73:
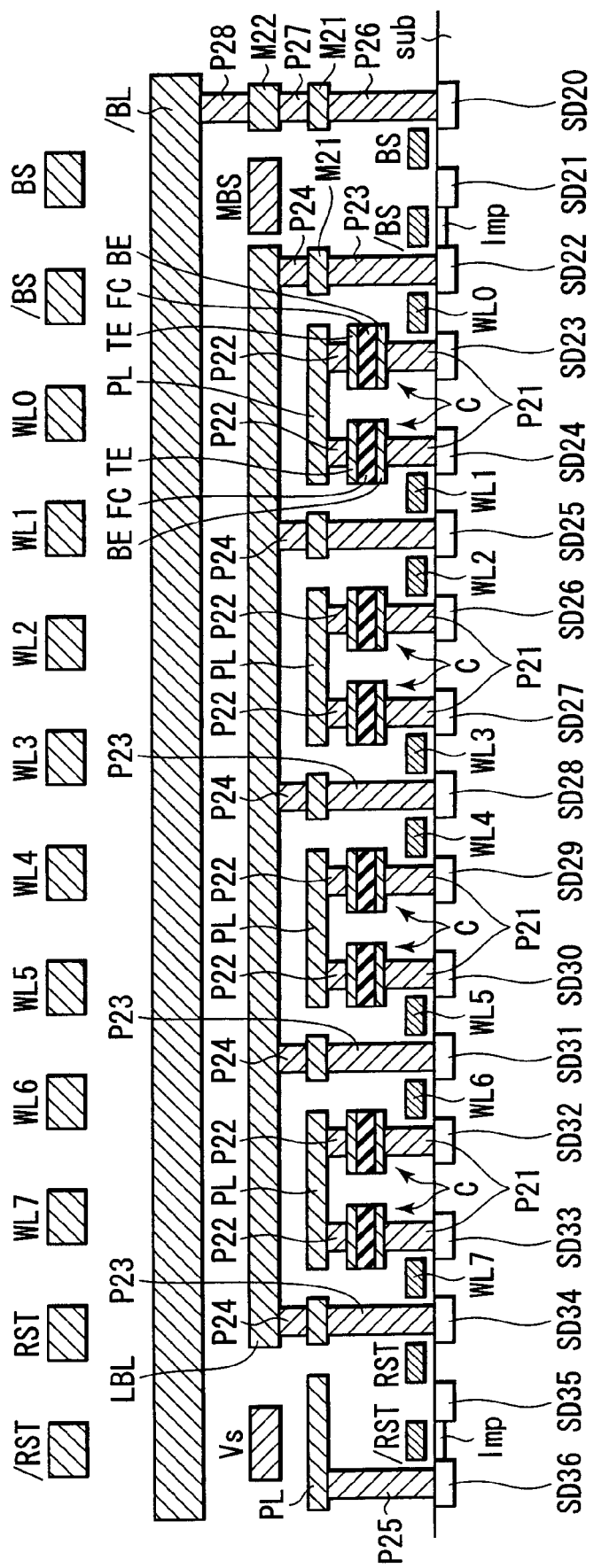
FIG. 73 is a view schematically showing the cross sectional structure of the semiconductor integrated circuit according to the fifty-fifth embodiment of the present invention.

FIGS. 72, 73 schematically show the cross sectional structure of the semiconductor integrated circuit according to the fifty-fifth embodiment of the present invention. FIG. 72 corresponds to a position similar to that of FIG. 70 of the fifty-fourth embodiment, and FIG. 73 corresponds to a position similar to that of FIG. 71 of the fifty-fourth embodiment. As shown in FIGS. 72, 73, a wiring for a main block selection transistor MBS and a power supply line Vs for strengthening the power supply are disposed in the same layer of the local bit line LBL (/LBL). A plurality of power supply lines can be arranged in the memory cell array by this power supply line Vs, and a total of power supply resistance can drastically be reduced. These main block selection transistor wiring MBS and power supply line Vs are disposed using a vacant place where the local bit line /LBL (LBL) is not disposed.

The wirings for shunt /RST, RST, WL0 to WL7, /BS, BS are disposed above the bit line /BL (BL). The wirings for shunt /RST, RST, WL0 to WL7, /BS, BS are periodically connected to the corresponding gate electrodes (denoted with the same reference symbols) in the extending direction (not shown).

Needless to say, it is possible to optionally employ any of the wiring for shunt, hierarchical word line system and power supply line.

According to the semiconductor integrated circuit device of the fifty-fifth embodiment of the present invention, the same effect as that of the fifty-fourth embodiment can be attained. Furthermore, the vacant place of a local bit line /LBL (LBL) level is used to disposed the main block selection transistor wiring MBS and power supply line Vs. Therefore, the main block selection transistor wiring MBS and power supply line Vs can be disposed without increasing further metal wiring level.

Fifty-sixth Embodiment

A fifty-sixth embodiment relates to a modification of the fifty-fifth embodiment (FIGS. 72, 73).

Figure 74:
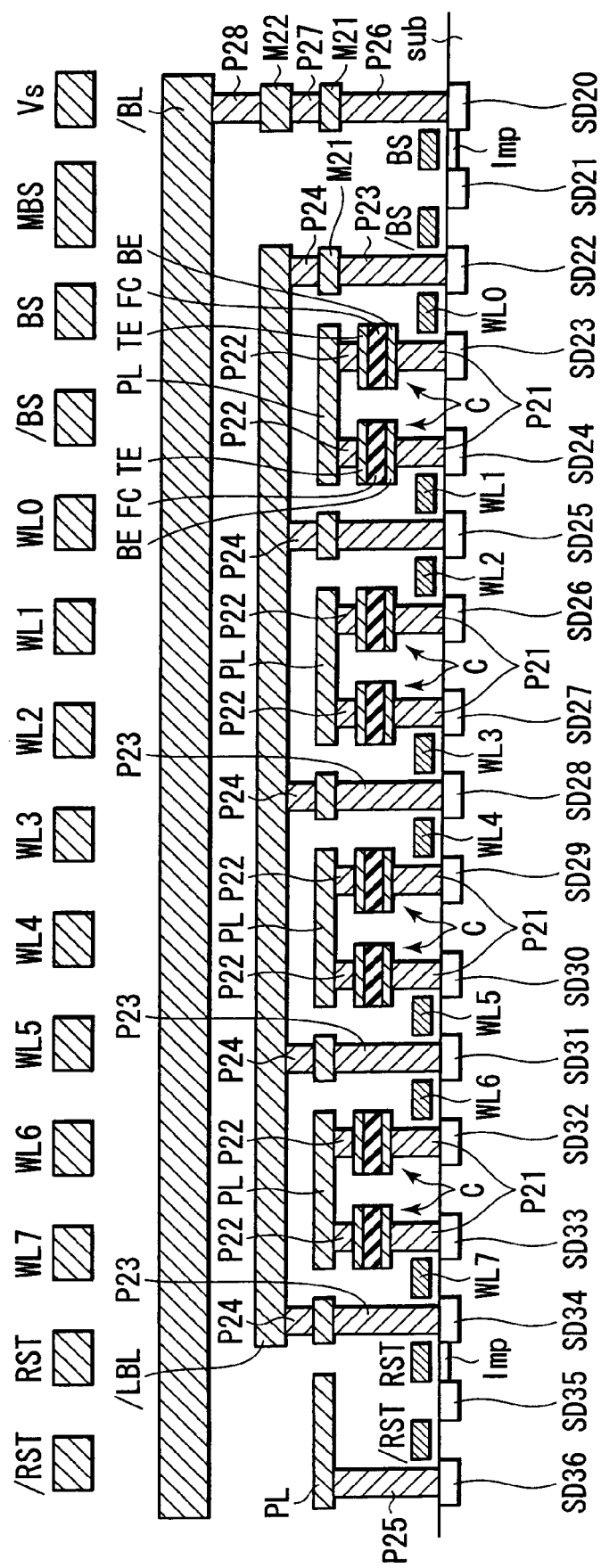
FIG. 74 is a view schematically showing the cross sectional structure of the semiconductor integrated circuit according to a fifty-sixth embodiment of the present invention.
Figure 75:
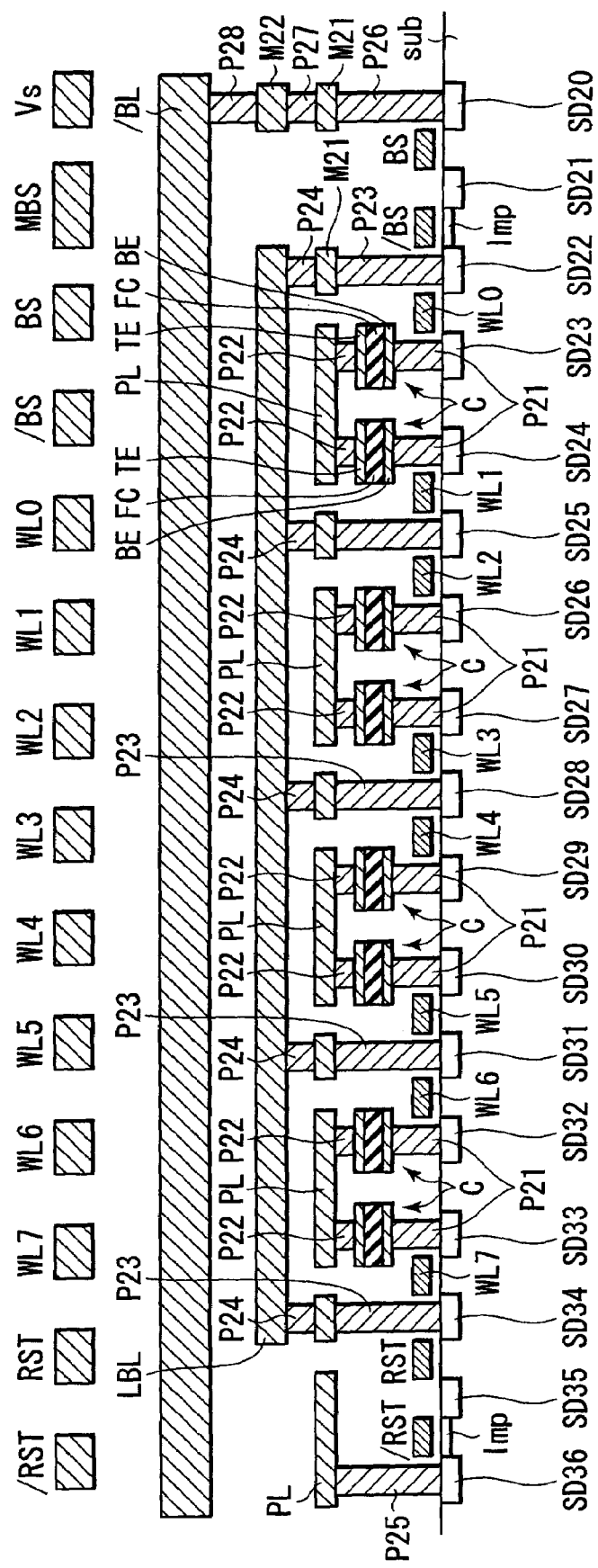
FIG. 75 is a view schematically showing the cross sectional structure of the semiconductor integrated circuit according to the fifty-sixth embodiment of the present invention.

FIGS. 74, 75 schematically show the cross sectional structure of the semiconductor integrated circuit according to the fifty-sixth embodiment of the present invention. FIG. 74 corresponds to a position similar to that of FIG. 72 of the fifty-fifth embodiment, and FIG. 75 corresponds to a position similar to that of FIG. 73 of the fifty-fifth embodiment. As shown in FIGS. 74, 75, the main block selection transistor wiring MBS and power supply line Vs are disposed in the same layer as that of the wirings for shunt /RST, RST, WL0 to WL7, /BS, BS.

Needless to say, it is also possible to optionally employ any of the wiring for shunt, hierarchical word line system and power supply line.

According to the semiconductor integrated circuit device of the fifty-sixth embodiment of the present invention, the same effect as that of the fifty-fifth embodiment can be attained. According to the fifty-sixth embodiment, one cell block or cell group is large, in which a plurality of signal lines (e.g., the main block selection transistor wiring MBS, power supply line Vs and the like) can be arranged with a high degree of freedom. On the other hand, in the conventional configuration, one cell forms a basic unit, one cell size is small, and therefore one signal line at most is disposed. That is, there is a large restriction to the arrangement of the signal line.

Fifty-seventh Embodiment

In a fifty-seventh embodiment, in addition to the configuration of the forty-first embodiment (FIG. 53), the plate line PL is commonly used by cell blocks CB0, CB1, and further cell blocks connected to the bit lines BL, /BL.

Figure 76:
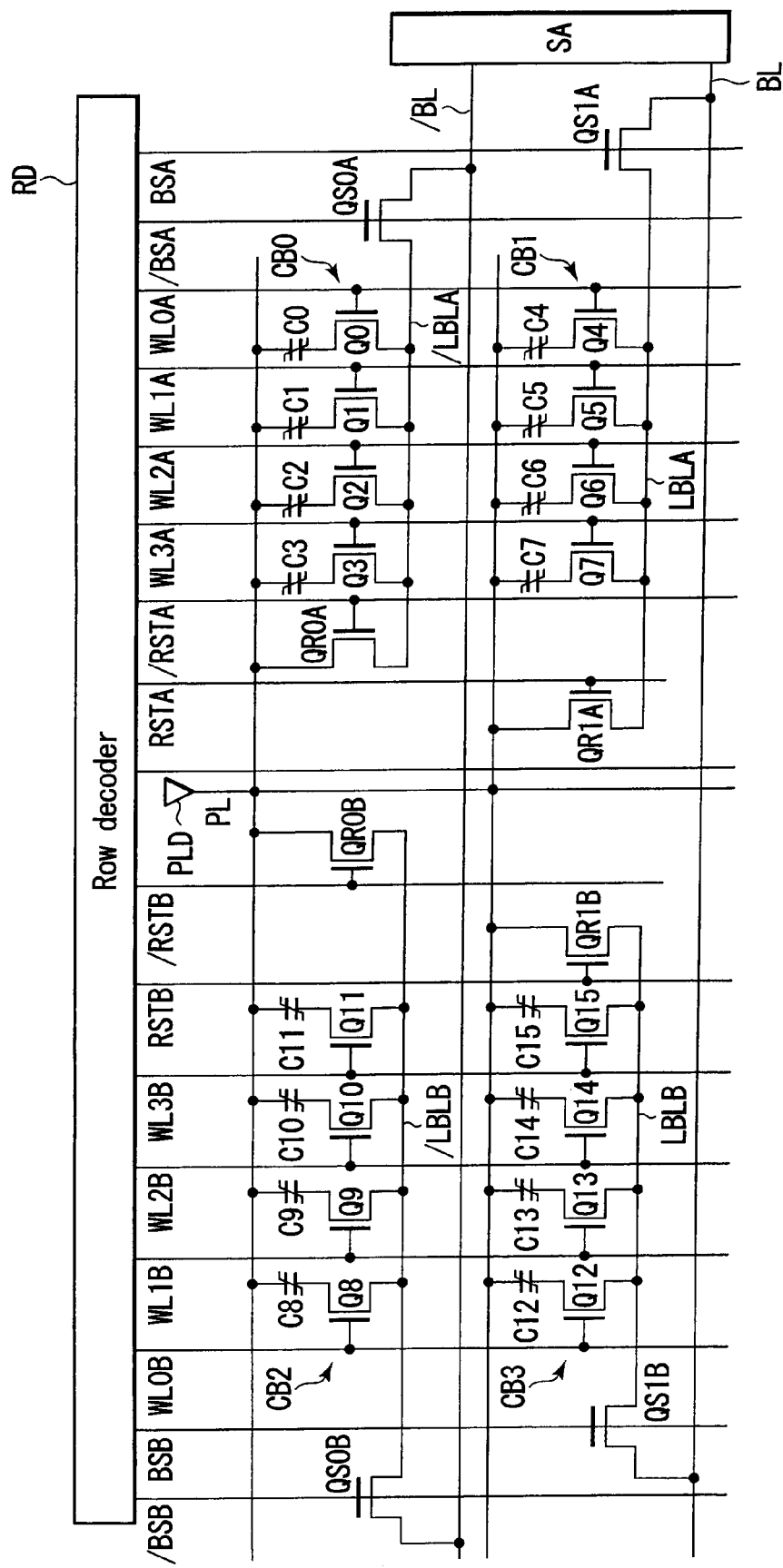
FIG. 76 is a diagram showing the circuit configuration of the semiconductor integrated circuit according to a fifty-seventh embodiment of the present invention.

FIG. 76 shows the circuit configuration of the semiconductor integrated circuit according to the fifty-seventh embodiment of the present invention. As shown in FIG. 76, the same configuration as that of FIG. 53 is disposed in the right half of the drawing. Additionally, the reference symbol of each component of FIG. 53, to whose end "A" is attached, is used.

Moreover, cell blocks CB2, CB3 similar to the cell blocks CB0, CB1 of FIG. 53 are further disposed with respect to the bit lines /BL, BL. The memory cell constituted of a reset transistor QR0B, ferroelectric capacitors C8 to C11 and cell transistors Q8 to Q11 is connected between the plate line PL and local bit line /LBLB. The local bit line /LBLB is connected to the bit line /BL via a block selection transistor QS0B.

A reset transistor and the memory cell constituted of ferroelectric capacitors C12 to C15 and cell transistors Q12 to Q15 are connected between the plate line PL and local bit line LBLB. The local bit line LBLB is connected to the bit line BL via a block selection transistor QS1B.

The gates of the cell transistors Q8, Q12 are connected to a word line WL0B. The gates of the cell transistors Q9, Q13 are connected to a word line WL1B. The gates of the cell transistors Q10, Q14 are connected to a word line WL2B. The gates of the cell transistors Q11, Q15 are connected to a word line WL3B. The reset transistors QR0B, QR1B are respectively controlled by reset signals /RSTB, RSTB. The block selection transistors QS0B, QS1B are respectively controlled by block selection signals /BSB, BSB.

For the operation, the present embodiment is similar to the forty-first embodiment. That is, in the access to the memory cells in the cell blocks CB0, CB1, the cell blocks CB2, CB3 maintain the standby state, and the same control as that of the forty-first embodiment is carried out with respect to the cell blocks CB0, CB1. During the access to the memory cells in the cell blocks CB0, CB1, the opposite ends of the ferroelectric capacitors C8 to C15 in the cell blocks CB2, CB3 are short-circuited, and the information is therefore inhibited from being destroyed. This also applies to the operation in the access to the memory cells in the cell blocks CB2, CB3.

According to the semiconductor integrated circuit device of the fifty-seventh embodiment of the present invention, the same effect as that of the forty-first embodiment is obtained. Furthermore, the plate line PL is commonly used by the greater number of the cell blocks than the forty-first embodiment. Therefore, it is possible to reduce the area occupied by the plate line PL and to reduce the resistance. The reduction of the occupying areas of the plate line driving circuits PL, /PL can be also realized.

Fifty-eighth Embodiment

A fifty-eighth embodiment relates to one example of the driving method of the plate line PL of the semiconductor integrated circuit device of the fifty-seventh embodiment (FIG. 76). In more detail, in the same manner as in the second embodiment, the present embodiment relates to the case where the potential of the plate line PL at the standby time is set to the potential Vss, and the potential at the drive time is set to the internal power supply potential Vaa.

Figure 77:
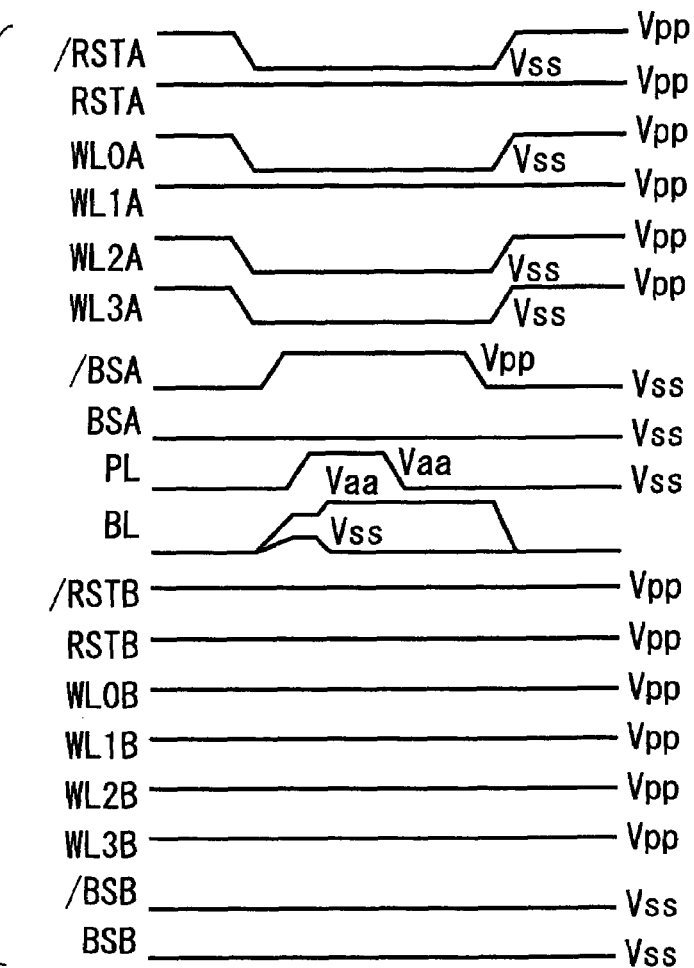
FIG. 77 is a diagram showing the operation of the semiconductor integrated circuit device of FIG. 76, for illustrating a fifty-eighth embodiment of the present invention.

FIG. 77 shows the operation of the semiconductor integrated circuit device of FIG. 76, for illustrating the fifty-eighth embodiment of the present invention. The operation will now be described in accordance with an example in which the information is read out from the ferroelectric capacitor C1.

As shown in FIG. 77, at the standby time, reset signals /RSTA, RSTA, /RSTB, RSTB, word lines WL0A to WL3A, WL0B to WL3B are set to the high level, and block selection signals /BSA, BSA, /BSB, BSB are set to the low level. The plate line PL is set to the potential Vss.

The operations of the reset signals /RSTA, RSTA, word lines WL0A to WL3A and block selection signals /BSA, BSA are the same as those of the forty-second embodiment (FIG. 54) until the standby state through the active state. During this, the reset signals /RSTB, RSTB and word lines WL0B to WL3B maintain the high level, and the block selection signals /BSB, BSB maintain the low level.

According to the semiconductor integrated circuit device of the fifty-eighth embodiment of the present invention, the combined effect of the fifty-seventh and second embodiments are obtained.

Fifty-ninth Embodiment

In a fifty-ninth embodiment, one bit is stored by two transistors and two ferroelectric capacitors. That is, the present embodiment relates to a case where the memory cell is of a so-called 2T2C type. In the 2T2C type, the information is stored in accordance with a state in which the "0" and "1" data are respectively written in two memory cells and a state in which the "1" and "0" data are respectively written. Even with the 2T2C type, the configuration of the circuit is not changed from the above-described embodiment, and is different only in the control at the time of the read or write. An example in which the 2T2C type memory cell is used in the semiconductor integrated circuit device of the forty-first embodiment (FIG. 53) and the information is read out of the ferroelectric capacitors C1, C5 will now be described. Complementary data is already written in the ferroelectric capacitors C1, C5.

Figure 78:
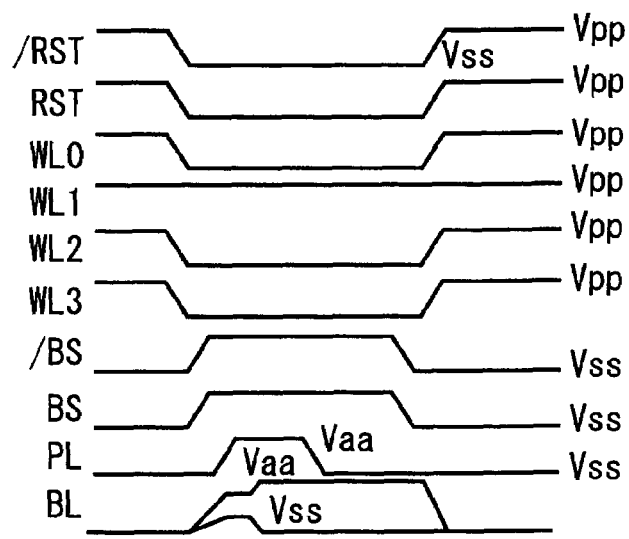
FIG. 78 is a diagram showing the operation of the semiconductor integrated circuit device of FIG. 53, which is assumed to be a 2T2C type memory cell, for illustrating the semiconductor integrated circuit device according to a fifty-ninth embodiment of the present invention.

FIG. 78 shows the operation of the semiconductor integrated circuit device of FIG. 53, which is assumed to be the 2T2C type memory cell, for illustrating the semiconductor integrated circuit device according to the fifty-ninth embodiment of the present invention. As shown in FIG. 78, the state at the standby time is the same as that of the forty-second embodiment (FIG. 54).

At the active time, the reset signals /RST, RST are both set to the low level, and the word lines WL0, WL2, WL3 of the non-selected cell are set to the low level. Subsequently, the block selection signal /BS, BS are set to the high level. When the plate line PL is driven at the internal power supply potential Vaa in this state, the information from the ferroelectric capacitors C1, C5 are read out to the bit lines /BL, BL. The potentials on the bit lines /BL, BL are amplified by the sense amplifier SA, and the information held by the memory cell is judged from two amplified data. Thereafter, the rewrite is performed, and the standby state is set.

Note that the 2T2C system has been described in accordance with the example of the semiconductor integrated circuit device of the forty-first embodiment, but can also be applied to the sixth (FIG. 7), eleventh (FIG. 12), twenty-sixth (FIG. 29), thirty-third (FIG. 36), thirty-fifth (FIG. 38) and fiftieth (FIG. 64) embodiments including a bit line pair in the similar method. In this case, in addition to the control described in the present embodiment, the plate lines /PL, PL are both driven, and accordingly the data is read out to the bit lines /BL, BL from two ferroelectric capacitors each acting as one memory cell.

According to the semiconductor integrated circuit device of the fifty-ninth embodiment of the present invention, the same effect as that of the forty-first embodiment is obtained. Furthermore, with the 2T2C type memory cell system, a large read margin can be attained as compared with the 1T1C type.

Sixtieth Embodiment

In a sixtieth embodiment, the potentials of the reset signals /RST, RST and word lines WL0 to WL3 at the standby time are set to be lower than a potential Vpp in the same manner as in the operation described in the second embodiment with reference to FIG. 3. At the standby time, the potentials at the high level continue to be applied to the reset transistors QR0, QR1 and reset transistors Q0 to Q7, and therefore the reliability of the transistor is degraded. To solve the problem, the potential applied to each transistor at the standby time is set to be lower than the potential Vpp, and the potential applied to the required transistor at the active time is set to the potential Vpp.

Figure 79:
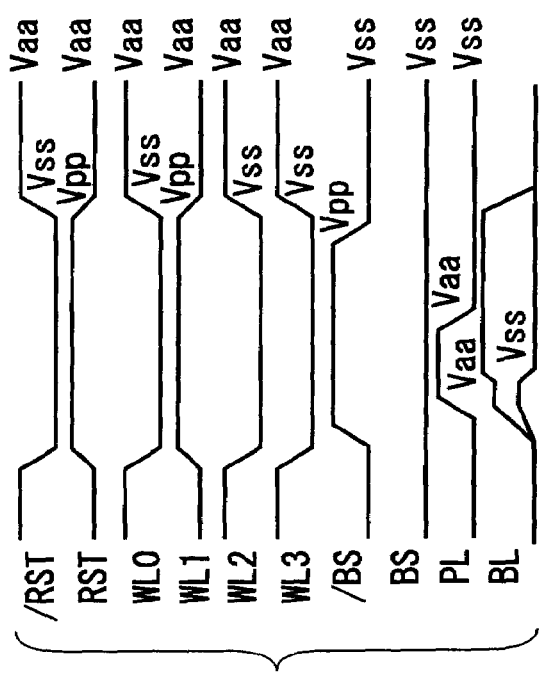
FIG. 79 is a diagram showing another example of a control method of the semiconductor integrated circuit device of the forty-second embodiment, for illustrating the semiconductor integrated circuit device according to a sixtieth embodiment of the present invention.

FIG. 79 shows another example of a control method of the semiconductor integrated circuit device of the forty-second embodiment (FIG. 53) in the semiconductor integrated circuit device according to the sixtieth embodiment of the present invention. As shown in FIG. 79, at the standby time, the potentials of the reset signals /RST, RST and word lines WL0 to WL3 are set to be lower than the potential Vpp (e.g., Vaa). At the active time, the word line WL1 of the selected transistor and the reset signal RST are set to the potential Vpp. The other concrete operation is the same as that of the forty-third embodiment (FIG. 54).

According to the semiconductor integrated circuit device of the sixtieth embodiment of the present invention, the same effect as that of the forty-second and forty-third embodiments is obtained. Furthermore, according to the sixtieth embodiment, the potential lower than the potential Vpp is applied to the transistor on at the standby state. This can prevent the high voltage from being continued to be applied to the transistors and from degrading the reliability.

Sixty-first Embodiment

A sixty-first embodiment relates to a layout applicable to the fifty-fourth embodiment (FIGS. 70, 71). FIGS. 80 to 83 show the layout which can be applied to the semiconductor integrated circuit device of FIGS. 70, 71, for illustrating the sixty-first embodiment of the present invention. FIGS. 80 to 83 show the respective surfaces in the height directions of the cross sectional structures of FIGS. 70, 71 in upward order from the surface of the semiconductor substrate sub. The sectional view along LXX-LXX line of FIGS. 80 to 83 corresponds to FIG. 70, and the sectional view along LXXI-LXXI line corresponds to FIG. 71.

Figure 80:
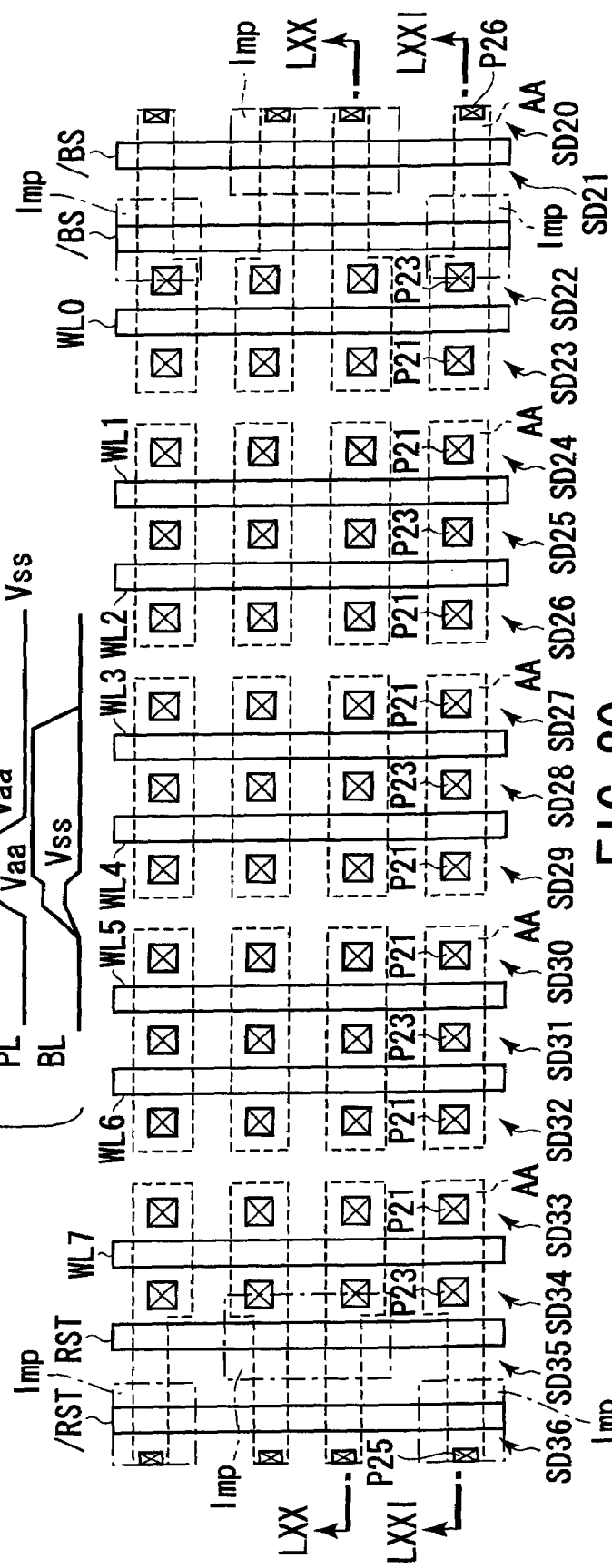
FIG. 80 is a view showing a part of the layout which can be applied to the semiconductor integrated circuit device of FIGS. 70, 71, for illustrating a sixty-first embodiment of the present invention.

As shown in FIG. 80, a plurality of active regions AA are separated from one another and arranged in a matrix form. The gate electrodes /RST, RST, WL0 to WL7, /BS, BS extend in the vertical direction of the drawing on the active region. The gate electrodes BS, /BS, WL0 extend at intervals on the active region of the rightmost column of the drawing. An impurity injected region (Imp) for setting a threshold value of the transistor to be negative is formed in the vicinity of the channel region in a position where the depression type transistor is formed. In the active region AA, the source/drain regions SD20, SD21 are positioned on opposite sides of the gate electrode BS. Similarly, the source/drain regions SD21, SD22 are positioned on the opposite sides of the gate electrode /BS, and the source/drain regions SD22, SD23 are positioned on the opposite sides of the gate electrode WL0.

Similarly, in each active region belonging to the same column, the source/drain regions SD24, SD25 are positioned on the opposite sides of the gate electrode WL1, and the source/drain regions SD25, SD26 are positioned on the opposite sides of the gate electrode WL2. Similarly, the source/drain regions SD27, SD28 are positioned on the opposite sides of the gate electrode WL3, and the source/drain regions SD28, SD29 are positioned on the opposite sides of the gate electrode WL4. The source/drain regions SD30, SD31 are positioned on the opposite sides of the gate electrode WL5, and the source/drain regions SD31, SD32 are positioned on the opposite sides of the gate electrode WL6. The source/drain regions SD33, SD34 are positioned on the opposite sides of the gate electrode WL7, and the source/drain regions SD34, SD35 are positioned on the opposite sides of the gate electrode RST. The source/drain regions SD35, SD36 are positioned on the opposite sides of the gate electrode /RST.

The contact P26 is formed on the source/drain region SD20. The contacts P23 are formed on the source/drain regions SD22, SD25, SD28, SD31, SD34. The contacts P21 are formed on the source/drain regions SD23, SD24, SD26, SD27, SD29, SD30, SD32, SD33. The contact P25 is formed on the source/drain region SD36.

Figure 81:
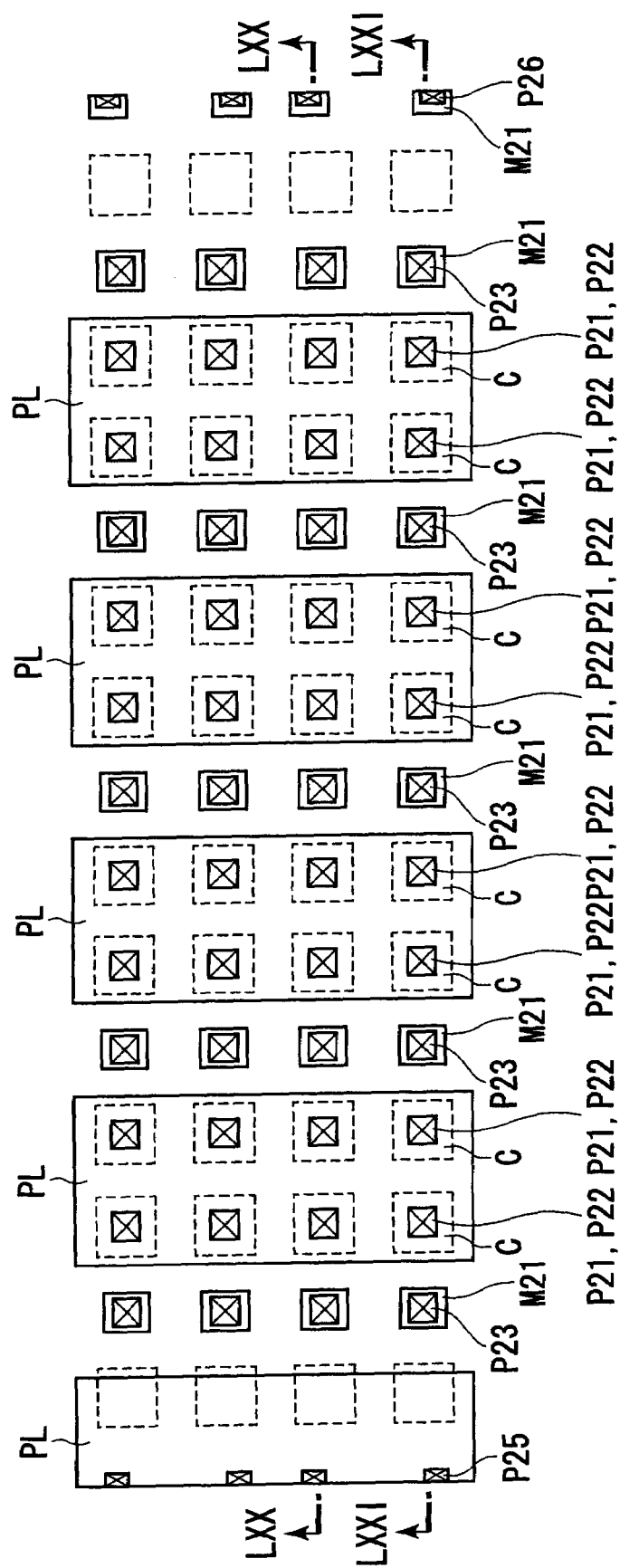
FIG. 81 is a view showing a part of the layout which can be applied to the semiconductor integrated circuit device of FIGS. 70, 71, for illustrating the sixty-first embodiment of the present invention.

As shown in FIG. 81, the interconnection layers M21, for example, having square shapes are disposed on the contacts P26, P23. The ferroelectric capacitor C, for example, having the square shape is disposed on each contact P21. For example, the plate line PL having the square shape is disposed above two columns of ferroelectric capacitors C between the contacts P21 to cover them. The respective plate lines PL between the contacts P21 are isolated from one another in FIG. 81, but are connected to each other in a position (not shown) in the extending direction of the gate electrode. The plate line PL disposed above the contact P25 belonging to the same column is also connected to other plate lines PL.

Figure 82:
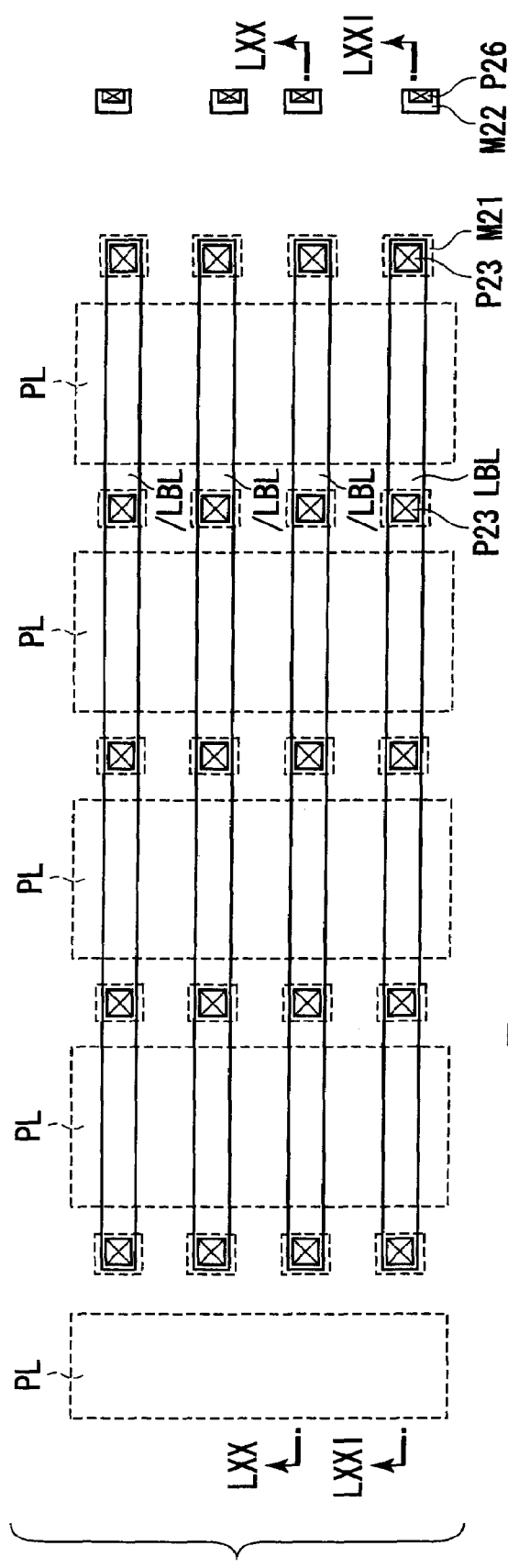
FIG. 82 is a view showing a part of the layout which can be applied to the semiconductor integrated circuit device of FIGS. 70, 71, for illustrating the sixty-first embodiment of the present invention.

As shown in FIG. 82, the local bit lines LBL, /LBL are formed across the plate lines PL in the horizontal direction of the drawing. The local bit lines LBL, /LBL are disposed at an interval in the vertical direction. The contact P23 disposed between the plate lines PL connects the local bit lines LBL, /LBL to the interconnection layer M21.

Figure 83:
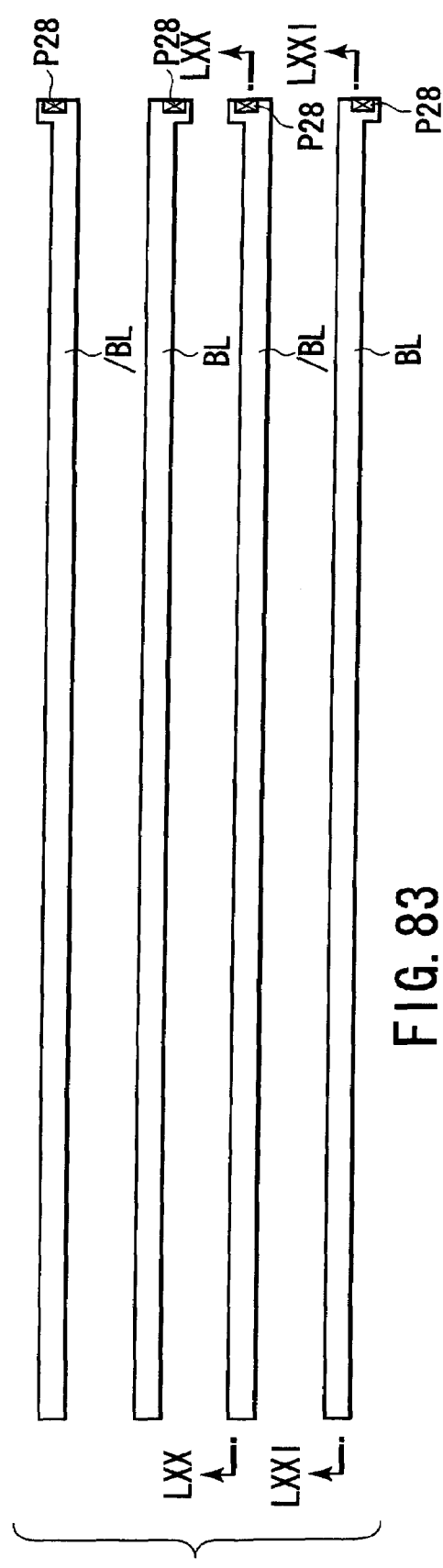
FIG. 83 is a view showing a part of the layout which can be applied to the semiconductor integrated circuit device of FIGS. 70, 71, for illustrating the sixty-first embodiment of the present invention.

As shown in FIG. 83, the bit lines BL, /BL are disposed at an interval in the horizontal direction of the drawing. The bit lines BL, /BL are connected to the interconnection layer M22 via the contact P28.

Note that it is also possible to apply the present embodiment to the fifty-fifth and fifty-sixth embodiments. In the fifty-fifth embodiment, for the main block selection transistor wiring MBS and power supply line Vs, the main block selection transistor wiring MBS extends in the vertical direction of the drawing at an interval from one end of each of the local bit lines LBL, /LBL of FIG. 82. Similarly, the power supply line Vs extends in the vertical direction of the drawing at an interval from the other end. The wirings for shunt /RST, RST, WL0 to WL7, /BS, BS of FIGS. 71, 72 are disposed on the layer further above the layers shown in FIG. 83. In the fifty-sixth embodiment, the main block selection transistor wiring MBS and power supply line Vs are disposed in the same layer and direction as those of the wirings for shunt /RST, RST, WL0 to WL7, /BS, BS.

According to the semiconductor integrated circuit device of the sixty-first embodiment of the present invention, the semiconductor integrated circuit device of FIGS. 70 to 75 can be realized, and the same effect as that of the fifty-fourth to fifty-sixth embodiments is obtained.

Sixty-second Embodiment

Figure 84:
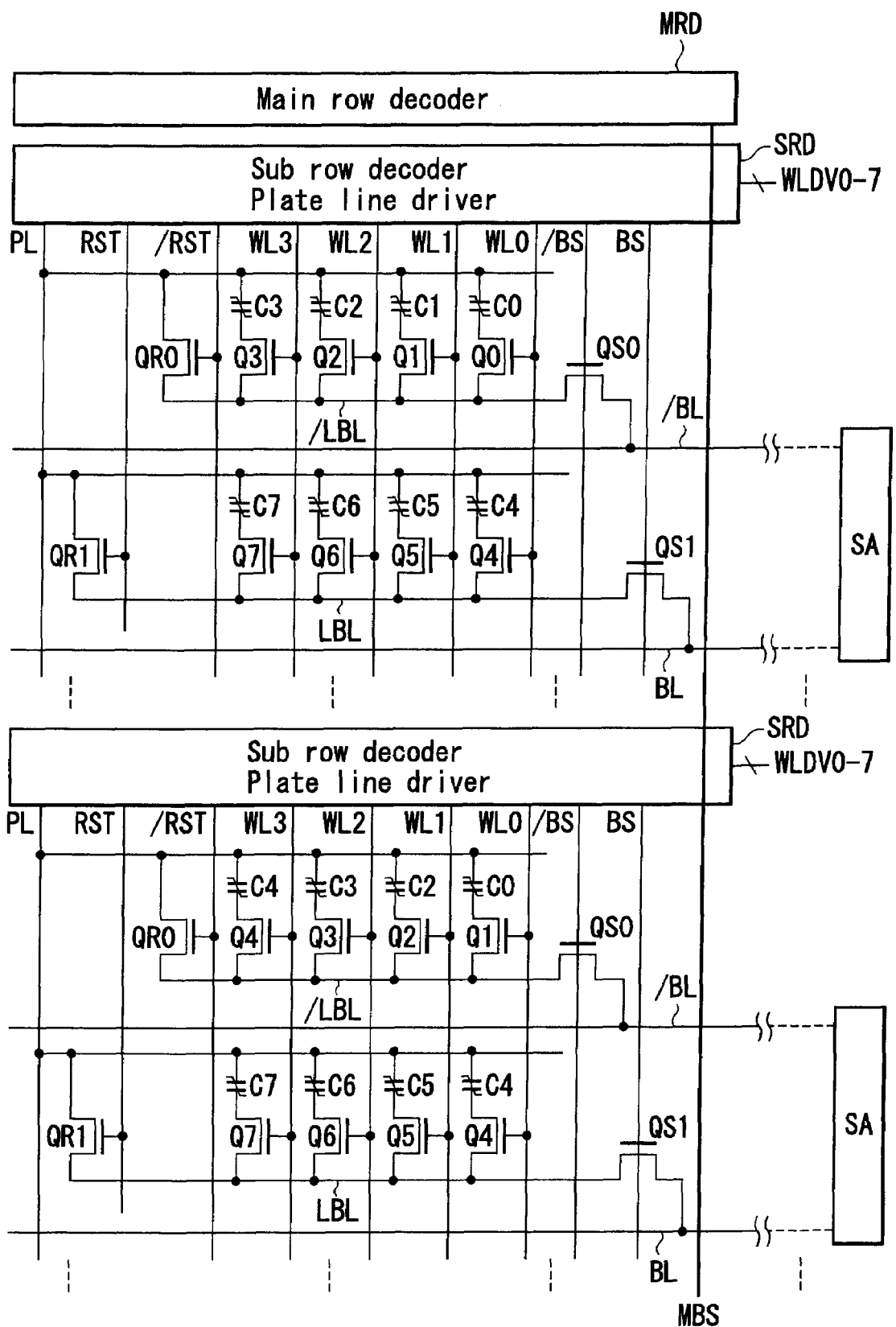
FIG. 84 is a diagram showing the circuit configuration of the semiconductor integrated circuit device according to a sixty-second embodiment of the present invention.

A sixty-second embodiment relates to the circuit configuration of the hierarchical word line system. FIG. 84 shows the circuit configuration of the semiconductor integrated circuit device according to the sixty-second embodiment of the present invention, and shows the circuit configuration in the combination of the hierarchical word line system and shunt system.

As shown in FIG. 84, for example, there are arranged a plurality of (two are illustrated in the drawing) sub-groups each constituted of the cell blocks CB0, CB1, bit line pair BL, /BL and sense amplifier SA having the same configuration as that of the sixth embodiment (FIG. 7), a sub-row decoder for controlling these, and sub-plate line driver SRD. Moreover, with respect to these sub-groups, the main block selection transistor wiring MBS connected to the main row decoder MRD is disposed.

Note that FIG. 84 shows an example in which the sub-group is constituted by the same configuration as that of the sixth embodiment, but it is also possible to constitute the sub-group using the circuit configuration of other embodiments of the present invention.

According to the semiconductor integrated circuit device of the sixty-second embodiment of the present invention, in addition to the effects obtained by the above-described embodiments, the effects by the hierarchical word line system and shunt system such as the decrease of the resistance of the signal line are obtained.

Sixty-third Embodiment

Figure 85:
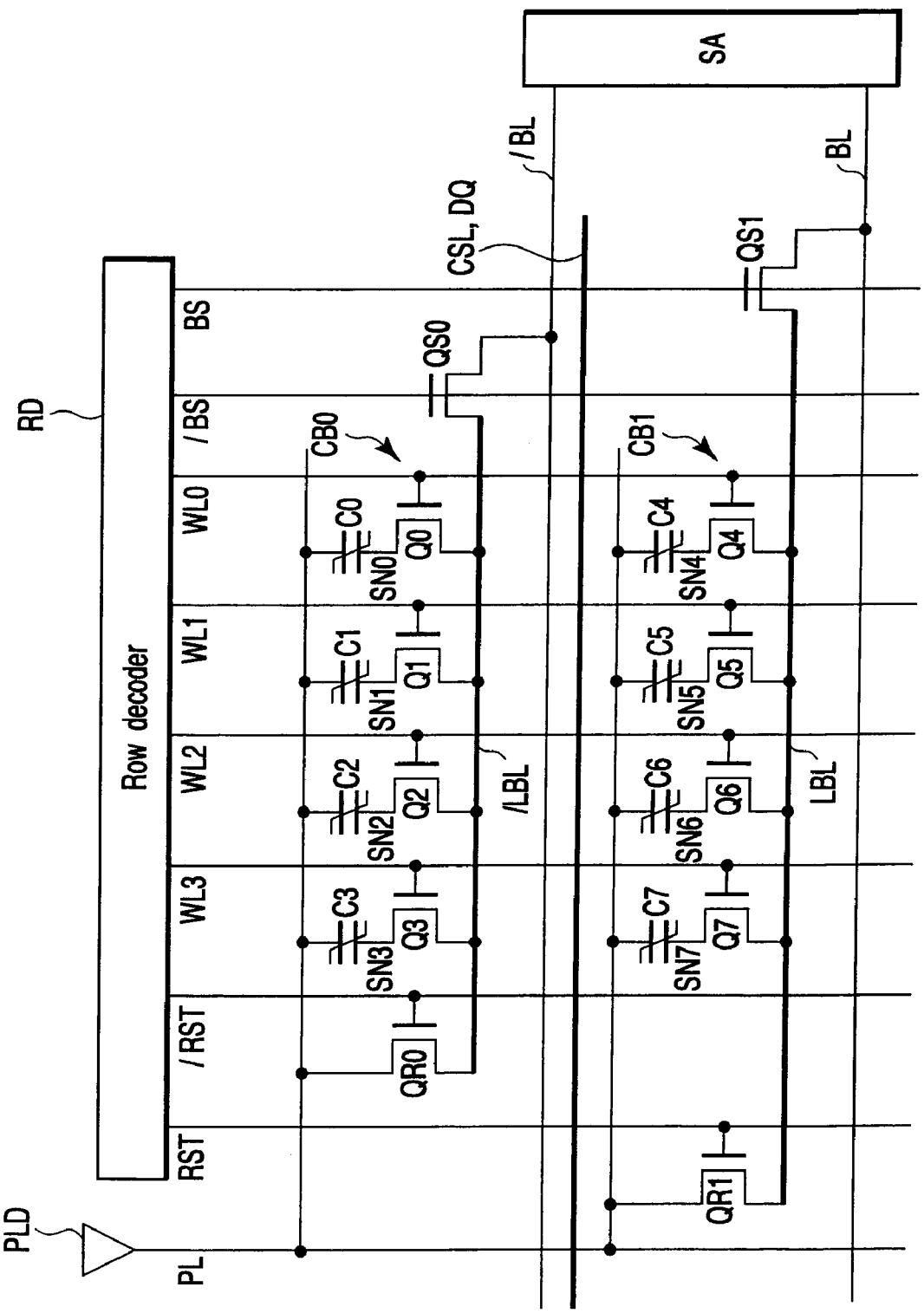
FIG. 85 is a diagram depicting the circuit configuration of a semiconductor integrated circuit according to a sixty-third embodiment of the present invention.

The sixty-third embodiment of the present invention is concerned with a method of arranging wirings in the semiconductor integrated circuit according to the forty-first embodiment. FIG. 85 shows the circuit configuration of a semiconductor integrated circuit according to the sixty-third embodiment. This circuit of FIG. 85 is similar in configuration to the sixty-third embodiment (FIG. 53). The circuit differs in that column-selecting signal lines SCL and data lines DQ (shown in thick lines) are made by processing the same wring layer as the local bit lines /LBL and LBL. The lines SCL and DQ extend in parallel to the bit lines. The data lines DQ convey data between the sense amplifier SA and any circuit that is peripheral to the semiconductor integrated circuit. The column-selecting signal lines SCL are connected to the column decoder (not shown). They supply signals that selects columns of memory cells, from which the sense amplifier SA reads data items. The data items thus read are supplied from the sense amplifier SA to the data lines DQ.

Basically, the embodiments of the present invention must have local bit lines /LBL and LBL. (Hereinafter, the local bit lines /LBL and LBL will be referred to as "local bit lines LBL," except for the case where one local bit line should be distinguished from any other.) The local bit lines LBL are made by processing a wiring layer at the level of the wiring layer M22, as is illustrated in, for example, FIGS. 72, 73 and 75.

The sixty-third embodiment has cross-point cells. Thus, the local bit lines LBL are arranged at the same pitch as the cells are arranged. The pitch at which the local bit lines LBL are arranged is rather long. Using this feature, one column-selecting signal line SCL and one data line DQ are provided for every two local bit lines. This is a characterizing feature of the sixty-third embodiment.

This embodiment may be so modified that column-selecting lines CSL and data lines DQ are laid between the local bit lines LBL, though it is rather difficult to do so from a design viewpoint. Alternatively, the embodiment may be modified such that the column-selecting lines and the data lines DQ are made by processing the same wiring layer as the bit lines BL. Nevertheless, the configuration of FIG. 85 is better for the following reasons. The wiring capacitance will increase, inevitably degrading the quality of signals read, if the column-selecting lines CSL and the data lines DQ are provided between the bit lines BL, reducing the pitch at which the bit lines BL are arranged. The capacitance of each local bit line LBL will indeed increase if the column-selecting lines CSL and the data lines DQ are provided between the local-bit lines LBL. Nonetheless, the local bit lines LBL are short and increase but a little the load capacitance at the time of reading data from the entire circuit of FIG. 85. This is because the capacitance of each local bit line LBL does not work as load capacitance that result in parasitic capacitance in any line through which a signal flows when data is read from the circuit.

FIG. 85 shows the present embodiment applied to the embodiment shown in FIG. 53. Nonetheless, it can be applied to any other embodiment, too, so that column-selecting lines CSL and data lines DQ may of course be provided at the same level as the local bit lines LBL.

Figure 86:
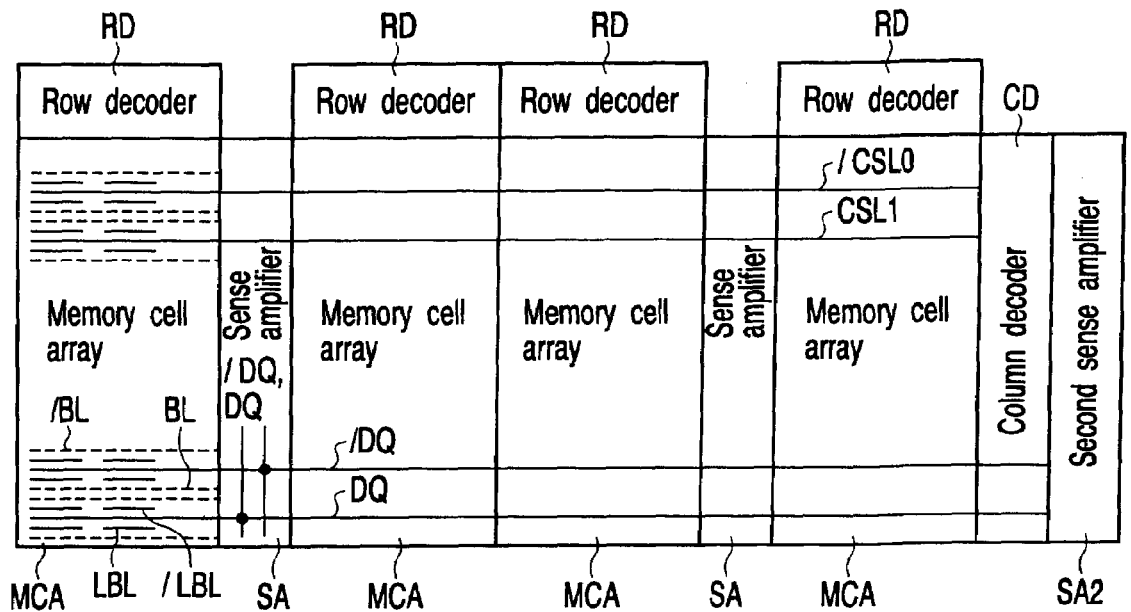
FIG. 86 is a plan view of the semiconductor integrated circuit according to the sixty-third embodiment of the present invention.

FIG. 86 shows how the column-selecting line CSL and the data lines DQ are lead in a plurality of memory-cell arrays. In this instance, a sense amplifier SA is provided between every two adjacent memory-cell arrays MCA. Each sense amplifier SA operates to read data from the memory-cell arrays MCA that are located on its sides. Identical units, each composed of two memory-cell arrays MCA and one sense amplifier SA provided between the arrays MCA, are arranged in the horizontal direction in the plane of drawing. (In FIG. 59, only two units are illustrated.) A column decoder CD is provided at the right end of the resultant structure. Row decoders RD are provided at the upper side of the structure. Each memory-cell array MCA comprises a plurality of identical sections, which have, for example, the structure shown in FIG. 85 and which are arranged in the vertical direction in the plane of drawing.

The column-selecting lines SCL (only lines SCL0 and CSL1 are depicted in FIG. 86) extend in the horizontal direction in the plane of drawing. They pass through the memory-cell arrays MCA and connected to the column decoder CD. Data lines DQ and /DQ extend in the horizontal direction, too, passing through the memory-cell arrays MCA and connected to the second sense amplifier SA2. The data liens DQ and /DQ transfers the data amplified by one sense amplifier SA to the second sense amplifier SA2, in response to signals supplied by the column-selecting lines CSL.

Figure 87:
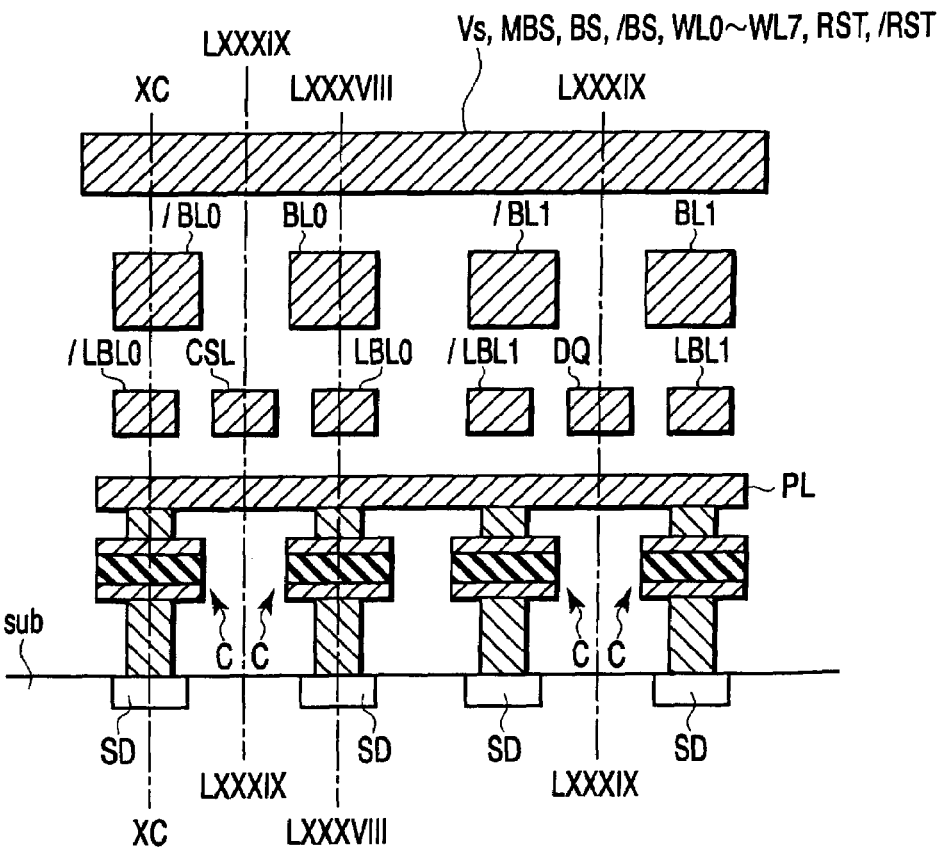
FIG. 87 is a schematic sectional view of a device configuration that can be applied to the sixty-third embodiment.

FIG. 87 is a schematic sectional view of a device configuration that can be applied to the sixty-third embodiment. Note that this sectional view is one taken along the word lines. In this configuration, the plate line has been made by processing M1 wiring layer, the local bit lines LBL by processing M2 wiring layer, the bit lines by processing the M3 wiring layer, and the main-block selection transistor lines MBS and shunt lines WL0 to WL7 by processing the M4 wiring layer. In other words, the column-selecting lines SCL and data lines DQ, all shown in FIGS. 85 and 86, are formed by processing the M2 wiring layer, as the local bit lines LBL.

Figure 88:
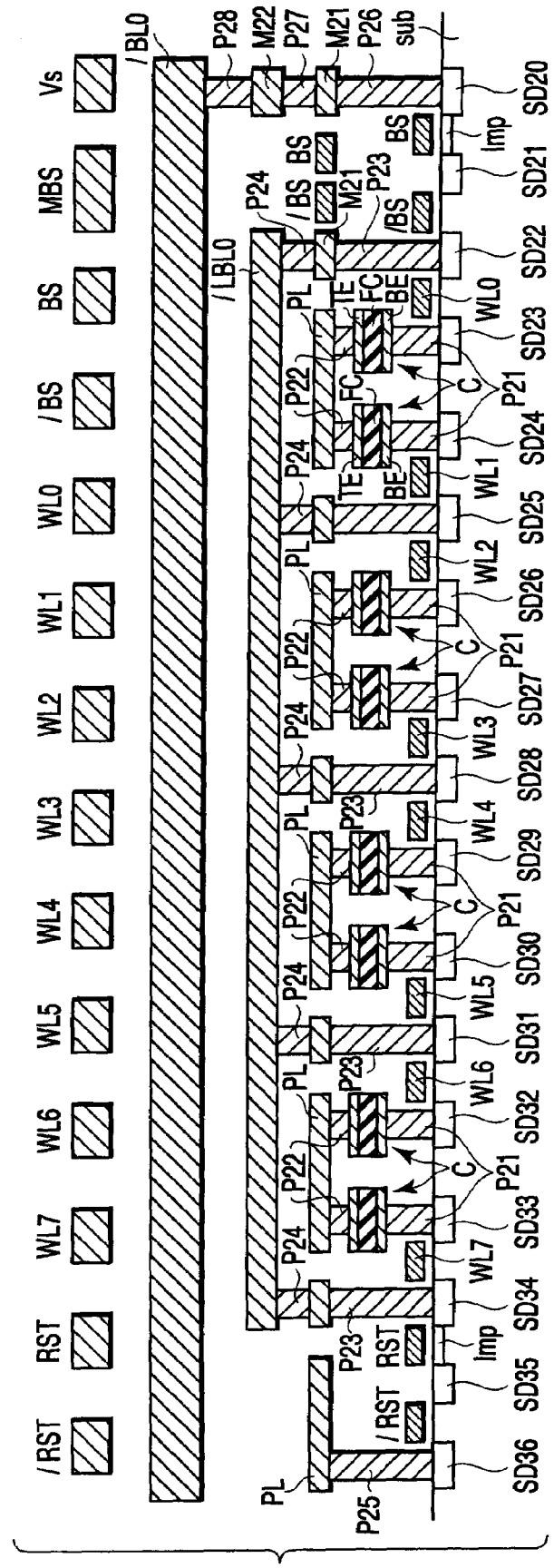
FIG. 88 is a schematic sectional view of the device configuration shown in FIG. 87.
Figure 89:
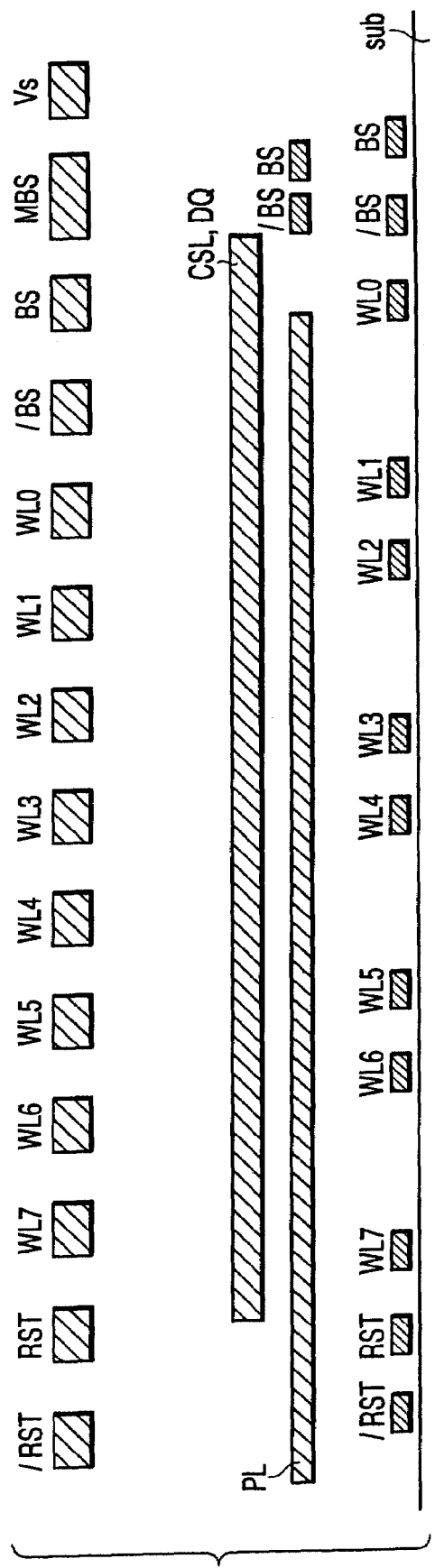
FIG. 89 is another schematic sectional view of the device configuration depicted in FIG. 87.
Figure 90:
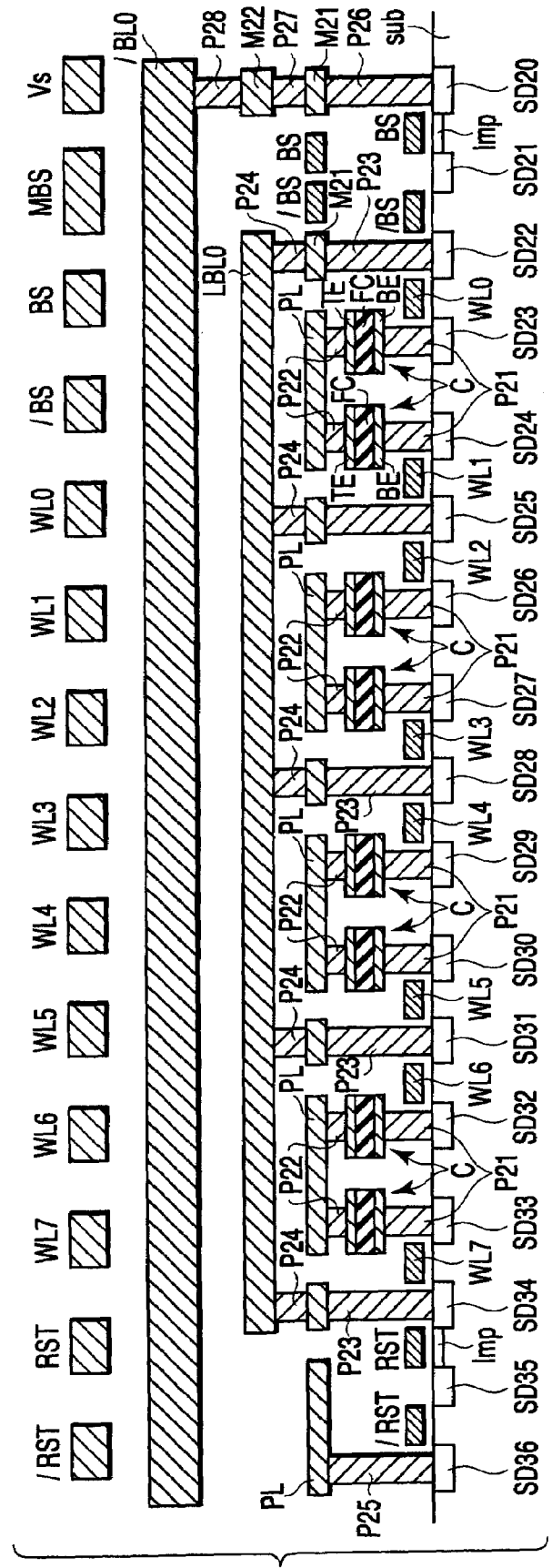
FIG. 90 is still another schematic sectional view of the device configuration shown in FIG. 87.

FIGS. 88 to 90 are sectional views of the device configuration of FIG. 87, each illustrating one of the cell blocks. More precisely, FIG. 88 is a sectional view taken along the local bit line /LBL (FIG. 85), or along line LXXXVIII-LXXXVIII shown in FIG. 87. FIG. 89 is a sectional view taken along the column-selecting line CSL or data line DQ (FIG. 85), or along line LXXXIX-LXXXIX shown in FIG. 87. FIG. 90 is a sectional view taken along the local bit lines LBL (FIG. 85), or along line XC-XC shown in FIG. 87. Note that the FIGS. 88 and 90 are identical to FIGS. 74 and 75, respectively. As FIGS. 88 and 90 depict, wiring layers /BS and BS are provided between the M1 layers that are located above the gate electrodes /BS and BS. Thus, shunt lines /BS and BS can be formed by processing the M1 wiring layer. In FIGS. 88 and 90, the M1 wiring layer and the M4 wiring layer are illustrated for the sake of convenience.

As FIG. 89 shows, word lines BS, /BS, WL0 to WL7, RST and /RST are provided above the semiconductor substrate sub. The M1 wiring layer is provided above these word lines BS, /BS, WL0 to WL7, RST and /RST and has been processed, forming a plate line PL. The plate line PL extends in the horizontal direction in the plane of drawing and is connected to the plate line PL shown in FIGS. 88 and 90. The wiring layers /BS and BS, both being parts of the M1 wiring layer, extend in the vertical direction in the plane of drawing. The column-selecting lines CSL the data lines DQ are made by processing the M2 wiring layer that is provided above the M1 wiring layer. That is, the liens CSL and DQ are made from the same wiring layer as the local bit lines /LBL and LBL are. Above the M2 wiring layer there is provided an M4 wiring layer. The M4 wiring layer is processed, forming the main-block selection transistor lines MBS and constitute shunt wiring-layers Vs, MBS, BS, /BS, WL0 to WL7, RST and /RST.

The sixty-third embodiment has local bit lines LBL, like any one of the embodiments described above. The column-selecting lines CSL and the data lines DQ are made by processing the same wiring layer as the local bit lines are made, as in the embodiments described above. The sixty-third embodiment can therefore achieve the same advantage as the other embodiments described above. Since the column-selecting lines CSL and the data lines DQ are made by processing the same wiring layer as the local bit lines LBL, the sixty-third embodiment has another advantage, which will be described below.

Figure 48:
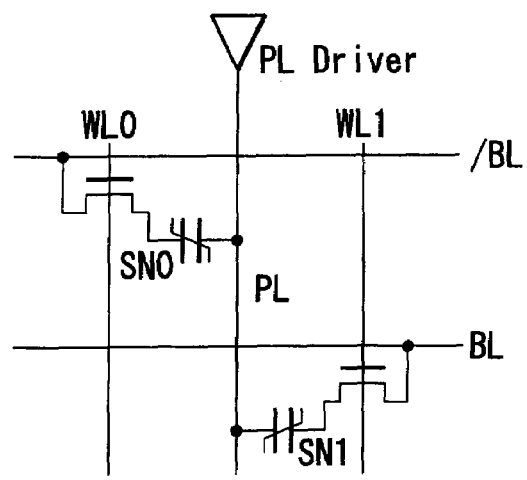
FIG. 48 is a diagram for illustrating a problem of the conventional semiconductor integrated circuit device.
Figure 49:
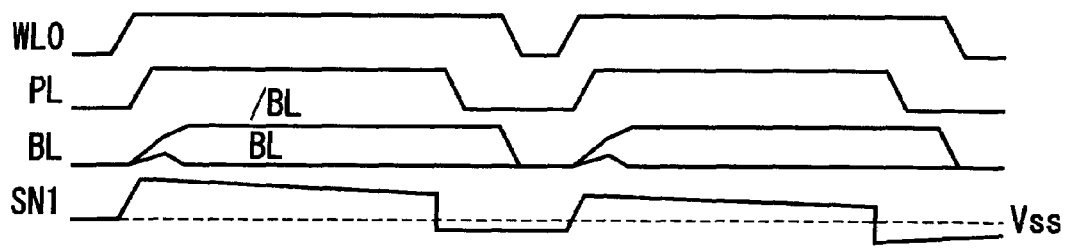
FIG. 49 is a diagram for illustrating a problem of the conventional semiconductor integrated circuit device.
Figure 50:
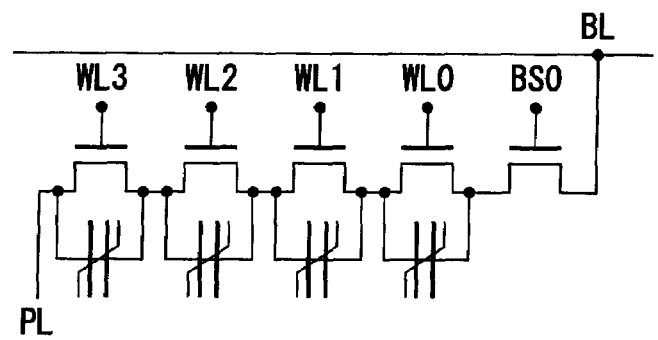
FIG. 50 is a diagram showing the circuit configuration of the semiconductor integrated circuit device of the prior application.
Figure 51:
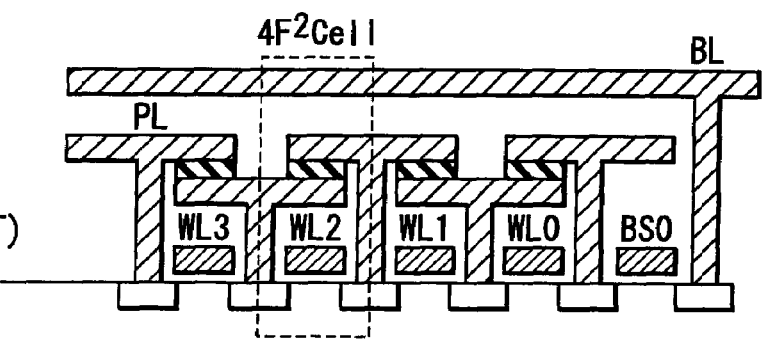
FIG. 51 is a view showing the cross sectional structure of the semiconductor integrated circuit device of the prior application.
Figure 52:
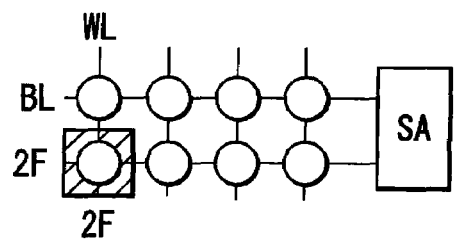
FIG. 52 is a diagram showing the plane configuration of the semiconductor integrated circuit device of the prior application.

Each embodiment of the present invention needs four wiring layers because it has local bit lines LBL. Unless these wiring layers are used to form column-selecting lines and the data lines DQ, other wiring layers must be provided. Note that the conventional circuit (FIG. 48) and the circuits (FIGS. 50 and 51) disclosed in the inventors' prior applications will have four wiring layers in all, even if additional wiring layers are used to provide column-selecting lines CSL and data liens DQ. In the sixty-third embodiment, column-selecting lines CSL and data lines DQ are provided in the spaces between the local bit liens LBL. The number of wiring layers used is the same as in the conventional circuit and the circuits disclosed in the inventors' prior applications. Having local bit lines LBL, any modification of the sixty-third embodiment can operate faster, without increasing the manufacturing cost in spite of the use of additional wiring layers.

In the sixty-third embodiment, the column-selecting lines CSL are provided on the memory cell-arrays MCA, without using additional wiring layers. One column decoder CD can therefore work for all memory-cell arrays MCA provided. In semiconductor integrated circuits that have no column-selecting lines on the memory-cell arrays MCA, one column decoder must be provided for each memory-cell array MCA. The area of the circuit will inevitably increase. In contrast, the area of the circuit according to the sixty-third embodiment does not increase because only one column decoder works for all memory-cell arrays MCA.

In the sixty-third embodiment, a number of data lines DQ are provided on the memory-cell arrays MCA, without using additional wiring layers. In any semiconductor integrated circuit that cannot have data lines on the memory-cell arrays, data can be transferred, but in a small amount, from the memory-cell arrays to a peripheral circuit (e.g., the second sense amplifier). This decreases the band width or renders it necessary to provide a region for accommodating data lines. Consequently, the area of the circuit will increase. In the sixty-third embodiment of the present invention, the band width for the data to be transferred between the sense amplifier SA and the peripheral circuit can be increased, without providing additional wiring layers.

Sixty-fourth Embodiment

The sixty-fourth embodiment of the present invention relates to the layout of elements in the semiconductor integrated circuit according to the sixty-third embodiment (FIGS. 88 to 90). FIGS. 91 to 94 show various element layouts that may be applied to the sixty-third embodiment.

FIGS. 91 to 94 represent the element layouts at the four levels, the lowest level to the highest, which are shown in FIGS. 88 to 90. Note that FIGS. 91 to 94 do not depict the same number of ferroelectric capacitors as in FIGS. 88 to 90. More specifically, FIGS. 91 to 94 are plan views of four different arrangements of elements at four levels, respectively. The sixty-fourth embodiment (FIGS. 91 to 94) is identical to the sixty-first embodiment (FIG. 80 to 83), except for the number of capacitors provided.

Figure 91:
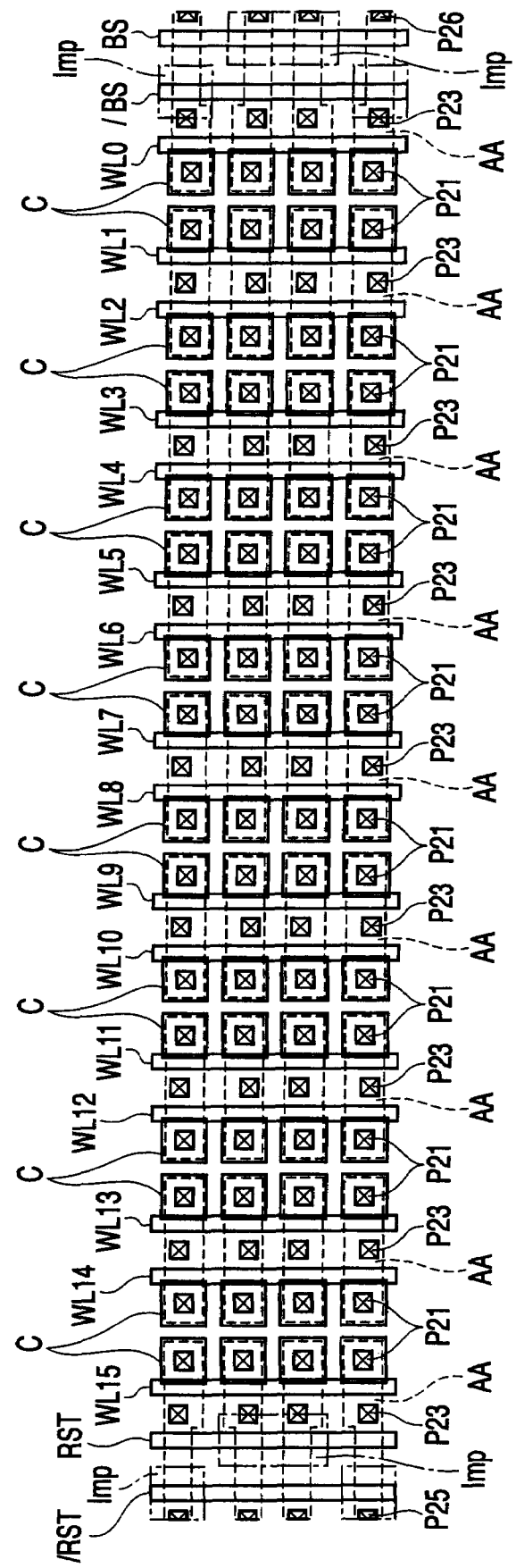
FIG. 91 is a view showing a part of the layout which can be applied to the semiconductor integrated circuit device of FIGS. 87 to 90, for illustrating the sixty-fourth embodiment of the present invention.

As FIG. 91 shows, gate electrodes BS, /BS, WL0 to WL15, RST and /RST extend in the vertical direction in the plane of drawing, each spaced from any other in the horizontal direction. A plurality of active regions AA are provided, each partly lying between two adjacent gate electrodes and partly covering the lateral edges thereof. One contact P23 is provided in each active region AA. A ferroelectric capacitor C is provided on each active region AA. A contact P21, which lay outside of two gate electrode sandwiching the contact P23, connects each active region AA to the lower electrode BE of the capacitor C provided above the region AA.

Figure 92:
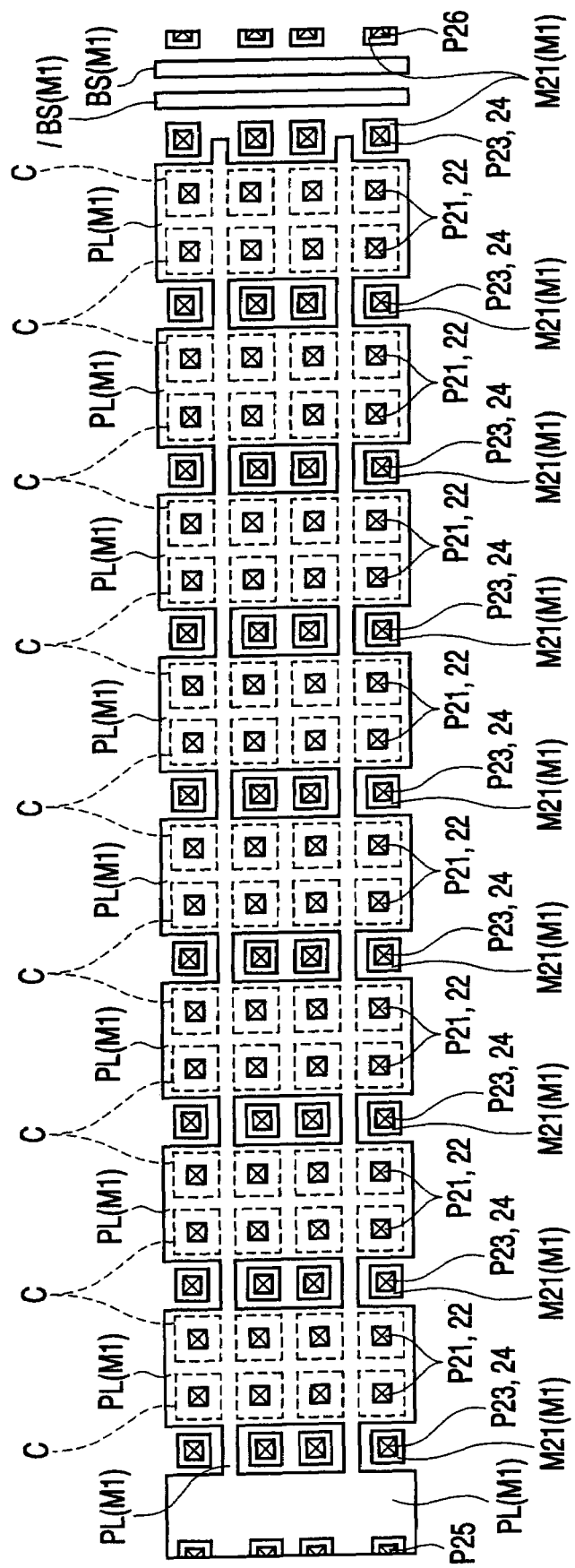
FIG. 92 is a view showing a part of the layout which can be applied to the semiconductor integrated circuit device of FIGS. 87 to 90, for illustrating the sixty-fourth embodiment of the present invention.

FIG. 92 is concerned mainly with an M1 wiring layer. As seen from FIG. 92, the M1 wiring layer has been processed, forming plate lines PL and wiring layers M21. Each plate line PL consists of a rectangular main part and connecting parts. The connecting parts of any plate line PL connect the main part to the main part of either adjacent plate line PL. Wiring layers M21 are provided between the main parts of any two adjacent plate lines PL. The wiring layers M21 have been formed by processing the M1 wiring layer. The main part of each plate line PL extends in the vertical direction in the plate of drawing, covering two columns of ferroelectric capacitors C. The connecting parts of each plate line PL extend in the horizontal direction in the plane of drawing, connecting the main part to the main part of the adjacent plate lines PL. One connection part is provided for at most every eight (two in the figure) wring layers M21 that are arranged in the vertical direction in the plane of drawing. Wiring layers BS and /BS formed by processing the M1 wiring layer are provided above the gate electrodes BS and /BS (FIG. 91). The wiring layer M21 located adjacent to the wiring layer BS has been formed by processing the M1 wiring layer, too.

Figure 93:
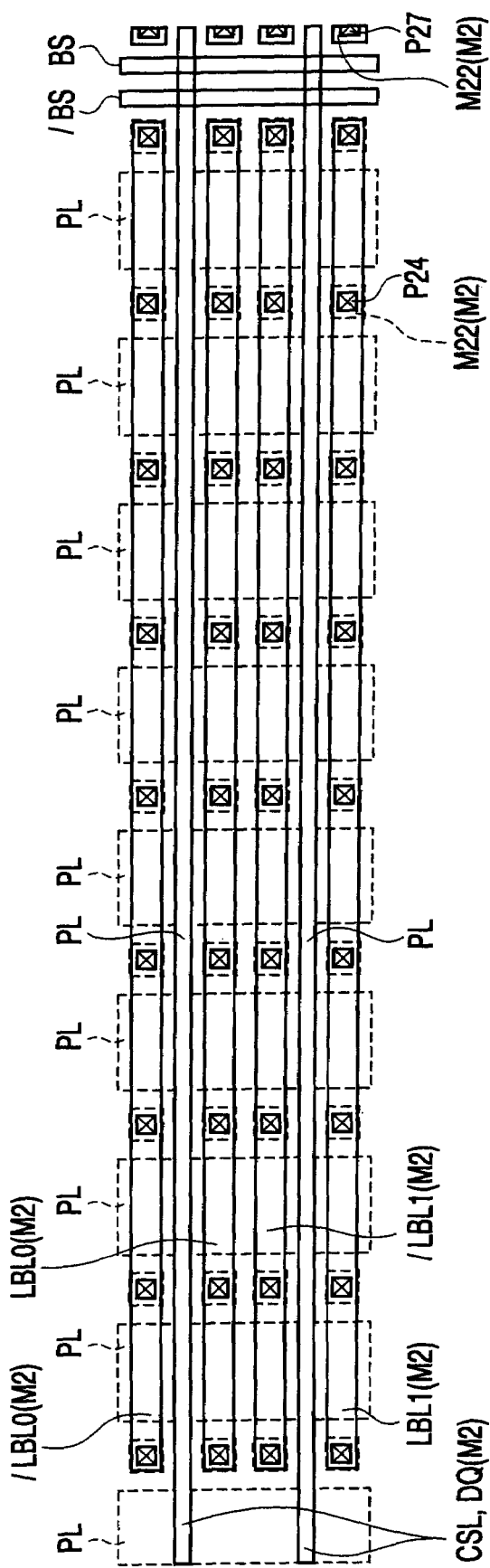
FIG. 93 is a view showing a part of the layout which can be applied to the semiconductor integrated circuit device of FIGS. 87 to 90, for illustrating the sixty-fourth embodiment of the present invention.

FIG. 93 is concerned mainly with an M2 wiring layer that lies above the M1 wiring layer. As FIG. 93 depicts, local bit lines /LBL0, LBL0, /LBL1 and LBL1 lie above the main parts of the plate lines PL and extend in the horizontal direction in the plane of drawing. The local bit lines /LBL0, LBL0, /LBL1 and LBL1 have been formed by processing the M2 wiring layer. A column-selecting line CSL or a data line DQ is provided between the local bit lines /LBL0 and LBL0. Likewise, a column-selecting line CSL or a data line DQ is provided between the local bit lines /LBL1 and LBL1. The column-selecting line CSL and the data line DQ have been formed by processing the M2 wiring layer.

Figure 94:
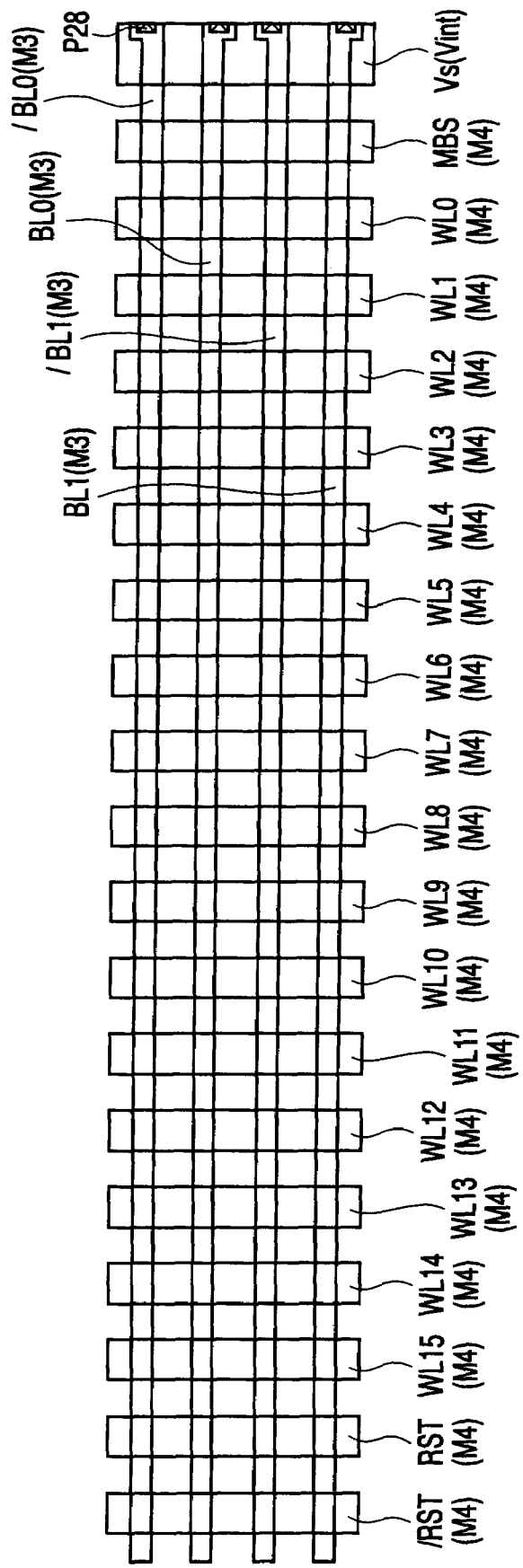
FIG. 94 is a view showing a part of the layout which can be applied to the semiconductor integrated circuit device of FIGS. 87 to 90, for illustrating the sixty-fourth embodiment of the present invention.

FIG. 94 is concerned mainly with an M3 wiring layer and an M3 wiring layer, both lying above the M2 wiring layer. As FIG. 94 shows, the bit lines /BL0, BL0, /BL1 and BL1 are provided, extending in the horizontal direction in the plane of drawing. The bit liens /BL0, BL0, /BL1 and BL1 have been formed by processing the M3 wiring layer. Above the bit lines /BL0, BL0, /BL1 and BL1 there are provided shunt lines Vs, WL0 to WL15, /RST, and RST. The shunt lines Vs, WL0 to WL15, /RST, and RST have been formed by processing the M4 wiring layer. In the present embodiment, the shunt lines /BS and BS are formed by processing the M1 wiring layer (FIG. 92), not by processing the M4 wiring layer.

The sixty-fourth embodiment can achieve the same advantage as the sixty-first embodiment. It can provide a semiconductor integrated circuit of the type illustrated in FIGS. 88 to 90.

In the sixty-fourth embodiment, the main parts of the plate lines PL, which extend in the vertical direction in the plane of drawing, are connected to one another. This results in an advantage. In any embodiment of the present invention, described above, all memory cell of one cell block CB share one plate line PL as is illustrated in the circuit diagram. This configuration can be realized by various element layouts. The simplest of these layouts is that the wiring layer to be processed to provide plate lines PL covers all ferroelectric capacitors that should be connected to the plate lines PL. To connect the active regions AA (source-drain regions SD) to the local bit lines LBL as shown in FIGS. 81 and 92, wiring layers M21 must be formed by processing the M1 wiring layer. This is why a plate line is cut into pieces PL arranged in the horizontal direction in the plane of drawing. In the sixty-fourth embodiment, the plate lines PL thus provided (more precisely, the main parts of plate liens PL) are connected to one another. Hence, the current broadly disperse before flowing into the ferroelectric capacitors that should be accessed. As a result, the resistance in the plate lines PL decreases. This reduces the delay of signals and ultimately prevent the degradation of wirings that may otherwise occur due to electro-migration.

Each plate line PL may have connecting parts, each for at least two wiring layers M21 that are arranged in the vertical direction in the plane of drawing. Alternatively, each connecting part of the plate line PL may be provided for the shunt between one shunt-line wiring layer and the gate electrode associated with this wiring layer.

Figure 95:
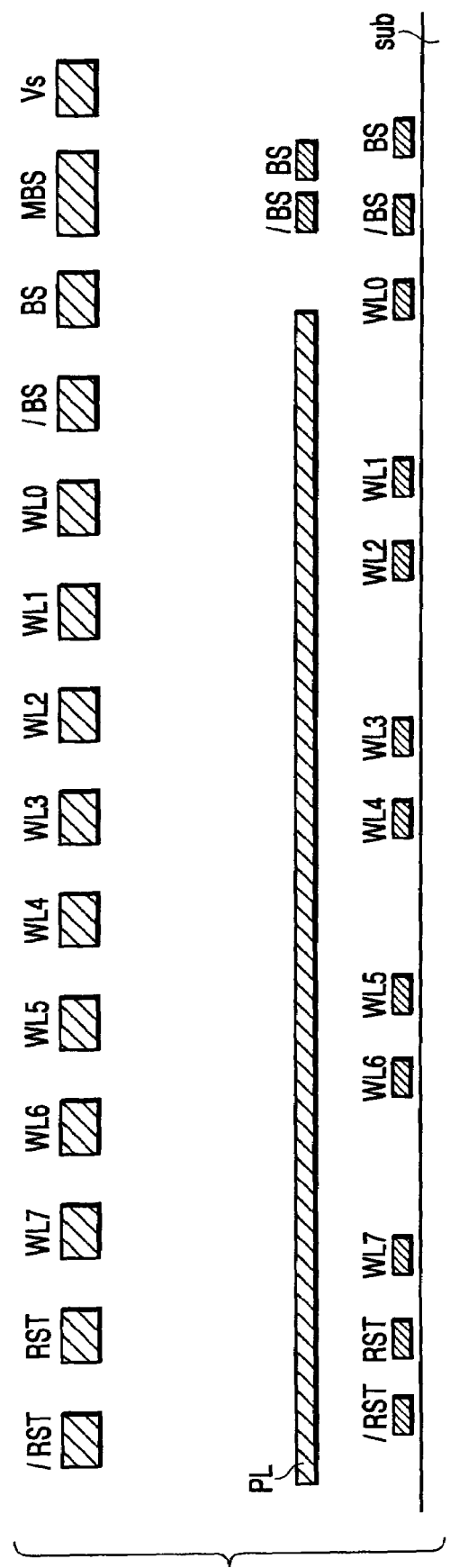
FIG. 95 is a sectional view of a modification of the sixty-fourth embodiment of the present invention.

In this embodiment, the plate lines PL formed by processing the M1 wiring layer are connected to one another. Needless to say, the M2 wiring layer may not be used to provide the column-selecting lines SCL or the data lines DQ in the present embodiment, thus modifying the circuit as is illustrated in FIG. 95. FIG. 95 is similar to FIG. 89 in terms of the positions of elements. As seen from FIG. 95, the main parts of the plate lines PL are spaced apart in the horizontal direction in the plane of drawing and are electrically connected to one another. Each plate line PL has connecting parts. However, neither the column-selecting lines CSL nor the data lines DQ are formed by processing the M2 wiring layer.

Sixty-fifth Embodiment

The sixty-fifth embodiment of the present invention is a method of controlling the semiconductor integrated circuits according to the embodiments described above. First, two methods known as Return to Zero (RTZ) and Non-return to Zero (NRTZ), respectively, will be explained.

Figure 44:
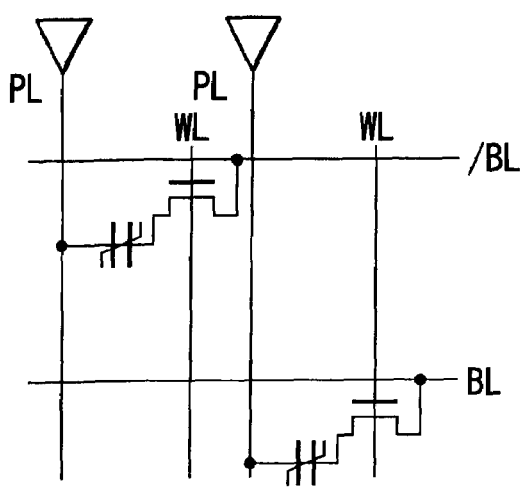
FIG. 44 is a diagram showing the circuit configuration of the conventional semiconductor integrated circuit device.
Figure 45:
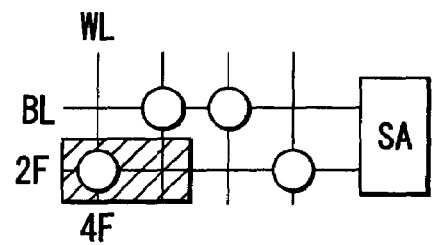
FIG. 45 is a diagram showing the plane configuration of the semiconductor integrated circuit device of FIG. 44.
Figure 46:
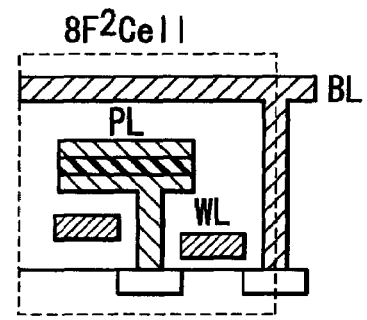
FIG. 46 is a view showing the cross sectional structure of the semiconductor integrated circuit device of FIG. 44.
Figure 47:
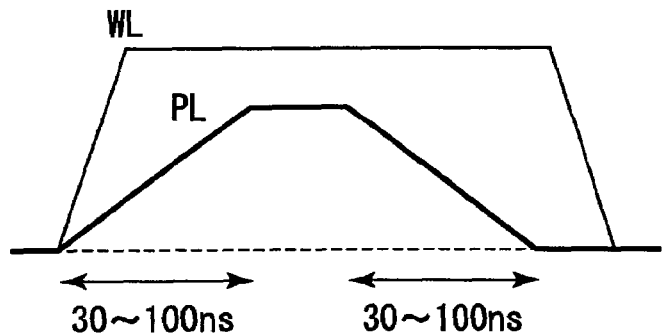
FIG. 47 is a diagram showing the operation of the semiconductor integrated circuit device of FIG. 44.

The NRTZ method can be applied to the conventional ferroelectric memory shown in FIG. 44. In this method, the cell transistor of any memory cell selected assumes the standby state, while the bit-line potential remains at high level for writing data "1" into the memory cell. That is, the ferroelectric capacitor of this memory cell comes into the floating state, with the bit-line potential remaining at high level, when the word line is turned off. As a result, the ferroelectric capacitor holds a high-level charge. This electric charge makes it possible to write data "1" reliably into the memory cell even after the cell transistor assumes the standby state.

In the RTZ method, the cell transistor of the memory cell selected assumes the standby state after the bit-line potential falls to low level so that data "1" may be written again into the memory cell. The ferroelectric memory shown in FIG. 50 and disclosed in the inventors' prior application can employ the RTZ method only. This is because the ferroelectric capacitor of any memory cell selected is short-circuited at both ends when the transistor of the memory cell is turned on even if the high-level potential is applied to one end of the ferroelectric capacitor. Consequently, the ferroelectric capacitor no longer holds electric charge. Thus, the ferroelectric memory of FIG. 50 cannot be controlled by the NRTZ method. Unlike the NRTZ method, the RTZ method cannot secure a sufficient time required to write writing data "1" again into the memory cells.

Figure 96:
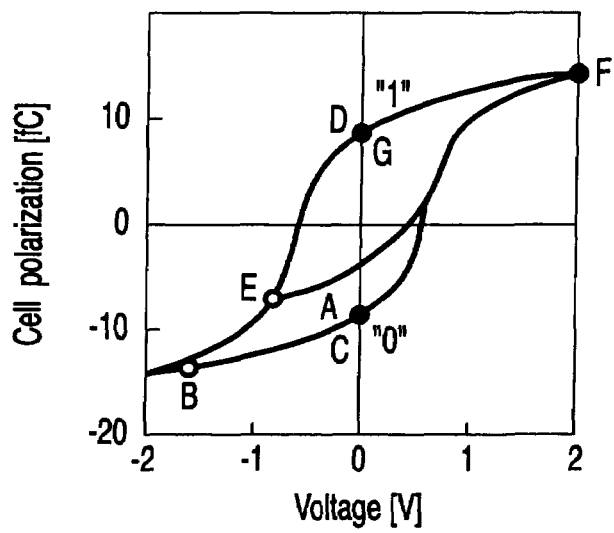
FIG. 96 is a graph representing the operating characteristic of a semiconductor integrated circuit that is controlled by a method according to a sixty-fifth embodiment of the present invention.
Figure 97:
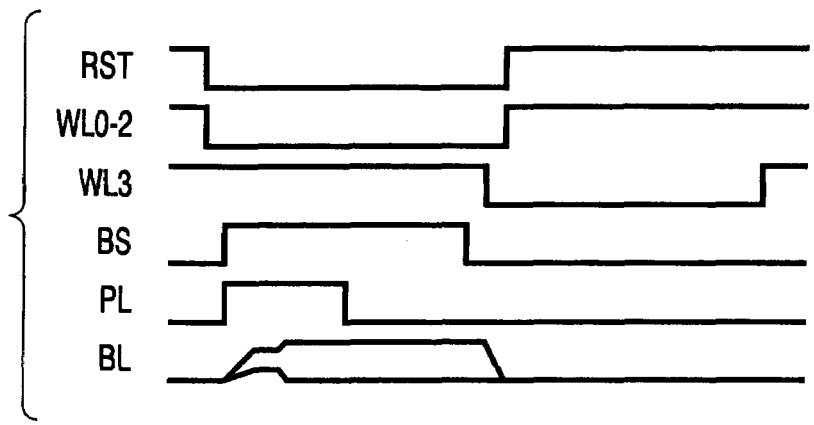
FIG. 97 is a timing chart illustrating a control mode of the semiconductor integrated circuit that is controlled by the method according to the sixty-fifth embodiment.
Figure 98:
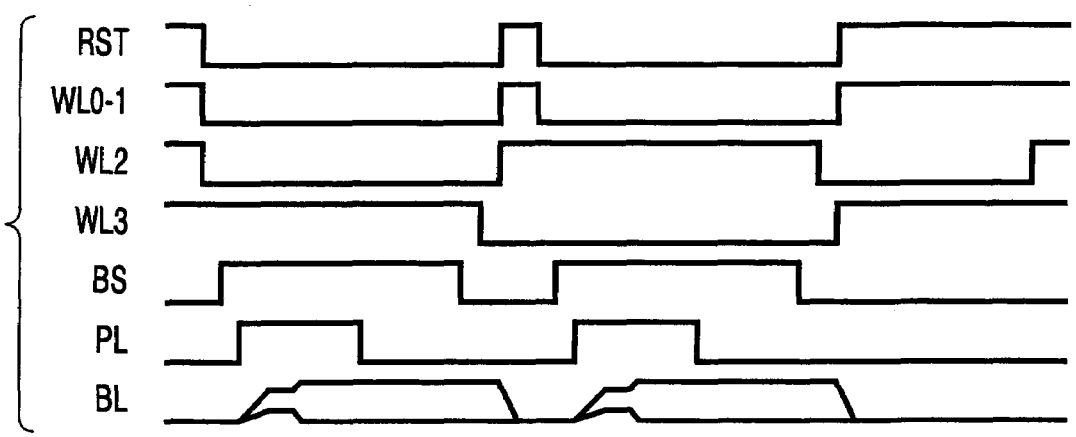
FIG. 98 is another timing chart representing another control mode of the semiconductor integrated circuit that is controlled by the method according to the sixty-fifth embodiment.

FIGS. 96 to 98 illustrate how the semiconductor integrated circuit according to the first embodiment (FIG. 1) operates when controlled by the method according to the sixty-fifth embodiment. To be more specific, FIG. 96 shows the operating characteristic of the semiconductor integrated circuit controlled by the method. FIG. 97 explains how the memory cell including ferroelectric capacitor Q3 assumes the standby state when it is selected. FIG. 98 explains how the memory cell selected and including ferroelectric capacitor Q2 assumes the standby state after the memory cell including ferroelectric capacitor Q3 has been selected.

As seen from FIG. 97, each memory cell assumes the same state as in the other embodiments (see FIG. 2) until data is read from it. If the memory cell holds data "1," its polarized state changes from point D to point E shown in FIG. 96, whereby the data is read from the memory cell. If the memory cell holds data "0," its polarized state changes from point A to point B, whereby the data is read from the memory cell. Thereafter, sense operation is carried out. If the data is "0," it is written again into the memory cell. The polarized state of the memory cell then changes from point B to point C. Next, the potential of the plate line PL is set to low level. Then, the data read from the memory cell is written again into the cell if it is "1." As a result, the polarized state of the memory cell changes from point E to point F.

Next, the block selection signal BS is set to low level and the potential of the word line WL3 selected is set to low level. The electric charge, or "1" data, is therefore accumulated in the cell node SN3. Thereafter, the potentials of the word lines WL0, WL1 and WL2, not selected, are set to high level, and the reset signal RST is set to high level. This causes the cell node SN3 to short-circuit the ferroelectric capacitors C0, C1 and C2 at both ends, though the cell node SN3 remains in floating state.

Then, a timer circuit, for example, is used, setting the word line WL3 to high potential upon lapse of a predetermined time. The ferroelectric capacitor C3 is thereby short-circuited, too, at both ends. Thus, the potential difference between the ends of each ferroelectric capacitor is reset upon lapse of some time. The ferroelectric capacitors C0, C1 and C2 not selected accumulate no disturb voltage. No problems will arise from disturb voltage.

The sixty-fifth embodiment can achieve the same advantage as the first embodiment. In the sixty-fifth embodiment, the ferroelectric capacitor of any memory cell selected assumes the floating state. The ferroelectric capacitor is shorted-circuited at both ends upon lapse of the predetermined time. Hence, the cell node of the memory cell selected can accumulate the charge for a certain time. That is, the semiconductor integrated circuit can be controlled by the NRTZ method. As a result, the data can be written again into the memory cell more reliably than in the case where the circuit is controlled by the RTZ method. This enhances the reliability of the semiconductor integrated circuit.

Another mode of controlling the semiconductor integrated circuit will be described with reference to FIG. 98. As FIG. 98 shows, the word line WL3 is selected in the first active time. When the word line WL3 is set to low potential thereafter, the cell node SN3 holds an electric charge. In the next active time, data-reading and -writing is performed on the word line WL2, while keeping the word line WL3 at low potential. Next, the word line WL2 is set to low potential, whereby the cell node SN2 holds an electric charge. Any memory cell connected to the word line WL2 therefore assumes the standby state. The word line WL3 is set to high potential upon lapse of a predetermined time after it was set to low potential. Similarly, the word line WL2 is set to high potential upon lapse of a predetermined time after it was set to low potential. Thus, the semiconductor integrated circuit can be controlled by the RTZ method even if data items are continuously read from one cell block.

In the case of FIG. 98, the word line WL3 is set to high potential at the end of the period for which the word line WL2 remains selected. Nonetheless, any word line selected may be held at low potential as long as possible so that the NRTZ method may control the semiconductor integrated circuit. The word line WL2 remains in the standby state for a predetermined time. Upon lapse of this time, the word line WL2 is set back to high level.

Sixty-sixth Embodiment

The sixty-sixth embodiment of the present invention is concerned with various circuit configurations that may be applied to the circuit according to the first embodiment.

Figure 99:
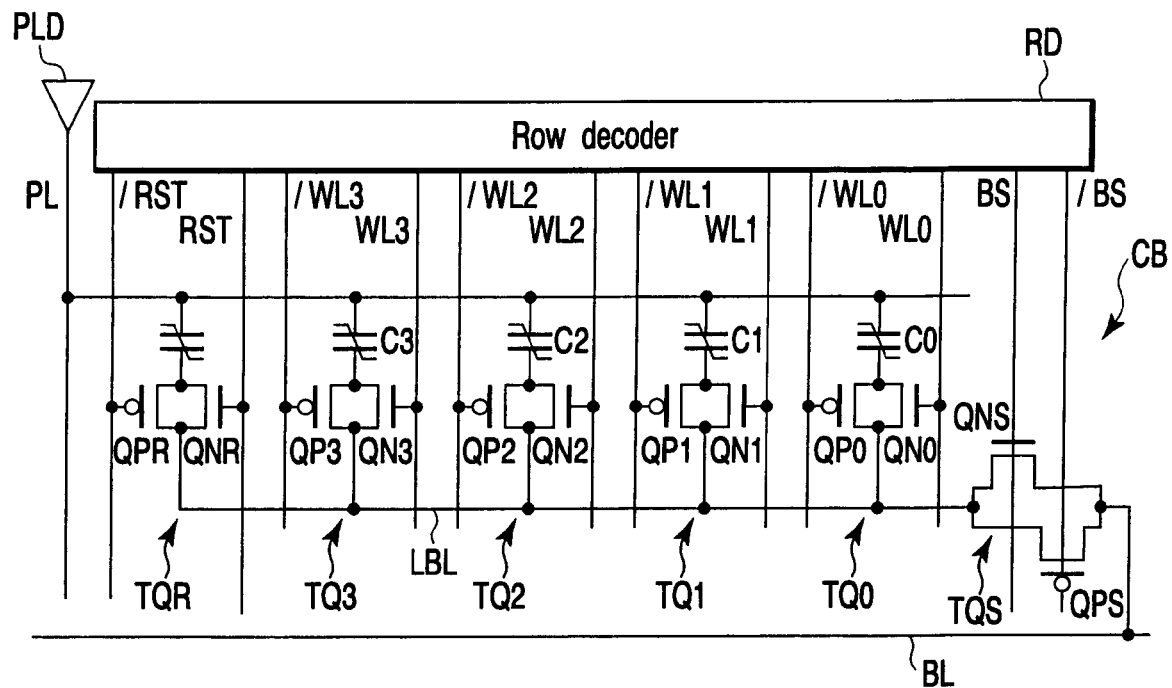
FIG. 99 is a diagram illustrating a circuit configuration according to a sixty-sixth embodiment of the present invention.

FIG. 99 illustrates a circuit configuration that can be applied to the semiconductor integrated circuit according to the first embodiment. As FIG. 99 shows, transmission gates TQ0 to TQ3, TQR and TQS are used in place of the cell transistors Q0 to Q3, reset transistor QR and block selection transistor QS, all shown in FIG. 1. The transmission gate TQ0 is composed of N-type MOS (NMOS) transistor QN0 and P-type MOS (PMOS) transistor QP0. The transmission gate TQ1 is composed of NMOS transistor QN1 and PMOS transistor QP1. The transmission gate TQ2 is composed of NMOS transistor QN2 and PMOS transistor QP2. The transmission gate TQ3 is composed of NMOS transistor QN3 and PMOS transistor QP3. The transmission gate TQR is composed of NMOS transistor QNR and PMOS transistor QPR. The transmission gate TQS is composed of NMOS transistor QNS and PMOS transistor QPS. In each transmission gate, the NMOS transistor and the PMOS transistor are connected in parallel to each other. The circuit configuration is identical to that of the first embodiment in any other respects.

The cell transistors Q0 to Q3, reset transistor QR and block selection transistor QS may be NMOS transistors as is illustrated in FIG. 1. In this case, the signals on the word lines WL0 to WL3, the reset signal RST and the block selection signal BS must have a larger operating amplitude than the signals on the bit lines BL and local bit lines LBL. Otherwise, the cell transistors Q0 to Q3, reset transistor QR and block selection transistor QS would have their threshold voltage inevitably lowered. (This decrease in threshold voltage is known as "threshold-voltage drop.") Should threshold-voltage drop occur, the operating reliability of the cell transistors Q0 to Q3, reset transistor QR and block selection transistor QS might decrease. To avoid this consequence, the cell transistors Q0 to Q3, reset transistor QR and block selection transistor QS should have a thicker gate insulating film than the transistors of the peripheral circuits, in order to acquire resistance to high voltages.

No threshold-voltage drop takes place in the sixty-sixth embodiment. The signals on all word lines WL, the reset signal RST and the block select signal BS can therefore have the same operating amplitude as the bit lines BL and local bit lines LBL. This results in three advantages. First, the cell transistors Q0 to Q3, reset transistor QR and block selection transistor QS can acquire high reliability. Second, no transistors need to have a thick gate insulating film, which helps to reduce the manufacturing cost of the circuit. Third, the operating speed of the circuit rises because the cell transistors Q0 to Q3 and the like can be small ones.

Figure 100:
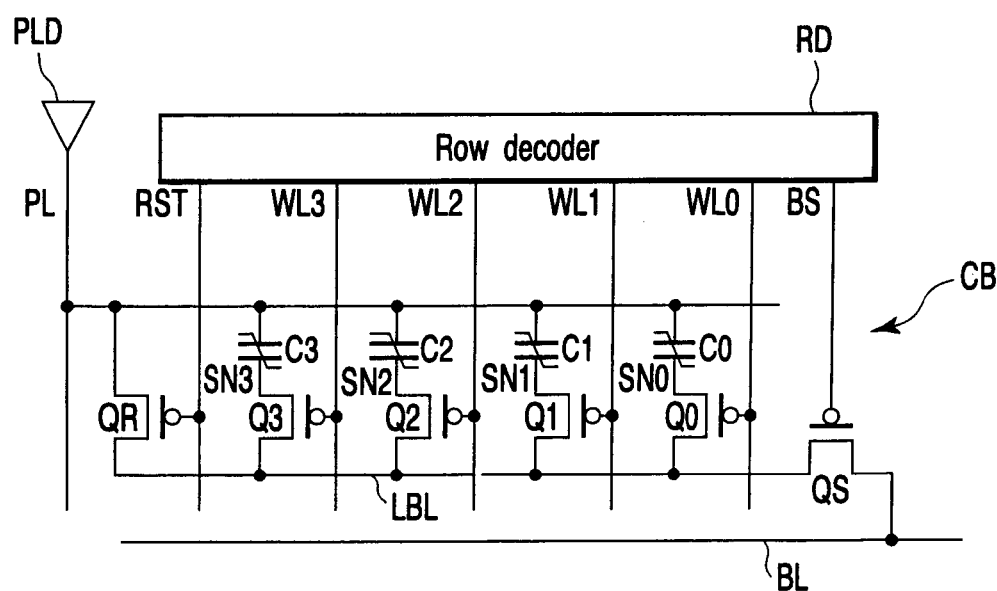
FIG. 100 is a diagram depicting another circuit configuration according to the sixty-sixth embodiment.
Figure 101:
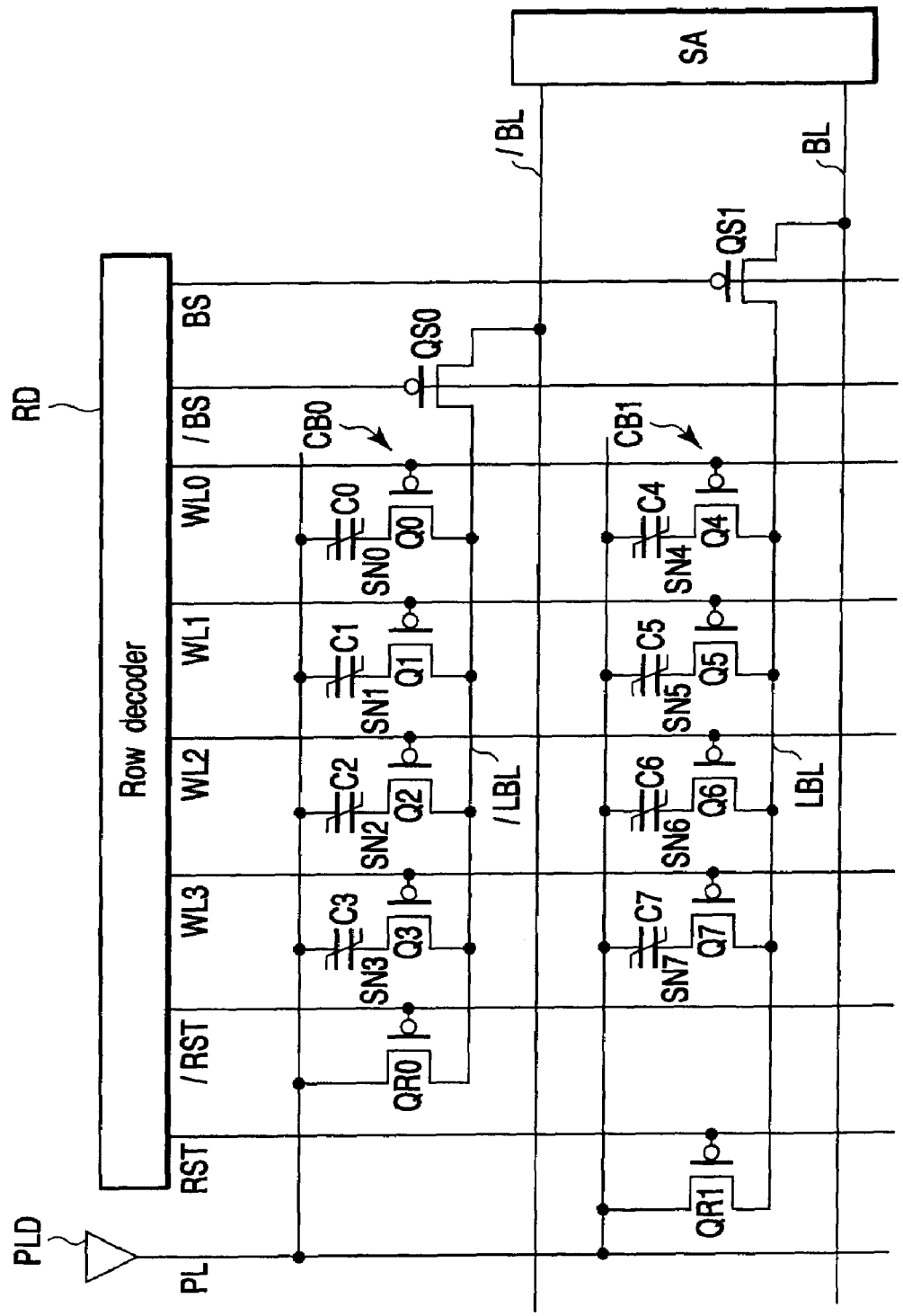
FIG. 101 is a diagram showing still another circuit configuration according to the sixty-sixth embodiment.

The sixty-sixth embodiment has been explained, as applied to the first embodiment. Nevertheless, it can be applied to any embodiment other than the first embodiment. Moreover, the transmission gates can of course be replaced by PMOS transistors as is illustrated in FIG. 100 and FIG. 101.

Sixty-seventh Embodiment

The sixty-seventh embodiment of the present invention is an apparatus that incorporates one of the semiconductor integrated circuits according to the first to thirty-sixth embodiments and forty-first to sixty-sixth embodiments. More specifically, the sixty-seventh embodiment is a digital camera or digital video camera, which incorporates a semiconductor integrated circuit according to the embodiments of the present invention.

Figure 102:
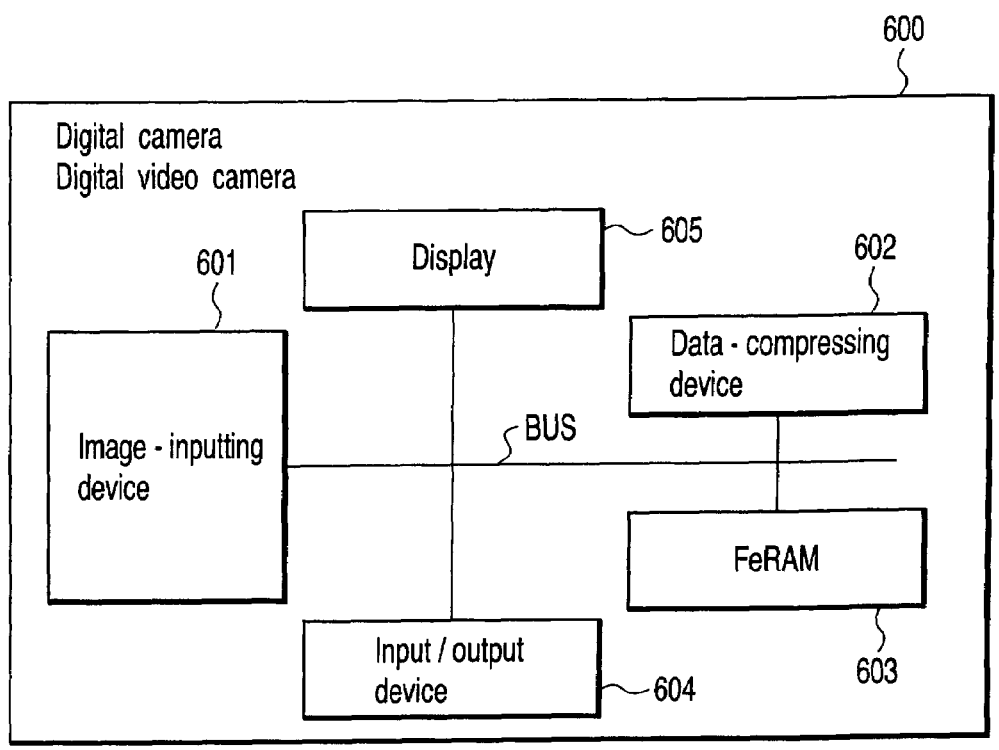
FIG. 102 is a block diagram of a digital camera or a digital video camera according to a sixty-seventh embodiment of the present invention.

FIG. 102 shows the digital camera or digital video camera 600. As seen from FIG. 102, the digital camera or digital video camera 600 includes an image-inputting device 601, a data-compressing device 602, an FeRAM 603, an input/output device 604, a display 605, and a system bus BUS. The system BUS connects the image-inputting device 601, data-compressing device 602, FeRAM 603, input/output device 604 and display 605 to one another.

The image-inputting device 601 is a CCD (Charge-Coupled Device), a CMOS (Complementary MOS) sensor, or the like. The data-compressing device 602 compresses the video data input to it from the image-inputting device 601. The FeRAM 603 is constituted by a semiconductor integrated circuit according to any one of the first to thirty-sixth embodiments and forty-first to sixty-sixth embodiments. The FeRAM 603 is used as a memory that stores the video data compressed by the data-compressing device 602, control codes, or a buffer memory, and the like. The input/output device 604 can output the video data compressed, and can input video data it has received from external apparatuses. The display 605 is, for example, an LCD (Liquid Crystal Display) and display images represented by the video data input or by the video data compressed.

The conventional FeRAM cannot operate at high speed. It cannot operate as fast as desired in a digital camera or a digital video camera, if it is used as a memory or a buffer memory. This is because video data and control codes must be quickly processed in any digital camera or any digital video camera. The FeRAM according to the embodiments of the present invention operates faster than the conventional one, and can therefore work well as a memory or a buffer memory in a digital camera or a digital video camera.

Sixty-eighth Embodiment

The sixty-eighth embodiment of the present invention is another apparatus that incorporates one of the semiconductor integrated circuits according to the first to thirty-sixth embodiments and forty-first to sixty-sixth embodiments. To be more specific, the sixty-eighth embodiment is a computer system that incorporates a semiconductor integrated circuit according to the embodiments of the present invention.

Figure 103:
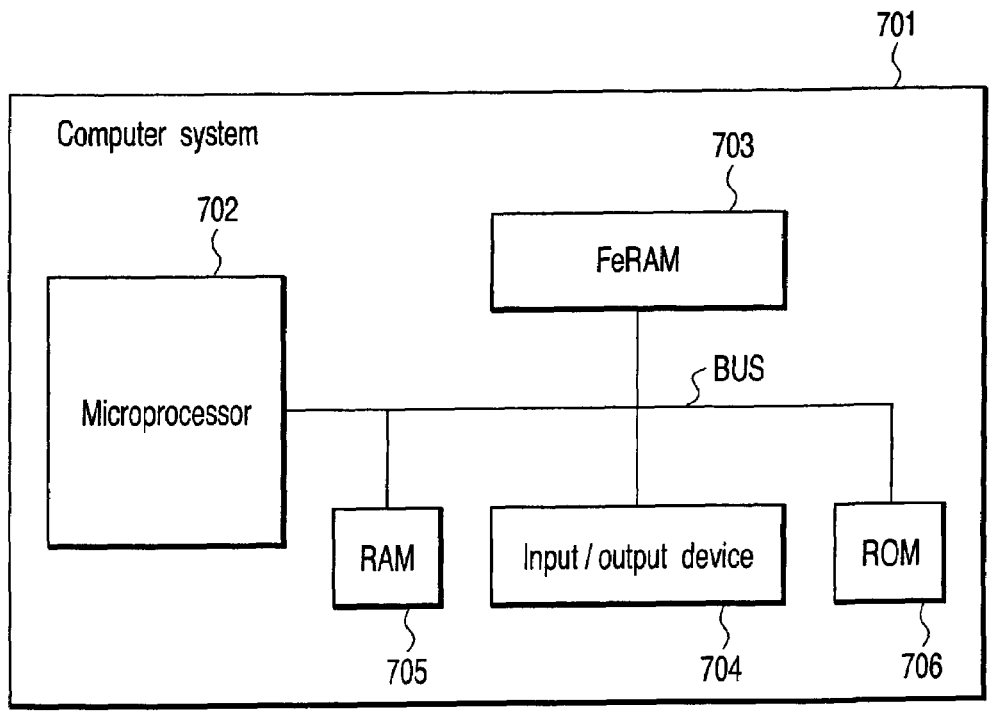
FIG. 103 is a block diagram of a computer system according to a sixty-eighth embodiment of the present invention.

FIG. 103 depicts the computer system 701 according to the sixty-eighth embodiment. As FIG. 103 shows, the computer system 701 includes a microprocessor 702, an FeRAM 703, an input/output device 704, a RAM 705, a ROM 705, and a system bus BUS. The system bus BUS connects the microprocessor 702, FeRAM 703, input/output device 704, RAM 705 and ROM 706 to one another.

The microprocessor 702 performs various arithmetic operations. The FeRAM 703 is constituted by a semiconductor integrated circuit (FeRAM) according to any one of the first to thirty-sixth embodiments and forty-first to sixty-sixth embodiments. The FeRAM 703 is used as a data memory that stores control codes used in the computer system 701. The input/output device 704 receives data from, and supplies data to, external apparatuses. The RAM 705 is, for example, a high-speed SRAM or a high-speed DRAM. It is used, if necessary, as RAM in which data can be rewritten more times than in FeRAMs, or as RAM which operates faster than FeRAMs. The ROM 706 stores the OS (Operating System), Chinese character data and the like, which need not be rewritten.

The conventional FeRAM cannot operate at high speed. It cannot operate as fast as desired in a computer system, if used as a data memory that stores control codes. The FeRAM according to the embodiments of the present invention operates faster than the conventional one, and can therefore work well as a data memory in a computer system.

Sixty-ninth Embodiment

The sixty-ninth embodiment of the present invention is still another apparatus that incorporates one of the semiconductor integrated circuits according to the first to thirty-sixth embodiments and forty-first to sixty-sixth embodiments. More precisely, the sixty-ninth embodiment is a system LSI that incorporates a semiconductor integrated circuit according to the embodiments of the present invention.

Figure 104:
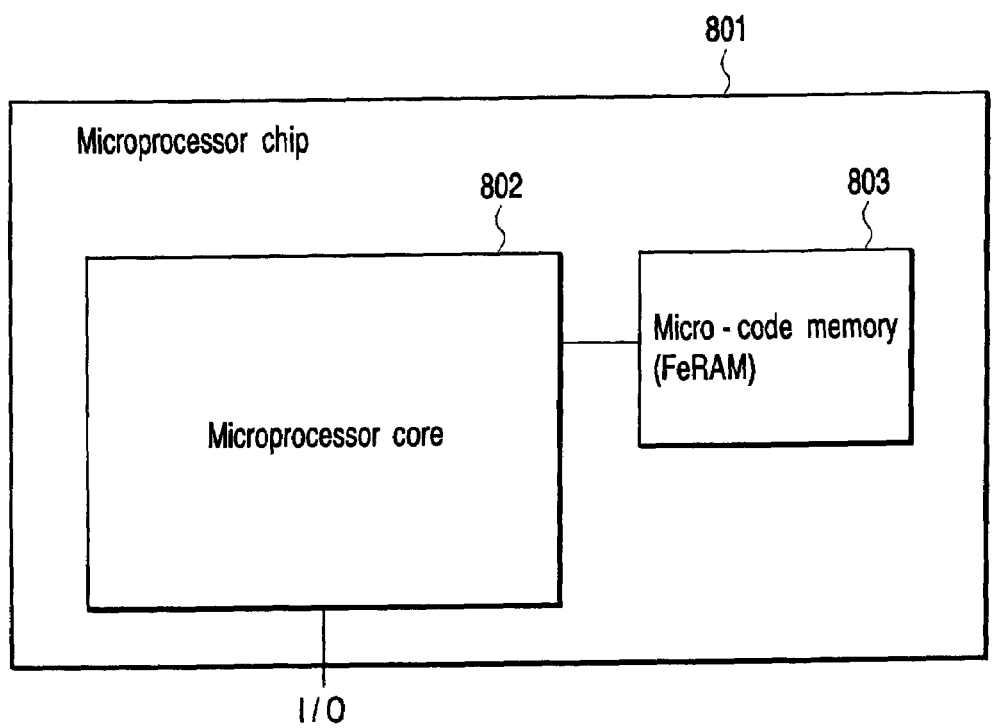
FIG. 104 is a block diagram of a microprocessor chip according to a sixty-ninth embodiment of the present invention.

FIG. 104 depicts a microprocessor chip 801 according to the sixty-ninth embodiment of the present invention. As FIG. 104 shows, the microprocessor chip 801 includes a microprocessor core 802 and a micro-code (control-code) memory 803. The microprocessor core 802 and the micro-code memory 803 are provided in a single chip. The microprocessor core 802 performs various arithmetic operations. It has I/O ports for receiving data from, and supplying data to, other microprocessor chips. The micro-code memory 803 is constituted by a semiconductor integrated circuit (FeRAM) according to any one of the first to thirty-sixth embodiments and forty-first to sixty-sixth embodiments. The micro-code memory 803 stores various micro-codes, without which the microprocessor core 802 cannot perform its function. The micro-codes can be changed, making it easy to alter the instructions to the microprocessor core 802.

The conventional FeRAM cannot operate at high speed. It cannot operate as fast as desired in a microprocessor, if used as micro-code memory that stores and supplies control codes. The FeRAM according to the embodiments of the present invention operates faster than the conventional one, and can therefore work well as micro-code memory in a microprocessor.

Seventieth Embodiment

The seventieth embodiment of the present invention is an apparatus that incorporates one of the semiconductor integrated circuits according to the first to thirty-sixth embodiments and forty-first to sixty-sixth embodiments. More particularly, the seventieth embodiment is a portable computer system that incorporates a semiconductor integrated circuit according to the embodiments of the present invention.

Figure 105:
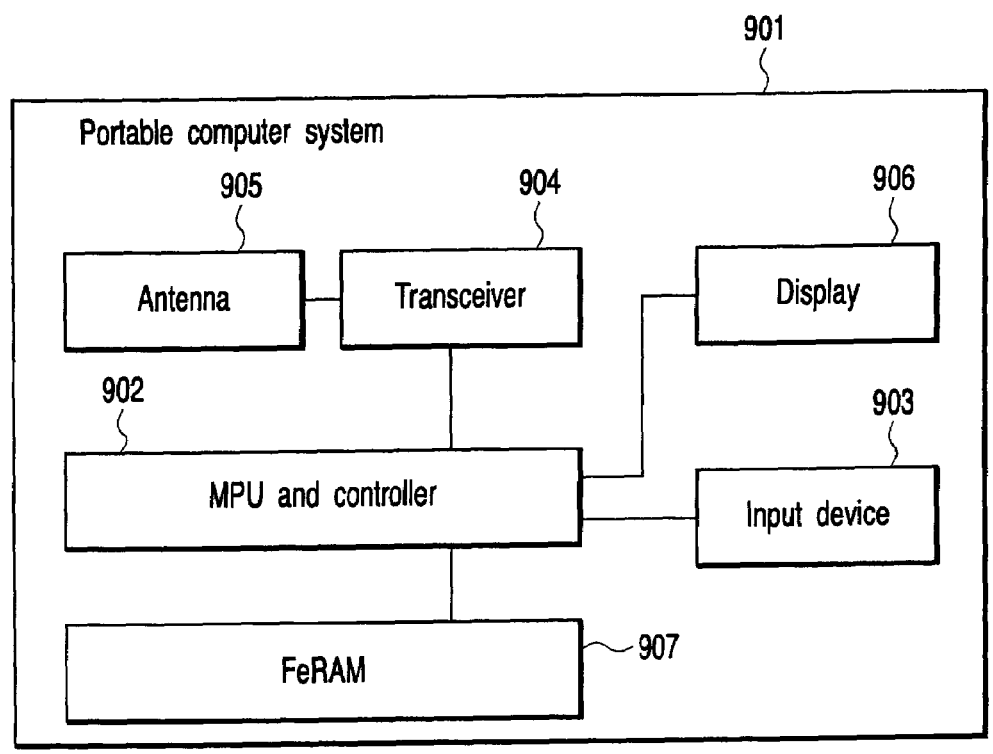
FIG. 105 is a block diagram of a portable computer system according to a seventieth embodiment of the present invention.

FIG. 105 illustrates a portable computer system 901 according to the seventieth embodiment. As FIG. 105 shows, the portable computer system 901 includes a microprocessor/controller 902 (hereinafter refereed to as "microprocessor"), an input device 903, a transceiver 904, an antenna 905, a display 906, and an FeRAM 907.

The microprocessor 902 performs various arithmetic operations. Connected to the microprocessor 902, the input device 903 inputs data to the microprocessor 902. The input device 903 includes a hand-touch device, a key-input device, an audio-data input device and a video-data input device using a CCD. The transceiver 904 is connected to the microprocessor 902. The transceiver 904 receives data from, and transmits data to, external apparatuses through the antenna 905. The transceiver 904 is of such a type as is used in mobile telephones or the like, which can receive and transmit electric waves. The display 906 is connected to the microprocessor 902 and is, for example, an LCD or a plasma display. The FeRAM 907 is constituted by a semiconductor integrated circuit (FeRAM) according to any one of the first to thirty-sixth embodiments and forty-first to sixty-sixth embodiments. The FeRAM 907 stores various control codes, without which the microprocessor 902 cannot perform its function. The FeRAM 907 is used as a data memory or a buffer memory.

The conventional FeRAM cannot operate at high speed. It cannot operate as fast as desired in a portable computer system, if used as a control-code memory, a data memory or a buffer memory. The FeRAM according to the embodiments of the present invention operates faster than the conventional one, and can therefore work well as a control-code memory, data memory or buffer memory micro-code memory in a portable computer system.

Seventy-first Embodiment

The seventy-first embodiment of the present invention is an apparatus that incorporates one of the semiconductor integrated circuits according to the first to thirty-sixth embodiments and forty-first to sixty-sixth embodiments. More specifically, the seventy-first embodiment is a logic variable LSI.

Figure 106:
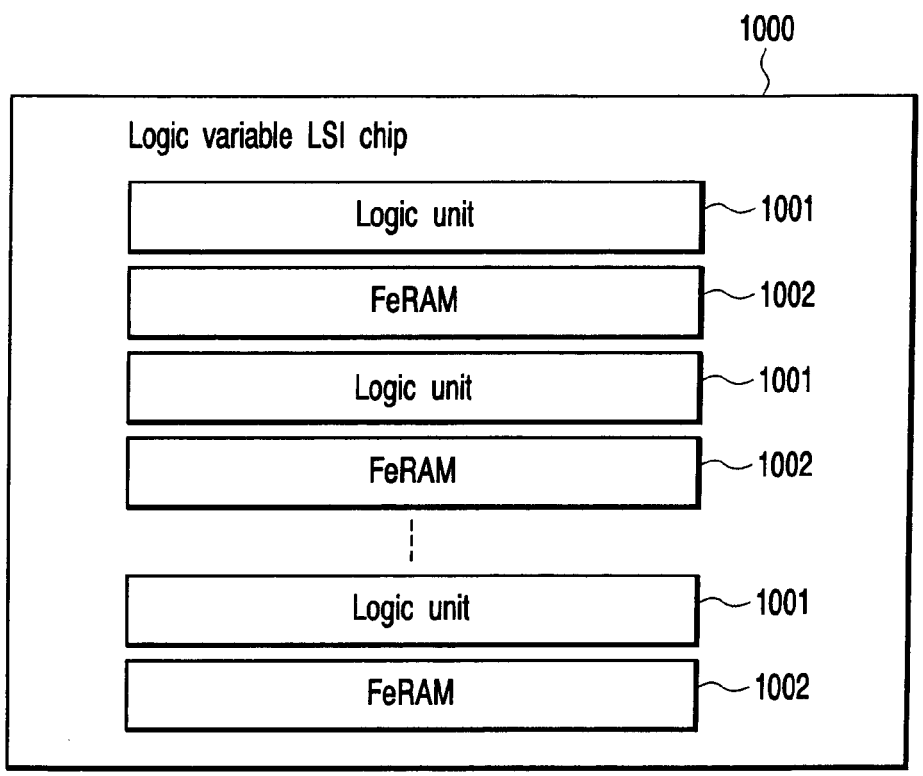
FIG. 106 is a diagram showing a logic variable LSI according to a seventy-first embodiment of the present invention.

FIG. 106 depicts a logic variable LSI 1000 according to the seventy-first embodiment. As FIG. 106 shows, the logic variable LSI 1000 includes logic units 1001 and FeRAMs 1002. The logic units 1001 perform different logic operations. Each FeRAM 1002 is associated with one logic unit 1001. The logic units 1001 and the FeRAMs 1002 are provided in a single chip. Each of the FeRAMs 1002 is constituted by a semiconductor integrated circuit (FeRAM) according to any one of the first to thirty-sixth embodiments and forty-first to sixty-sixth embodiments. The FeRAMs 1002 store algorithms of logic operations.

The logic unit of, for example, an FPD (Field Programmable Gate Device) or an FPGA (Field Programmable Gate Array) can accomplish the reconfiguration of a logic operation. The algorithm memory of a logic variable LSI stores algorithm data representing a logic operation. The algorithm memory must be so designed that the algorithm data may be fast read from it. The conventional FeRAM cannot operate as fast as desired in a logic variable LSI, if used as algorithm memory. The FeRAM according to the embodiments of the present invention operates faster than the conventional one, and can therefore work well as algorithm memory in a logic variable LSI.

The FeRAMs 1002 may be provided over the chip 1000 so that each of the FeRAMs 1002 work for each of the logic unit 1001 as is illustrated in FIG. 106 or positioned in one place. Alternatively, one FeRAM 1002 may be provided for a module.

Seventy-second Embodiment

The seventy-second embodiment of the present invention is an apparatus that incorporates one of the semiconductor integrated circuits according to the first to thirty-sixth embodiments and forty-first to sixty-sixth embodiments. To be more specific, the seventy-second embodiment is an IC card.

Figure 107:
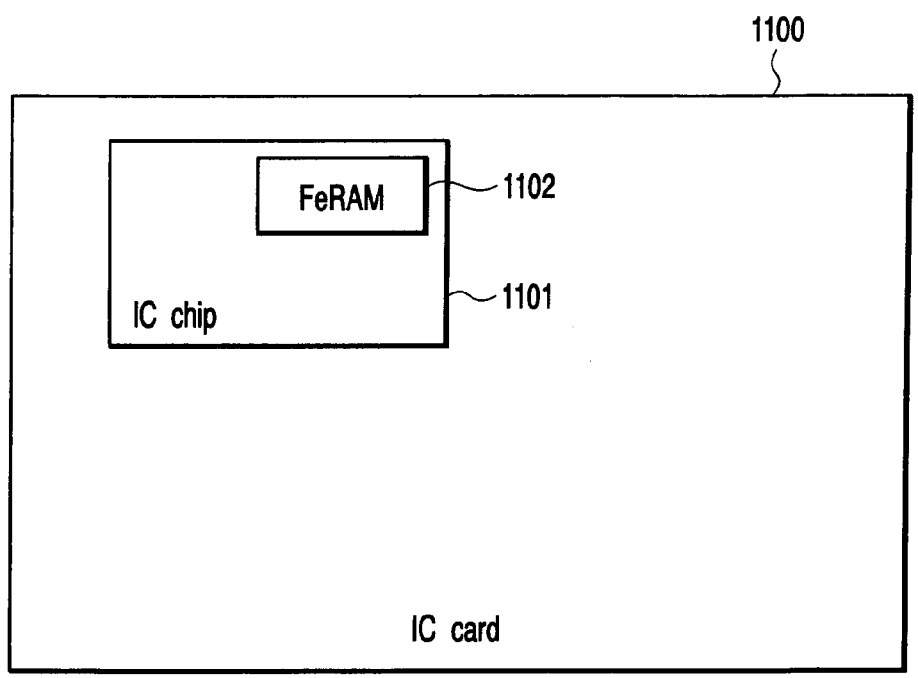
FIG. 107 is a diagram illustrating an IC card according to a seventy-second embodiment of the present invention.

FIG. 107 depicts an IC card 1100 according to the seventy-second embodiment of the present invention. As FIG. 107 shows, the IC card 1100 comprises a card main and an IC chip 1101 provided in the card main. The IC chip 1101 incorporates a FeRAM 1102. The FeRAM 1102 is one of the semiconductor integrated circuits (FeRAMs) according to the first to thirty-sixth embodiments and forty-first to sixty-sixth embodiments. The FeRAM 1102 is used as data memory in the IC card 1100.

The conventional FeRAM cannot operate at high speed. It cannot operate as fast as desired in an IC card, if used as data memory. The FeRAM according to the embodiments of the present invention operates faster than the conventional one, and can therefore work well as data memory in an IC card.

Seventy-third Embodiment

The seventy-third embodiment of the present invention is an apparatus that incorporates one of the semiconductor integrated circuits according to the first to thirty-sixth embodiments and forty-first to sixty-sixth embodiments. More particularly, the seventy-third embodiment is a navigation system for use in automobiles.

Figure 108:
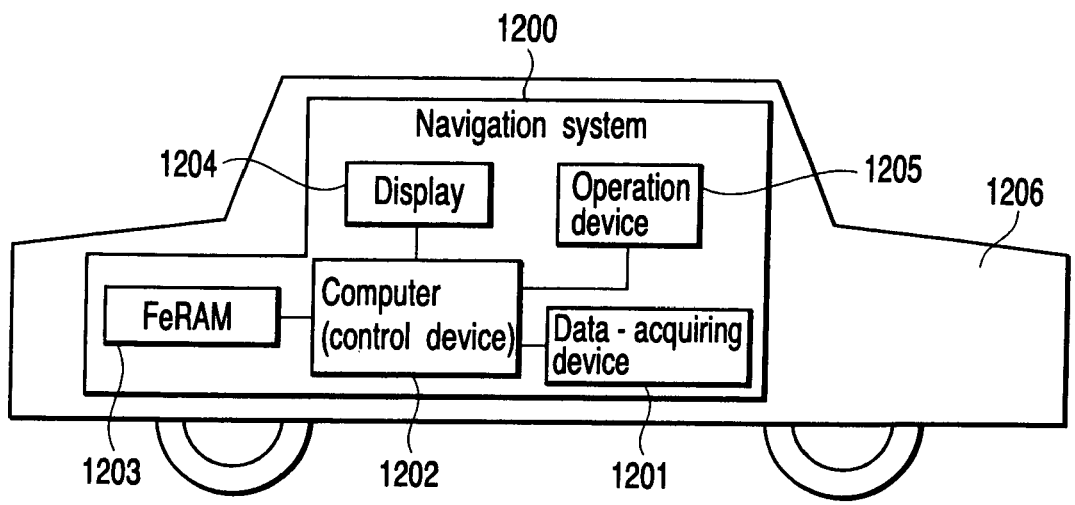
FIG. 108 shows an automobile having a navigation system according to a seventy-third embodiment of the present invention.

FIG. 108 shows an automobile 1206 incorporating a navigation system 1200 according to the seventy-third embodiment. As seen from FIG. 108, the navigation system 1200 includes a data-acquiring device 1201, a computer (control device) 1202, an FeRAM 1203, a display 1204, and an operation device 1205.

The data-acquiring device 1201 is configured to acquire data that a GPS (Global Positioning System) uses to determine the position of the automobile 1206. The data-acquiring device 1201 includes sensors embedded in various sections of the automobile 1206. The data-acquiring device 1201 further includes, for example, a CCD and acquires video data representing the images of any object that surrounds the automobile 1206.

Data that the device 1201 has acquired is supplied to the computer 1202. The computer 1202 processes the data in accordance with the various codes stored in the FeRAM 1203, detecting the position of the automobile 1206, recognizing the objects surrounding the automobile 1206 and determining whether any object may make an obstacle to the automobile 1206. The computer 1202 may be, for example, the computer system illustrated in FIG. 103.

The navigation system 1200 may be designed to achieve automatic driving of the automobile 1206. If this is the case, the computer 1202 determines the positions of various objects near the automobile 1206, from the video data that the data-acquiring device 1201 has acquired. Hence, the computer 1202 can guide the automobile 1206 to an appropriate position.

The FeRAM 1203 is one of the semiconductor integrated circuits (FeRAMs) according to the first to thirty-sixth embodiments and forty-first to sixty-sixth embodiments. The computer 1202 causes the display 1204 to display images that indicate the positions detected and determined. The display 1204 is, for example, an LCD. The operation device 1205 includes a hand-touch unit, a key-input unit, an audio-data input unit and a video-data input unit, which are operated to input data to the computer 1202.

The conventional FeRAM cannot operate at high speed. It cannot operate as fast as desired in car-navigation, automatic car-driving or automatic recognition of objects. The FeRAM according to the embodiments of the present invention operates faster than the conventional one, and can therefore work as desired in car-navigation, automatic car-driving or automatic recognition of objects.

Seventy-fourth Embodiment

The seventy-fourth embodiment of the present invention is an apparatus that incorporates one of the semiconductor integrated circuits according to the first to thirty-sixth embodiments and forty-first to sixty-sixth embodiments. More precisely, the seventy-fourth embodiment is an industrial or public-welfare robot.

Figure 109:
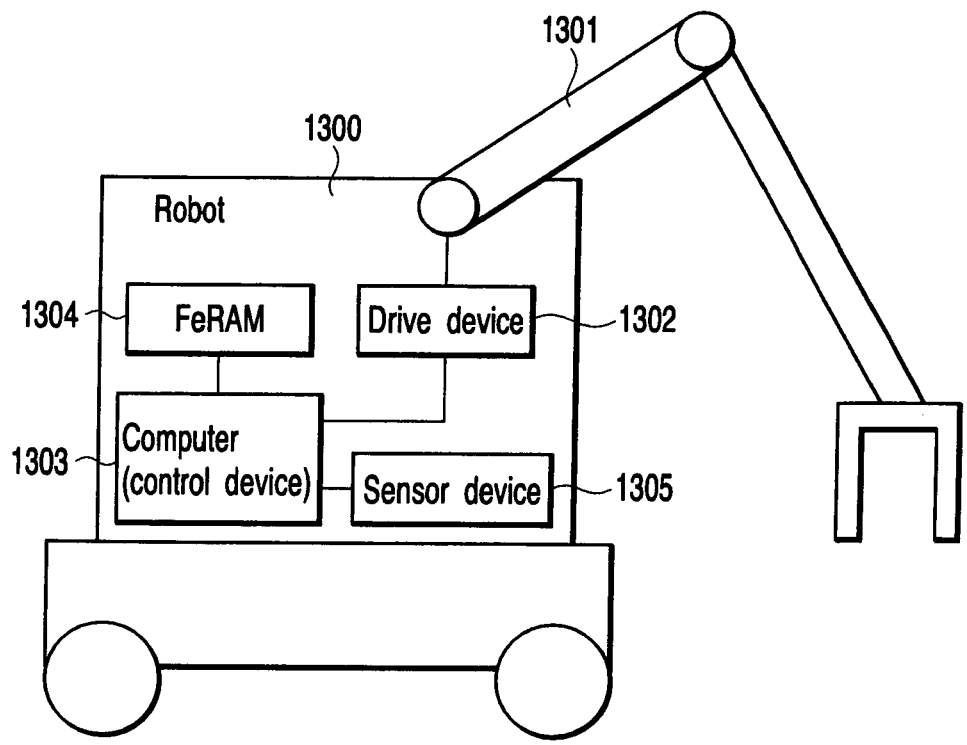
FIG. 109 illustrates a robot according to a seventy-fourth embodiment of the present invention.

FIG. 109 illustrates a robot 1300 according to the seventy-fourth embodiment. As FIG. 109 shows, the robot 1300 includes an arm 1301, a drive device 1302, a computer (control device) 1303, an FeRAM 1304, and a sensor device 1305.

The arm 1301 can move in various ways to perform a variety of work. The drive device 1302 drives and controls the arm 1301. The FeRAM 1304 stores control codes that the computer uses to control the drive device 1302. The FeRAM 1304 is one of the semiconductor integrated circuits (FeRAMs) according to the first to thirty-sixth embodiments and forty-first to sixty-sixth embodiments. The computer 1302 controls the drive device 1302 in accordance with the control codes stored in the FeRAM 1304. The computer 1303 may be, for example, the computer system illustrated in FIG. 103.

The sensor device 1305 detects the positions of any objects existing around the robot 1300. It detects the position of the arm 1301, too. The data that the sensor device 1305 generates data representing these positions. This data is supplied to the computer 1303. The computer 1303 uses this data and the data stored in the FeRAM 1304, recognizing the positions of the objects. In accordance with the positions it has recognized, the computer 1303 determines how the arm 1301 should be moved next, or how the position of the arm 1301 should be adjusted.

The conventional FeRAM cannot operate at high speed. It cannot operate fast enough to move the arms of any robot so swiftly as desired or to recognize the positions around the robot so quickly as desired. The FeRAM according to the embodiments of the present invention operates faster than the conventional one and can therefore make the computer 1202 move robots' arms swiftly and recognize the positions around the robot so quickly.

Seventy-fifth Embodiment

The seventy-fifth embodiment of the present invention is an apparatus that incorporates one of the semiconductor integrated circuits according to the first to thirty-sixth embodiments and forty-first to sixty-sixth embodiments. More precisely, the seventy-fifth embodiment is a display such as a television display.

Figure 110:
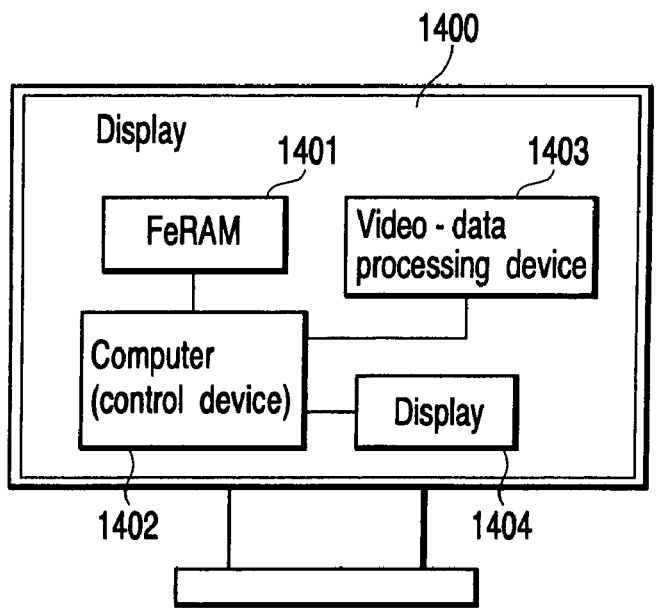
FIG. 110 depicts a display according to a seventy-fifth embodiment of the present invention.

FIG. 110 depicts a display 1400 according to the seventy-fifth embodiment of the present invention. As seen from FIG. 110, the display 1400 includes an FeRAM 1401, a computer 1402, a video-data processing device 1403, and a display device 1404.

The FeRAM 1401 is provided to store control codes that the computer 1402 may use and video data that the video-data processing device 1403 may process.

The FeRAM 1401 is one of the semiconductor integrated circuits (FeRAMs) according to the first to thirty-sixth embodiments and forty-first to sixty-sixth embodiments. The computer 1402 controls the data processing device 1403 in accordance with various control codes stored in the FeRAM 1401, causing the device 1403 to process video data. The video-data processing device 1403 processes video signals supplied from external sources by radio or through communication network (e.g., the Internet). The signals processed by the device 1403 are supplied to the computer 1402. The computer 1402 uses the signals supplied from the device 1403, controlling the display device 1404. The display device 1404 includes a display such as an LCD and a drive unit for driving the display. The display device 1404 displays images under the control of the computer 1402.

The conventional FeRAM cannot operate at high speed. It cannot operate fast enough in processing video data representing high-resolution images. The FeRAM according to the embodiments of the present invention, which operates faster than the conventional one, can serve to process video data at high speed.

Seventy-sixth Embodiment

The seventy-sixth embodiment of the present invention is an apparatus that incorporates one of the semiconductor integrated circuits according to the first to thirty-sixth embodiments and forty-first to sixty-sixth embodiments. More specifically, the seventy-sixth embodiment is an optical disk drive.

Figure 111:
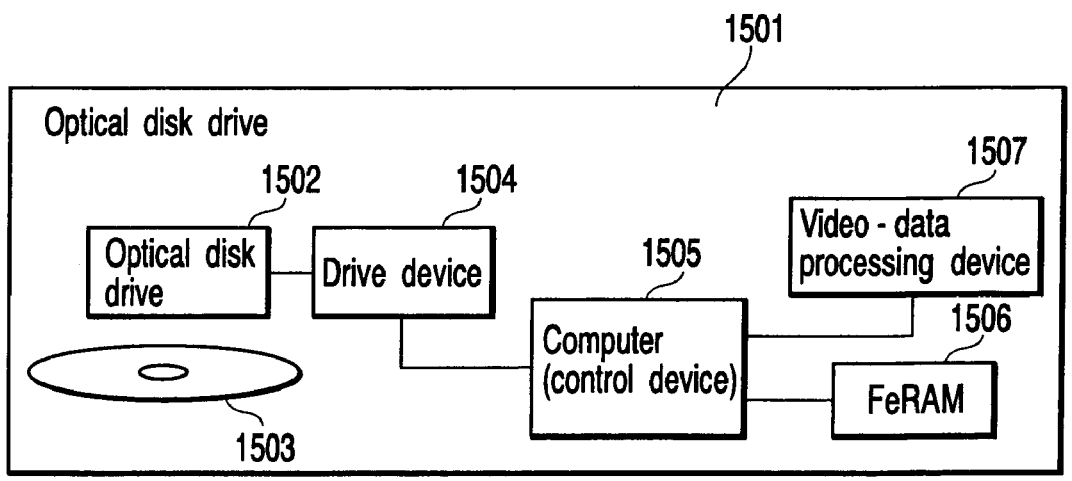
FIG. 111 shows an optical disk drive according to a seventy-sixth embodiment of the present invention.

FIG. 111 shows an optical disk drive 1501 according to the seventy-sixth embodiment of the present invention. As FIG. 111 shows, the optical disk drive 1501 includes an optical head 1502, a drive device 1504, a computer 1505, an FeRAM 1506, and a video-data processing device 1507.

The optical head 1502 applies a laser beam to the optical disk 1503 provided in the optical disk drive 1501, to write data on, and read data from, the optical disk 1503. The drive device 1504 drives the optical head 1502 over the optical disk 1503. The computer 1505 controls the drive device 1504 in accordance with the data stored in the FeRAM 1506, such as various control codes. The computer 1303 may be, for example, the computer system illustrated in FIG. 103. The FeRAM 1401 is one of the semiconductor integrated circuits (FeRAMs) according to the first to thirty-sixth embodiments and forty-first to sixty-sixth embodiments.

The video-data processing device 1507 expands compressed video data and compresses the video data to be written on the optical disk 1503. The FeRAM 1506 can temporarily store video data.

The conventional FeRAM cannot operate at high speed. It can hardly serve to accomplish high-speed data processing or high-speed data compression. The FeRAM according to the embodiments of the present invention, which operates faster than the conventional one, can serve to process video data at high speed and compress video data at high speed.

Various configurations can be realized by combining individual inventions used in all of the embodiments although they are not explained with reference to the drawings in the above embodiments. Further, the configuration is indicated to store one-bit information by use of one transistor and one ferroelectric capacitor. However, it is possible to use a system in which one-bit information is stored by use of two cells by driving two types of block selection signals and plate signals. Also, a multi-value system conventionally proposed can be applied to each of the above embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
a semiconductor substrate;
a plurality of cell transistors provided on a surface of the semiconductor substrate;
a local bit line provided above the cell transistors and electrically connected to one of a source diffusion layer and a drain diffusion layer of each of the cell transistors;
ferroelectric capacitors corresponding in number to the cell transistors, provided above the local bit line, each of the ferroelectric capacitors has an upper electrode and a lower electrode electrically connected to the other one of the source diffusion layer and drain diffusion layer of corresponding one of the cell transistors;
a plate line provided above the upper electrodes and electrically connected to the upper electrodes;
a reset transistor provided on the surface of the semiconductor substrate with one of a source diffusion layer and a drain diffusion layer electrically connected to the plate line and the other one electrically connected to the local bit line; and
a block selection transistor provided on the surface of the semiconductor substrate with one of a source diffusion layer and a drain diffusion layer electrically connected to a bit line provided above the plate line and the other one electrically connected to the local bit line.

2. The device according to claim 1, wherein the source diffusion layer and the drain diffusion layer are different in a coordinate value on an axis extending along each of the gate electrodes of the cell transistors.

3. A semiconductor integrated circuit device comprising:
a semiconductor substrate;
a plurality of cell transistors provided on a surface of the semiconductor substrate;
ferroelectric capacitors corresponding in number to the cell transistors, provided above the semiconductor substrate, each of the ferroelectric capacitors has an upper electrode and a lower electrode electrically connected to one of a source diffusion layer and a drain diffusion layer of corresponding one of the cell transistors;
a plate line provided above the upper electrodes and electrically connected to the upper electrodes;
a reset transistor provided on the surface of the semiconductor substrate with one of a source diffusion layer and a drain diffusion layer electrically connected to the plate line;
a selection transistor provided on the surface of the semiconductor substrate with one of a source diffusion layer and a drain diffusion layer electrically connected to a bit line provided above the plate line;
a first active area formed on the surface of the semiconductor substrate to cross gate electrodes of the cell transistors in a plane and electrically connecting the other one of the source diffusion layer and the drain diffusion layer of the reset transistor to the other one of the source diffusion layer and the drain diffusion layer of the selection transistor; and
a plurality of second active areas formed on the surface of the semiconductor substrate to extend in a direction different from a first area extending direction, connected to the first active area in the plane, and electrically connecting the other one of the source diffusion layer and the drain diffusion layer of each one of the cell transistors to the other one of the source diffusion layer and the drain diffusion layer of the reset transistor.

4. A semiconductor integrated circuit device comprising:
a semiconductor substrate;
a plurality of cell transistors provided on the surface of the semiconductor substrate;
a first wiring layer provided above the cell transistors and electrically connected to one of a source diffusion layer and a drain diffusion layer of each of the plurality of cell transistors;
a plurality of ferroelectric capacitors provided above the first wiring layer, each of the ferroelectric capacitors having an upper electrode and a lower electrode electrically connected to the other of the source diffusion layer and the drain diffusion layer of each of the cell transistors;
a second wiring layer provided above the upper electrode and electrically connected to the upper electrode; and
a reset transistor provided on the surface of the semiconductor substrate with one of a source diffusion layer and a drain diffusion layer electrically connected to the second wiring layer and the other electrically connected to the first wiring layer.

5. The device according to claim 4, wherein the first wiring layer is a first local bit line, and the second wiring layer is a second local bit line.

6. The device according to claim 4, wherein the first wiring layer is a plate line, and the second wiring layer is a local bit line.

7. A semiconductor integrated circuit device comprising:
a semiconductor substrate;
a plurality of cell transistors provided on the surface of the semiconductor substrate;
a plurality of ferroelectric capacitors provided above the cell transistors, each of the ferroelectric capacitors having an upper electrode and a lower electrode electrically connected to one of a source diffusion layer and a drain diffusion layer of each of the cell transistors;
a plate line provided above the upper electrode and electrically connected to the upper electrodes of two adjacent ferroelectric capacitors;

a local bit line provided above the plate line and electrically connected to the other of the source diffusion layer and the drain diffusion layer of each of the cell transistors;

a reset transistor provided on the surface of the semiconductor substrate with one of a source diffusion layer and a drain diffusion layer electrically connected to the plate line and the other electrically connected to the local bit line; and a selection transistor provided on the surface of the semiconductor substrate with one of a source diffusion layer and a drain diffusion layer electrically connected to a bit line provided above the local bit line and the other electrically connected to the local bit line.

8. The device according to claim 7, wherein the bit line is provided in plurality, the bit lines extend in a same direction and are spaced apart from one another, the plate line is provided in plurality, the plate line extends in a direction in which the bit lines line up and covers the ferroelectric capacitors which are arranged in adjacent two columns lining up in the direction in which the bit lines extend, and the plate lines are connected to each other by connecting parts provided beneath at most every eighth first bit lines.

* * * * *